US011637256B2

(12) United States Patent
Ippen et al.

(10) Patent No.: US 11,637,256 B2
(45) Date of Patent: Apr. 25, 2023

(54) QUANTUM DOTS WITH CHARGE-TRANSPORTING LIGANDS

(71) Applicant: NANOSYS, Inc., Milpitas, CA (US)

(72) Inventors: Christian Ippen, Cupertino, CA (US); Daekyoung Kim, Santa Clara, CA (US); Emma Rose Dohner, Redwood City, CA (US); Jesse Manders, Mountain View, CA (US); David Olmeijer, San Francisco, CA (US); Ruiqing Ma, Morristown, NJ (US)

(73) Assignee: Nanosys, Inc., Milpitas, CA (US)

( * ) Notice: Subject to any disclaimer, the term of this patent is extended or adjusted under 35 U.S.C. 154(b) by 612 days.

(21) Appl. No.: 16/546,486

(22) Filed: Aug. 21, 2019

(65) Prior Publication Data
US 2020/0067006 A1    Feb. 27, 2020

Related U.S. Application Data

(60) Provisional application No. 62/720,507, filed on Aug. 21, 2018.

(51) Int. Cl.
*H01L 51/50* (2006.01)
*B82Y 40/00* (2011.01)
*C09K 11/06* (2006.01)
*H01L 51/00* (2006.01)

(52) U.S. Cl.
CPC .......... *H01L 51/502* (2013.01); *B82Y 40/00* (2013.01); *C09K 11/06* (2013.01); *H01L 51/0035* (2013.01); *H01L 51/5056* (2013.01)

(58) Field of Classification Search
None
See application file for complete search history.

(56) References Cited

U.S. PATENT DOCUMENTS

| | | |
|---|---|---|
| 5,505,928 A | 4/1996 | Alivisatos et al. |
| 6,207,229 B1 | 3/2001 | Bawendi et al. |
| 6,225,198 B1 | 5/2001 | Alivisatos et al. |
| 6,306,736 B1 | 10/2001 | Alivisatos et al. |
| 6,322,901 B1 | 11/2001 | Bawendi et al. |
| 6,576,291 B2 | 6/2003 | Bawendi et al. |
| 6,607,829 B1 | 8/2003 | Bawendi et al. |
| 6,788,453 B2 | 9/2004 | Banin et al. |
| 6,821,337 B2 | 11/2004 | Bawendi et al. |
| 6,861,155 B2 | 3/2005 | Bawendi et al. |
| 6,949,206 B2 | 9/2005 | Whiteford et al. |
| 7,060,243 B2 | 6/2006 | Bawendi et al. |

(Continued)

OTHER PUBLICATIONS

International Search Report and Written Opinion for International Application No. PCT/US2019/045274, European Patent Office, Netherlands, dated Oct. 2, 2019, 15 pages.

(Continued)

*Primary Examiner* — Clinton A Brooks
(74) *Attorney, Agent, or Firm* — Sterne, Kessler, Goldstein & Fox P.L.L.C.

(57) ABSTRACT

The present invention provides nanostructure compositions and methods of producing nanostructure compositions. The nanostructure compositions comprise a population of nanostructures comprising charge-transporting ligands. The present invention also provides nanostructure films comprising the nanostructure compositions and methods of making nanostructure films using the nanostructure compositions.

28 Claims, 5 Drawing Sheets

(56) References Cited

U.S. PATENT DOCUMENTS

| | | | |
|---|---|---|---|
| 7,125,605 | B2 | 10/2006 | Bawendi et al. |
| 7,138,098 | B2 | 11/2006 | Bawendi et al. |
| 7,267,875 | B2 | 9/2007 | Whiteford et al. |
| 7,374,807 | B2 | 5/2008 | Parce et al. |
| 7,374,824 | B2 | 5/2008 | Bawendi et al. |
| 7,557,028 | B1 | 7/2009 | Scher et al. |
| 7,566,476 | B2 | 7/2009 | Bawendi et al. |
| 7,572,393 | B2 | 8/2009 | Whiteford et al. |
| 7,645,397 | B2 | 1/2010 | Parce et al. |
| 8,062,967 | B1 | 11/2011 | Scher et al. |
| 8,101,234 | B2 | 1/2012 | Bawendi et al. |
| 8,158,193 | B2 | 4/2012 | Bawendi et al. |
| 8,282,412 | B1 | 10/2012 | Yaguchi et al. |
| 8,491,815 | B1 | 7/2013 | Dimaio |
| 8,563,133 | B2 | 10/2013 | Whiteford et al. |
| 9,005,480 | B2 | 4/2015 | Furuta et al. |
| 9,169,435 | B2 | 10/2015 | Guo et al. |
| 2003/0042850 | A1 | 3/2003 | Bertram et al. |
| 2008/0237540 | A1 | 10/2008 | Dubrow |
| 2008/0281010 | A1 | 11/2008 | Lefas |
| 2010/0110728 | A1 | 5/2010 | Dubrow et al. |
| 2011/0262752 | A1 | 10/2011 | Bawendi et al. |
| 2011/0263062 | A1 | 10/2011 | Bawendi et al. |
| 2013/0026426 | A1 | 1/2013 | Harada et al. |
| 2013/0214249 | A1 | 8/2013 | Pan et al. |
| 2015/0236195 | A1 | 8/2015 | Guo et al. |
| 2017/0066965 | A1 | 3/2017 | Truskier et al. |
| 2017/0306227 | A1 | 10/2017 | Ippen et al. |
| 2017/0362255 | A1 | 12/2017 | Beard et al. |

OTHER PUBLICATIONS

Battaglia, D. and Peng, X., "Formation of High Quality InP and InAs Nanocrystals in a Noncoordinating Solvent," *Nano Letters* 2(9): 1027-1030, American Chemical Society, United States (2002).

Borchert, H., et al., "Investigation of ZnS Passivated InP Nanocrystals by XPS," *Nano Letters* 2(2):151-154, American Chemical Society, United States (2002).

Coe-Sullivan, S., et al., "Large-Area Ordered Quantum-Dot Monolayers via Phase Separation During Spin-Casting," *Advanced Functional Materials* 15(7): 1117-1124, Wiley-VCH Verlag GmbH, Germany (2005).

Cros-Gagneux, A., et al., "Surface Chemistry of InP Quantum Dots: A Comprehensive Study," *J. Am. Chem. Soc.* 132:18147-18157, American Chemical Society, United States (2010).

Debeaux, M., et al., "Charge-Transporting Polymers based on Phenylbenzoimidazole Moieties," *Adv. Funct. Mater.* 20:399-408, Wiley-VCH Verlag GmbH, Germany (2010).

Guzelian, A. A., et al., "Colloidal chemical synthesis and characterization of InAs nanocrystal quantum dots, "*Appl. Phys. Lett.* 69(10):1432-1434, American Institute of Physics, United States (1996).

Guzelian, A. A., et al., "Synthesis of Size-Selected, Surface-Passivated InP Nanocrystals," *J. Phys. Chem.* 100:7212-7219, American Chemical Society, United States (1996).

Haubold, S., et al., "Strongly Luminescent InP/ZnS Core-Shell Nanoparticles," *ChemPhysChem* 5:331-334, Wiley-VCH-Verlag GmbH, Germany (2001).

Hussain, S., et al., "One-Pot Fabrication of High-Quality InP/ZnS (Core/Shell) Quantum Dots and Their Application to Cellular Imaging," *ChemPhysChem* 10:1466-1470, Wiley-VCH Verlag GmbH, Germany (2009).

Juan, P., et al., "Synthesis and fluorescence studies on novel complexes of Tb(III) and Eu(III) with 4-(9H-carbazol-9-yl) benzoic acid," *J. Alloys and Compounds* 426(1-2):363-367, Elsevier B.V., Netherlands (2006).

Kato, Y., et al., "Water-Soluble Receptors for Cyclic-AMP and Their Use for Evaluating Phosphate-Guanidinium Interactions," *J. Am. Chem. Soc.* 116:3279-3284, American Chemical Society, United States (1994).

Kim, S., et al., "Highly Luminescent InP/GaP/ZnS Nanocrystals and Their Application to White Light-Emitting Diodes," *J. Am. Chem. Soc.* 134:3804-3809, American Chemical Society, United States (2012).

Li, L. and Reiss, P., "One-pot Synthesis of Highly Luminescent InP/ZnS Nanocrystals without Precursor Injection," *J. Am. Chem. Soc.* 130:11588-11589, American Chemical Society, United States (2008).

Li, L., et al. "Economic Synthesis of High Quality InP Nanocrystals Using Calcium Phosphide as the Phosphorus Precursor," *Chem. Mater.* 20:2621-2623, American Chemical Society, United States (2008).

Lim, J., et al., "InP@ZnSeS, Core@Composition Gradient Shell Quantum Dots with Enhanced Stability," *Chemistry of Materials* 23:4459-4463, American Chemical Society, United States (2011).

Liu, Z., et al., "Coreduction Colloidal Synthesis of III-V Nanocrystals: The Case of InP," *Angew. Chem. Int. Ed.* 47:3540-3542, Wiley-VCH Verlag GmbH & Co, Germany (2008).

Lucey, D.W., et al., "Monodispersed InP Quantum Dots Prepared by Colloidal Chemistry in a Noncoordinating Solvent," *Chem. Mater.* 17:3754-3762, American Chemical Society, United States (2005).

Mićić, O. I., et al., "Size-Dependent Spectroscopy of InP Quantum Dots," *J. Phys. Chem. B* 101:4904-4912, American Chemical Society, United States (1997).

Mićić, O. I., et al., "Core-Shell Quantum Dots of Lattice-Matched ZnCdSe2 Shells on InP Cores: Experiment and Theory," *J. Phys. Chem. B* 104:12149-12156, American Chemical Society, United States (2000).

Mićić, O. I., et al., "Synthesis and characterization of InP, GaP, and GaInP2 quantum dots," *J. Phys. Chem.* 99:7754-7759 (1995).

Nann, T., et al., "Water Splitting by Visible Light: A Nanophotocathode for Hydrogen Production," *Angew. Chem. Int. Ed.* 49:1574-1577, Wiley-VCH Verlag GmbH & Co., Germany (2010).

Wells, R.L., et al., "Use of Tris(trimethylsilyl)arsine To Prepare Gallium Arsenide and Indium Arsenide," *Chemistry of Materials* 1(1):4-6, American Chemical Society, United States (1989).

Xie, R., et al., "Colloidal InP Nanocrystals as Efficient Emitters Covering Blue to Near-Infrared," *J. Am. Chem. Soc.* 129:15432-15433, American Chemical Society, United States (2007).

Xu, S., et al., "Rapid Synthesis of High-Quality InP Nanocrystals," *J. Am. Chem. Soc.* 128:1054-1055, American Chemical Society, United States (2006).

Zan, F., et al., "Experimental Studies on Blinking Behavior of Single InP/ZnS Quantum Dots: Effects of Synthetic Conditions and UV Irradiation," *J. Phys. Chem. C* 116:3944-3950, American Chemical Society, United States (2012).

Ziegler, J., et al., "Silica-Coated InP/ZnS Nanocrystals as Converter Material in White LEDs," *Adv. Mater.* 20:4068-4073, Wiley-VCH Verlag GmbH, Germany (2008).

QUANTUM DOTS WITH CHARGE-TRANSPORTING LIGANDS

BACKGROUND OF THE INVENTION

Field of the Invention

The present invention provides nanostructure compositions and methods of producing nanostructure compositions. The nanostructure compositions comprise a population of nanostructures comprising charge-transporting ligands. The present invention also provides nanostructure films comprising the nanostructure compositions and methods of making nanostructure films using the nanostructure compositions.

Background of the Invention

Quantum dots ligated by long-chain aliphatic acids exhibit poor conductivity due to the insulating nature of the ligands. Ligand stripping or exchange to small ligands often leads to n-type conductivity with electrons as the major charge carrier because in inorganic semiconductors the electron effective mass is much smaller than the hole effective mass resulting in higher electron mobility.

Several types of semiconductor devices require a pn-junction for their operation. Light-emitting devices generate light by recombination of electrons and hole in such a pn-junction. A balanced supply of both charge carrier type is necessary for efficient and stable device operation. Therefore, the design of efficient and stable quantum dot light-emitting devices requires the ability to engineer the ratio of n-type and p-type conductivity in quantum dot films. Since quantum dots are intrinsically n-type, there is a need for introducing ligands that introduce p-type conductivity.

A need exists to prepare nanostructure compositions and/or resin mixes that have improved voltage stability and result in improved charge transport across the quantum dot layer when used to prepare a nanostructure film.

BRIEF SUMMARY OF THE INVENTION

The present disclosure provides a nanostructure composition comprising:
  (a) at least one population of nanostructures; and
  (b) at least one charge-transporting ligand bound to the surface of the nanostructures, the charge-transporting ligand comprising:
    (i) a hole-transporting ligand of formula (I)

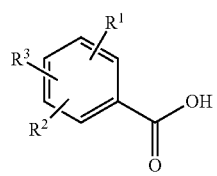

(I)

wherein:
  $R^1$ is hydrogen or carboxy;
  $R^2$ is an aromatic or heteroaromatic ring system having 5-60 ring atoms, which in each case may be unsubstituted or substituted and which may be linked to the aromatic or heteroaromatic ring system via any desired position;
  $R^3$ is hydrogen or an aromatic or heteroaromatic ring system having 5-60 ring atoms, which in each case may be unsubstituted or substituted and which may be linked to the aromatic or heteroaromatic ring system via any desired position; or
  $R^2$ and $R^3$ form together with the carbon atoms to which they are bonded, a 5- or 6-membered ring which may contain an aromatic or heteroaromatic ring system having 5-60 ring atoms, which in each case may be unsubstituted or substituted and which may be linked to the aromatic or heteroaromatic ring system via any desired position; or
    (ii) an electron-transporting ligand of formula (X)

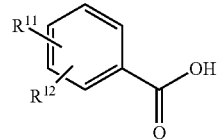

(X)

wherein:
  $R^{11}$ is an aromatic or heteroaromatic ring system having 5-60 ring atoms, which in each case may be unsubstituted or substituted and which may be linked to the aromatic or heteroaromatic ring system via any desired position;
  $R^{12}$ is hydrogen or an aromatic or heteroaromatic ring system having 5-60 ring atoms, which in each case may be unsubstituted or substituted and which may be linked to the aromatic or heteroaromatic ring system via any desired position; or
    (iii) a combination thereof.

In some embodiments, the nanostructure composition comprises between one and five populations of nanostructures.

In some embodiments, the nanostructure composition comprises two populations of nanostructures.

In some embodiments, the nanostructures comprise a core selected from the group consisting of InP, InZnP, InGaP, CdSe, CdS, CdSSe, CdZnSe, CdZnS, ZnSe, ZnTe, ZnSeTe, ZnS, ZnSSe, InAs, InGaAs, and InAsP.

In some embodiments, the nanostructures comprise a core of InP.

In some embodiments, the nanostructures comprise at least one shell.

In some embodiments, the nanostructures comprise a ZnS shell.

In some embodiments, the nanostructures comprise a ZnSe core and a ZnS shell.

In some embodiments, the nanostructures comprise an InP core, a ZnSe shell, and a ZnS shell.

In some embodiments, in the hole-transporting ligand of formula I,
  $R^1$ is hydrogen or carboxy;

$R^2$ is

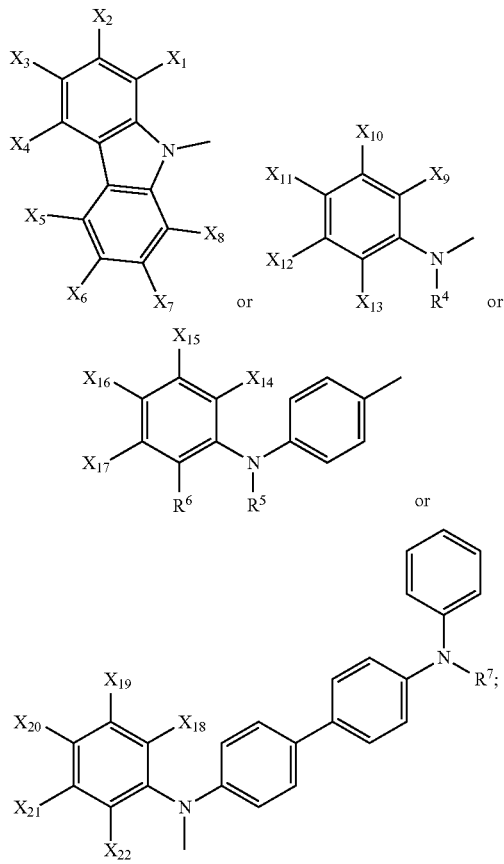

$R^3$ is hydrogen;

$X_1$-$X_8$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$X_9$-$X_{13}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl; and $R^4$ is an unsubstituted or substituted aryl or heteroaryl group;

$X_{14}$-$X_{17}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^5$ is an unsubstituted or substituted aryl or heteroaryl group;

$R^6$ is hydrogen; or $R^5$ and $R^6$ together form:

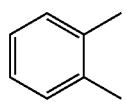

$X_{18}$-$X_{22}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^7$ is an unsubstituted or substituted aryl or heteroaryl group;
or $R^2$ and $R^3$ together form:

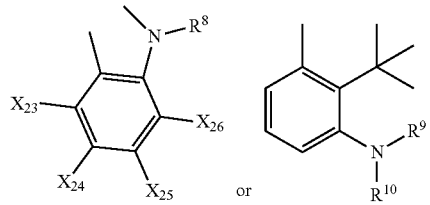

$X_{23}$-$X_{26}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^8$ is an unsubstituted or substituted aryl or heteroaryl group:

$R^9$ is an unsubstituted or substituted aryl or heteroaryl group;

$R^{10}$ is hydrogen or an unsubstituted or substituted aryl or heteroaryl group; or $R^9$ and $R^{10}$ together form:

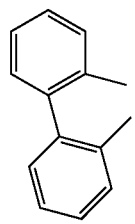

In some embodiments, the hole-transporting ligand has formula II:

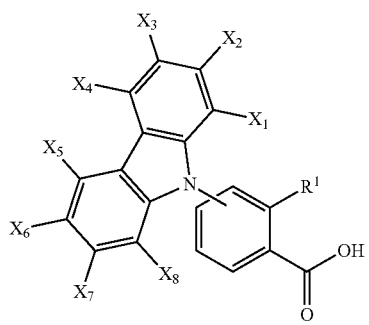

(II)

wherein:

$X_1$-$X_8$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl; and $R^1$ is hydrogen or carboxy.

In some embodiments, the hole-transporting ligand has formula II, wherein $X_1$, $X_2$, $X_4$, $X_5$, $X_7$, and $X_8$ independently are hydrogen and $X_3$ and $X_6$ independently are hydrogen, $C_{1-10}$ alkyl, $C_{1-10}$ alkoxy, $C_{1-10}$ haloalkyl, or $C_{1-10}$ alkylamino.

In some embodiments, the hole-transporting ligand has formula II, wherein $X_1$, $X_2$, $X_4$, $X_5$, $X_7$, and $X_8$ are hydrogen, X₃ and X₆ independently are hydrogen, methyl, tert-butyl, methoxy, dimethylamino, or trifluoromethyl, and $R^1$ is hydrogen.

In some embodiments, the hole-transporting ligand has the structure of formula III:

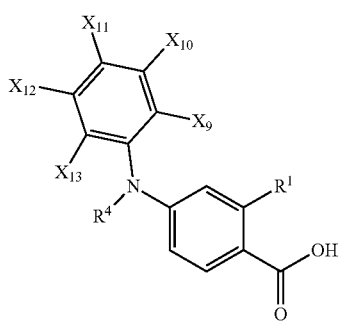

(III)

wherein:
  $X_9$-$X_{13}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
  $R^1$ is hydrogen or carboxy; and
  $R^4$ is an unsubstituted or substituted aryl or heteroaryl group.

In some embodiments, the hole-transporting ligand has formula III, wherein $X_9$-$X_{13}$ are hydrogen, $R^1$ is hydrogen, and $R^4$ is an unsubstituted aryl or heteroaryl group.

In some embodiments, the hole-transporting ligand has formula III, wherein $X_9$-$X_{13}$ are hydrogen, $R^1$ is hydrogen, and $R^4$ is an unsubstituted phenyl, naphthyl, biphenyl, or 9,9-dimethyl-2-fluorenyl.

In some embodiments, the hole-transporting ligand has the structure of formula IV:

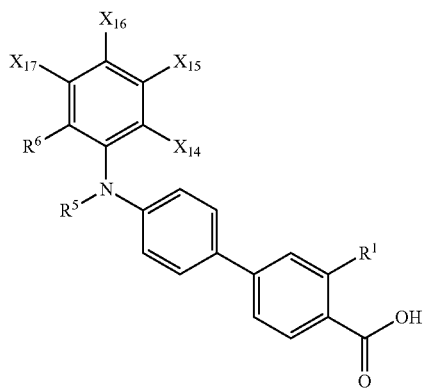

(IV)

wherein:
  $X_{14}$-$X_{17}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
  $R^1$ is hydrogen or carboxy;
  $R^5$ is an unsubstituted or substituted aryl or heteroaryl group; and
  $R^6$ is hydrogen.

In some embodiments, the hole-transporting ligand has formula IV, wherein $X_{14}$-$X_{17}$ are hydrogen, $R^1$ is hydrogen, and $R^4$ is an unsubstituted aryl or heteroaryl group.

In some embodiments, the hole-transporting ligand has formula IV, wherein $X_{14}$-$X_{17}$ are hydrogen, $R^1$ is hydrogen, and $R^4$ is an unsubstituted phenyl or naphthyl.

In some embodiments, the hole-transporting ligand has the structure of formula V:

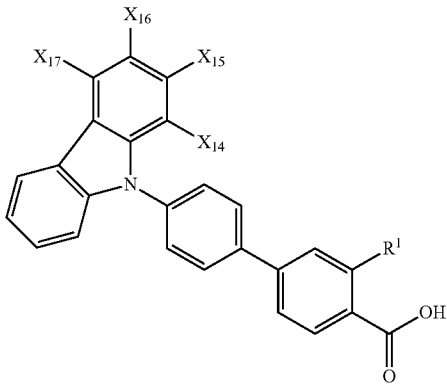

(V)

wherein:
  $X_{14}$-$X_{17}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl; and
  $R^1$ is hydrogen or carboxy.

In some embodiments, the hole-transporting ligand has formula V, wherein $X_{14}$-$X_{17}$ are hydrogen and $R^1$ is hydrogen.

In some embodiments, the hole-transporting and has the structure of formula VI:

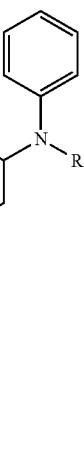

(VI)

wherein:
  $X_{18}$-$X_{22}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
  $R^1$ is hydrogen or carboxy; and
  $R^7$ is an unsubstituted or substituted aryl or heteroaryl group.

In some embodiments, the hole-transporting ligand has formula VI, wherein $X_{18}$, $X_{20}$, $X_{21}$, and $X_{22}$ are hydrogen, $X_{19}$ is hydrogen or carboxy, and $R^1$ is hydrogen.

In some embodiments, the hole-transporting ligand has formula VI, wherein $X_{18}$, $X_{20}$, $X_{21}$, and $X_{22}$ are hydrogen, $X_{19}$ is hydrogen or carboxy, $R^1$ is hydrogen, and $R^7$ is an unsubstituted phenyl or naphthyl.

In some embodiments, the hole-transporting ligand has the structure of formula VII:

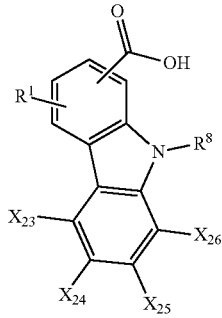
(VII)

wherein:

$X_{23}$-$X_{26}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^1$ is hydrogen or carboxy; and $R^8$ is an unsubstituted or substituted aryl or heteroaryl group.

In some embodiments, the hole-transporting ligand has formula VII, wherein $X_{23}$, $X_{24}$, $X_{25}$, and $X_{26}$ are hydrogen, $R^1$ is hydrogen, and $R^8$ is an unsubstituted phenyl.

In some embodiments, the hole-transporting ligand has the structure of formula VIII:

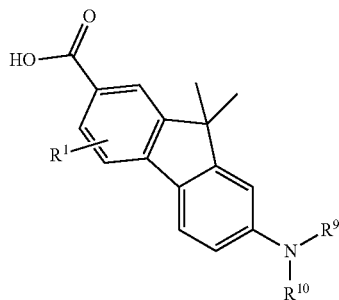
(VIII)

wherein:

$R^1$ is hydrogen or carboxy; and $R^9$ is an unsubstituted or substituted aryl or heteroaryl group; and $R^{10}$ is an unsubstituted or substituted aryl or heteroaryl group.

In some embodiments, the hole-transporting ligand has formula VIII, wherein R1 is hydrogen, R9 is phenyl, and R10 is an unsubstituted phenyl or naphthyl.

In some embodiments, the hole-transporting ligand has the structure of formula IX:

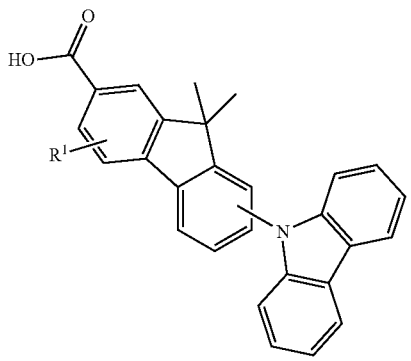
(IX)

wherein:

$R^1$ is hydrogen or carboxy.

In some embodiments, in the electron-transporting ligand formula X:

$R^{11}$ is

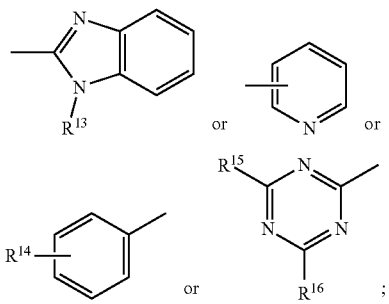

$R^{12}$ is hydrogen or is

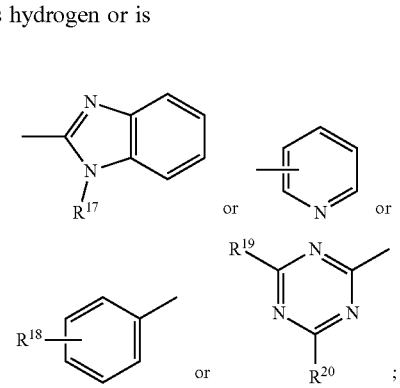

$R^{13}$ and $R^{17}$ independently are a substituted or unsubstituted aryl or heteroaryl group;

$R^{14}$ and $R^{18}$ independently are hydrogen, or

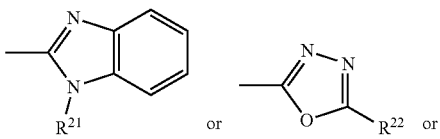

-continued

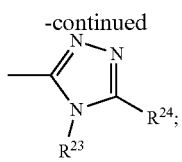

$R^{15}$ and $R^{19}$ independently are a substituted or unsubstituted aryl or heteroaryl group;
$R^{16}$ and $R^{20}$ independently are a substituted or unsubstituted aryl or heteroaryl group;
$R^{21}$ is a substituted or unsubstituted aryl or heteroaryl group;
$R^{22}$ is a substituted or unsubstituted aryl or heteroaryl group;
$R^{23}$ is H or a substituted or unsubstituted aryl or heteroaryl group; and
$R^{24}$ is H or a substituted or unsubstituted aryl or heteroaryl group.

In some embodiments, the electron-transporting ligand has the structure of formula XI:

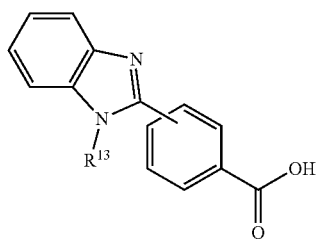

(XI)

wherein:
$R^{13}$ is a substituted or unsubstituted aryl or heteroaryl group.

In some embodiments, the electron-transporting ligand has formula XI, wherein $R^{13}$ is an unsubstituted aryl group.

In some embodiments, the electron-transporting ligand has formula XI, wherein $R^{13}$ is an unsubstituted phenyl.

In some embodiments, the electron-transporting ligand has the structure of formula XII:

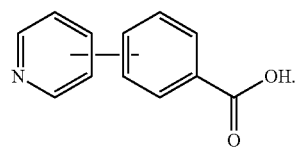

(XII)

In some embodiments, the electron-transporting ligand has the structure of formula XIII:

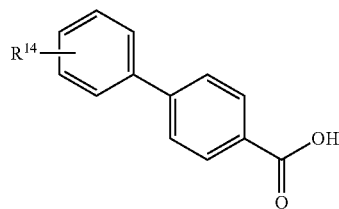

(XIII)

wherein:
$R^{14}$ is a substituted or unsubstituted aryl or heteroaryl group.

In some embodiments, the electron-transporting ligand has the structure of formula XIV:

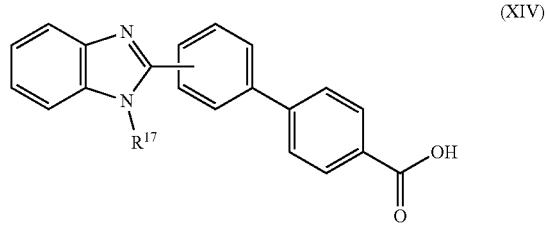

(XIV)

$R^{17}$ is a substituted or unsubstituted aryl or heteroaryl group.

In some embodiments, the electron-transporting ligand has formula XIV, wherein $R^{17}$ is an unsubstituted phenyl group.

In some embodiments, the electron-transporting ligand has the structure of formula XV:

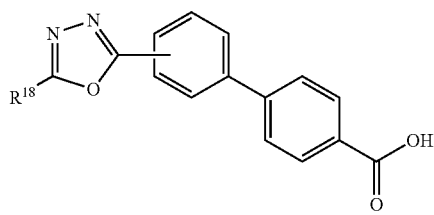

(XV)

wherein:
$R^{18}$ is a substituted or unsubstituted aryl or heteroaryl group.

In some embodiments, the electron-transporting ligand has formula XV, wherein $R^{18}$ is a substituted phenyl group.

In some embodiments, the electron-transporting ligand has formula XV, wherein $R^{18}$ is substituted with carboxy, $C_{1-10}$ alkyl, $C_{1-10}$ alkoxy, $C_{1-10}$ haloalkyl, halogen, $C_{1-10}$ alkylamino, or cycloalkyl.

In some embodiments, the electron-transporting ligand has formula XV, wherein $R^{18}$ is substituted with tert-butyl.

In some embodiments, the electron-transporting ligand has the structure of formula XVI:

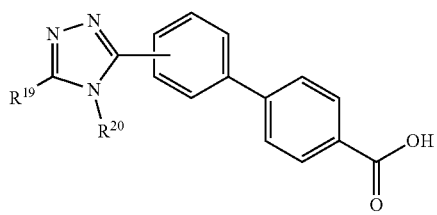

(XVI)

wherein:
$R^{19}$ is a substituted or unsubstituted aryl or heteroaryl group; and $R^{20}$ is a substituted or unsubstituted aryl or heteroaryl group.

In some embodiments, the electron-transporting ligand has formula XVI, wherein $R^{19}$ is substituted with carboxy, $C_{1-10}$ alkyl, $C_{1-10}$ alkoxy, $C_{1-10}$ haloalkyl, halogen, $C_{1-10}$ alkylamino, or cycloalkyl.

In some embodiments, the electron-transporting ligand has formula XVI, wherein $R^{19}$ is phenyl.

In some embodiments, the electron-transporting ligand has formula XVI, wherein $R^{20}$ is unsubstituted.

In some embodiments, the electron-transporting ligand has formula XVI, wherein $R^{20}$ is phenyl or naphthyl.

In some embodiments, the electron-transporting ligand has the structure of formula XVIII:

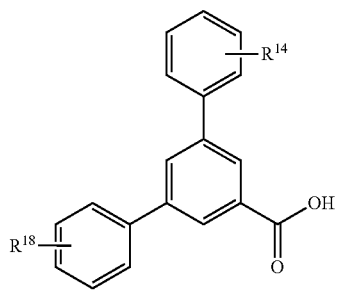

(XVIII)

wherein:
$R^{14}$ is a substituted or unsubstituted aryl or heteroaryl group; and
$R^{18}$ is a substituted or unsubstituted aryl or heteroaryl group.

In some embodiments, the electron-transporting ligand has formula XVIII, wherein $R^{14}$ and $R^{18}$ are unsubstituted.

In some embodiments, the electron-transporting ligand has formula XVIII, wherein $R^{14}$ is 1-phenyl-benzimidazole.

In some embodiments, the electron-transporting ligand has formula XVIII, wherein $R^{18}$ is 1-phenyl-benzimidazole.

In some embodiments, the present disclosure provides an illumination device comprising the nanostructure composition.

In some embodiments, the illumination device is a touchscreen, a monitor, a television, a cellphone, or a light emitting diode.

In some embodiments, the illumination device is a light emitting diode.

In some embodiments, the present disclosure provides a method of replacing a first ligand on a nanostructure with a second ligand, the method comprising admixing a reaction mixture comprising a population of nanostructures having the first ligand bound to the nanostructure and a charge-transporting ligand which is the second ligand, such that the second ligand displaces the first ligand and becomes bound to the nanostructure, wherein the charge-transporting ligand comprises:

(i) a hole-transporting ligand of formula (I)

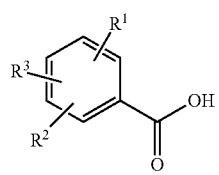

(I)

wherein:
$R^1$ is hydrogen or carboxy;
$R^2$ is an aromatic or heteroaromatic ring system having 5-60 ring atoms, which in each case may be unsubstituted or substituted and which may be linked to the aromatic or heteroaromatic ring system via any desired position;
$R^3$ is hydrogen or an aromatic or heteroaromatic ring system having 5-60 ring atoms, which in each case may be unsubstituted or substituted and which may be linked to the aromatic or heteroaromatic ring system via any desired position; or
$R^2$ and $R^3$ form together with the carbon atoms to which they are bonded, a 5- or 6-membered ring which may contain an aromatic or heteroaromatic ring system having 5-60 ring atoms, which in each case may be unsubstituted or substituted and which may be linked to the aromatic or heteroaromatic ring system via any desired position; or (ii) an electron-transporting ligand of formula (X)

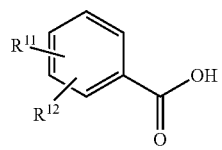

(X)

wherein:
$R^{11}$ is an aromatic or heteroaromatic ring system having 5-60 ring atoms, which in each case may be unsubstituted or substituted and which may be linked to the aromatic or heteroaromatic ring system via any desired position;
$R^{12}$ is hydrogen or an aromatic or heteroaromatic ring system having 5-60 ring atoms, which in each case may be unsubstituted or substituted and which may be linked to the aromatic or heteroaromatic ring system via any desired position; or (iii) a combination thereof.

In some embodiments, the nanostructure comprises between one and five populations of nanostructures.

In some embodiments, the nanostructures comprise two populations of nanostructures.

In some embodiments, the nanostructures comprise a core selected from the group consisting of InP, InZnP, InGaP, CdSe, CdS, CdSSe, CdZnSe, CdZnS, ZnSe, ZnTe, ZnSeTe, ZnS, ZnSSe, InAs, InGaAs, and InAsP.

In some embodiments, the nanostructures comprise a core of InP.

In some embodiments, the nanostructures comprise at least one shell.

In some embodiments, the nanostructures comprise a ZnS shell.

In some embodiments, in the hole-transporting ligand of formula I,
$R^1$ is hydrogen or carboxy;

$R^2$ is

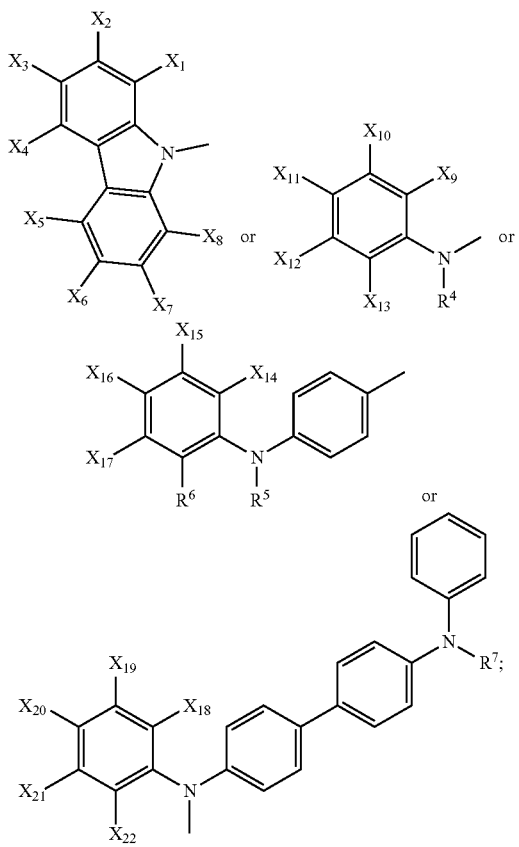

$R^3$ is hydrogen;

$X_1$-$X_8$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$X_9$-$X_{13}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl; and $R^4$ is an unsubstituted or substituted aryl or heteroaryl group;

$X_{14}$-$X_{17}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^5$ is an unsubstituted or substituted aryl or heteroaryl group;

$R^6$ is hydrogen; or $R^5$ and $R^6$ together form:

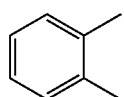

$X_{18}$-$X_{22}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^7$ is an unsubstituted or substituted aryl or heteroaryl group;

or $R^2$ and $R^3$ together form:

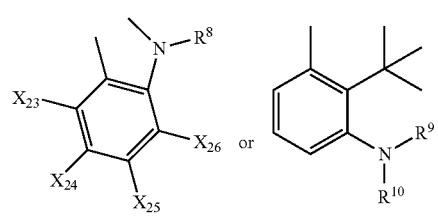

$X_{23}$-$X_{26}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^8$ is an unsubstituted or substituted aryl or heteroaryl group;

$R^9$ is an unsubstituted or substituted aryl or heteroaryl group;

$R^{10}$ is hydrogen or an unsubstituted or substituted aryl or heteroaryl group; or $R^9$ and $R^{10}$ together form:

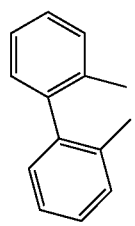

In some embodiments, in the electron-transporting ligand of formula X:

$R^{11}$ is

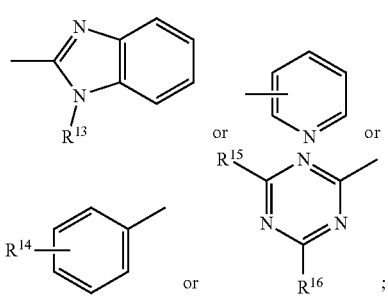

$R^{12}$ is hydrogen or is

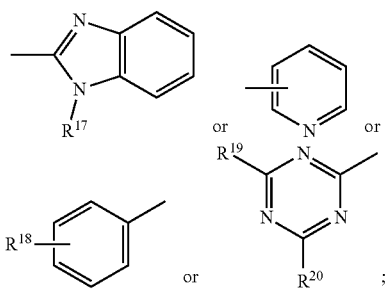

$R^{13}$ and $R^{17}$ independently are a substituted or unsubstituted aryl or heteroaryl group;

$R^{14}$ and $R^{18}$ independently are hydrogen, or

[structures: benzimidazole with $R^{21}$, oxadiazole with $R^{22}$, or triazole with $R^{23}$ and $R^{24}$]

$R^{15}$ and $R^{19}$ independently are a substituted or unsubstituted aryl or heteroaryl group;

$R^{16}$ and $R^{20}$ independently are a substituted or unsubstituted aryl or heteroaryl group;

$R^{21}$ is a substituted or unsubstituted aryl or heteroaryl group;

$R^{22}$ is a substituted or unsubstituted aryl or heteroaryl group;

$R^{23}$ is H or a substituted or unsubstituted aryl or heteroaryl group; and $R^{24}$ is H or a substituted or unsubstituted aryl or heteroaryl group.

In some embodiments, in the method of replacing a first ligand on a nanostructure with a second ligand, the second ligand displaces between about 30% and about 100% on a molar basis of the first ligand on the nanostructure.

In some embodiments, in the method of replacing a first ligand on a nanostructure with a second ligand, the second ligand displaces between about 40% and about 100% on a molar basis of the first ligand on the nanostructure.

In some embodiments, in the method of replacing a first ligand on a nanostructure with a second ligand, the admixing is at an agitation rate between 100 rpm and 10,000 rpm.

In some embodiments, in the method of replacing a first ligand on a nanostructure with a second ligand, the admixing is for a time of between 1 minutes and 24 hours.

In some embodiments, in the method of replacing a first ligand on a nanostructure with a second ligand, the admixing is at a temperature between about 20° C. and about 100° C.

The present disclosure provides a nanostructure film layer comprising:

(a) at least one population of nanostructures, wherein the nanostructures comprise ligands bound to the nanostructures; and (b) at least one charge-transporting ligand bound to the nanostructures.

In some embodiments, in the nanostructure film layer, the nanostructures comprise between one and five populations of nanostructures.

In some embodiments, in the nanostructure film layer, the nanostructures comprise two populations of nanostructures.

In some embodiments, in the nanostructure film layer, the at least one population of nanostructures comprises a core selected from the group consisting of InP, InZnP, InGaP, CdSe, CdS, CdSSe, CdZnSe, CdZnS, ZnSe, ZnTe, ZnSeTe, ZnS, ZnSSe, InAs, InGaAs, and InAsP.

In some embodiments, in the nanostructure film layer, the nanostructures comprise a core of InP.

In some embodiments, in the nanostructure film layer, the at least one population of nanostructures comprises as a weight percentage between about 0.0001% and about 5% of the total weight of the nanostructure film layer.

In some embodiments, in the nanostructure film layer, the charge-transporting ligand comprises:

(i) a hole-transporting ligand of formula (I)

[structure (I): benzoic acid with $R^1$, $R^2$, $R^3$ substituents]

wherein:

$R^1$ is hydrogen or carboxy;

$R^2$ is an aromatic or heteroaromatic ring system having 5-60 ring atoms, which in each case may be unsubstituted or substituted and which may be linked to the aromatic or heteroaromatic ring system via any desired position;

$R^3$ is hydrogen or an aromatic or heteroaromatic ring system having 5-60 ring atoms, which in each case may be unsubstituted or substituted and which may be linked to the aromatic or heteroaromatic ring system via any desired position; or $R^2$ and $R^3$ form together with the carbon atoms to which they are bonded, a 5- or 6-membered ring which may contain an aromatic or heteroaromatic ring system having 5-60 ring atoms, which in each case may be unsubstituted or substituted and which may be linked to the aromatic or heteroaromatic ring system via any desired position; or (ii) an electron-transporting ligand of formula (X)

[structure (X): benzoic acid with $R^{11}$, $R^{12}$ substituents]

wherein:

$R^{11}$ is an aromatic or heteroaromatic ring system having 5-60 ring atoms, which in each case may be unsubstituted or substituted and which may be linked to the aromatic or heteroaromatic ring system via any desired position;

$R^{12}$ is hydrogen or an aromatic or heteroaromatic ring system having 5-60 ring atoms, which in each case may be unsubstituted or substituted and which may be linked to the aromatic or heteroaromatic ring system via any desired position; or (iii) a combination thereof.

In some embodiments, in the hole-transporting ligand of formula I, $R^1$ is hydrogen or carboxy;

$R^2$ is

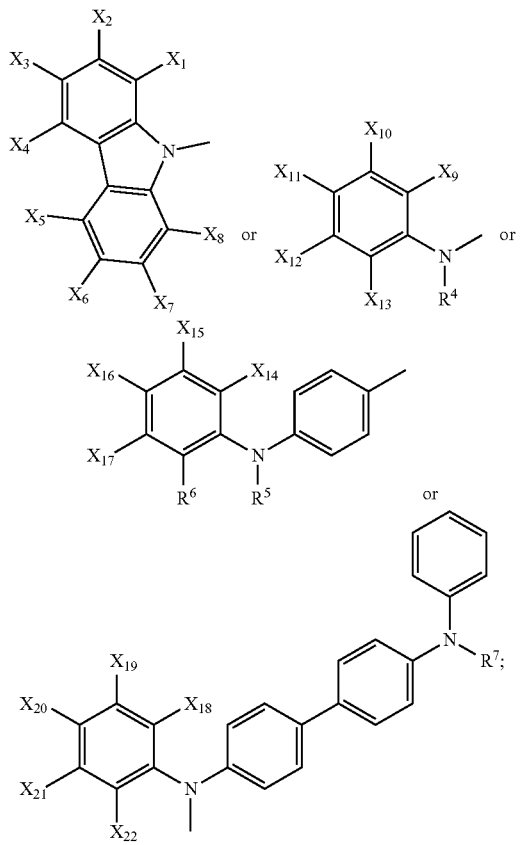

or $R^2$ and $R^3$ together form:

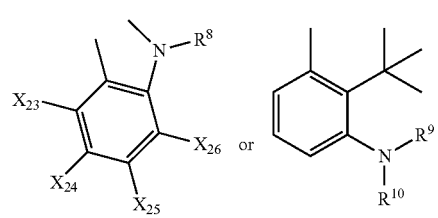

$X_{23}$-$X_{26}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^8$ is an unsubstituted or substituted aryl or heteroaryl group:

$R^9$ is an unsubstituted or substituted aryl or heteroaryl group;

$R^{10}$ is hydrogen or an unsubstituted or substituted aryl or heteroaryl group; or $R^9$ and $R^{10}$ together form:

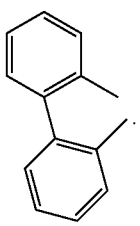

In some embodiments, in the nanostructure film layer, the electron-transporting ligand of formula X:

$R^{11}$ is

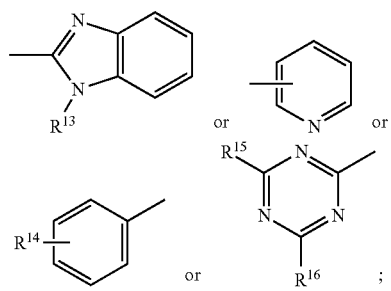

$R^{12}$ is hydrogen or is

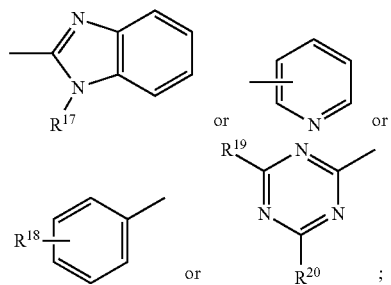

$R^3$ is hydrogen;

$X_1$-$X_8$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$X_9$-$X_{13}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl; and $R^4$ is an unsubstituted or substituted aryl or heteroaryl group;

$X_{14}$-$X_{17}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^5$ is an unsubstituted or substituted aryl or heteroaryl group;

$R^6$ is hydrogen; or $R^5$ and $R^6$ together form:

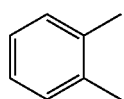

$X_{18}$-$X_{22}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^7$ is an unsubstituted or substituted aryl or heteroaryl group;

$R^{13}$ and $R^{17}$ independently are a substituted or unsubstituted aryl or heteroaryl group;

$R^{14}$ and $R^{18}$ independently are hydrogen, or

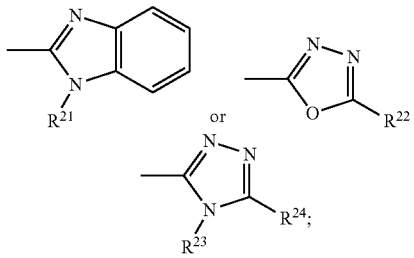

$R^{15}$ and $R^{19}$ independently are a substituted or unsubstituted aryl or heteroaryl group;

$R^{16}$ and $R^{20}$ independently are a substituted or unsubstituted aryl or heteroaryl group;

$R^{21}$ is a substituted or unsubstituted aryl or heteroaryl group;

$R^{22}$ is a substituted or unsubstituted aryl or heteroaryl group;

$R^{23}$ is H or a substituted or unsubstituted aryl or heteroaryl group; and $R^{24}$ is H or a substituted or unsubstituted aryl or heteroaryl group.

In some embodiments, in the nanostructure film layer, the nanostructures comprise the at least one population of nanostructures comprises at least one shell.

In some embodiments, in the nanostructure film layer, the at least one population of nanostructures comprises two shells.

In some embodiments, in the nanostructure film layer, the nanostructures are quantum dots.

In some embodiments, in the nanostructure film layer, the quantum dots are InP and/or ZnSe quantum dots.

The present invention provides a light emitting diode comprising:

(a) a first conductive layer;
(b) a second conductive layer; and
(c) an emitting layer between the first conductive layer and the second conductive layer, wherein the emitting layer comprises at least one population of nanostructures comprising a charge-transporting ligand bound to the nanostructures.

In some embodiments, in the light emitting diode, the nanostructures comprise between one and five populations of nanostructures.

In some embodiments, in the light emitting diode, the emitting layer comprises two populations of nanostructures.

In some embodiments, in the light emitting diode, the at least one population of nanostructures comprises a core selected from the group consisting of InP, InZnP, InGaP, CdSe, CdS, CdSSe, CdZnSe, CdZnS, ZnSe, ZnTe, ZnSeTe, ZnS, ZnSSe, InAs, InGaAs, and InAsP.

In some embodiments, in the light emitting diode, the nanostructures comprise a core of InP.

In some embodiments, in the light emitting diode, the at least one population of nanostructures comprises as a weight percentage between about 0.0001% and about 5% of the total weight of the nanostructure film layer.

In some embodiments, in the light emitting diode, the charge-transporting ligand comprises:

(i) a hole-transporting ligand of formula (I)

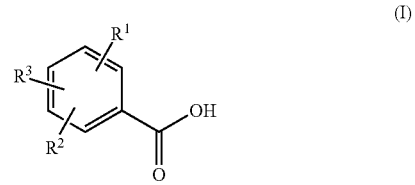

wherein:

$R^1$ is hydrogen or carboxy;

$R^2$ is an aromatic or heteroaromatic ring system having 5-60 ring atoms, which in each case may be unsubstituted or substituted and which may be linked to the aromatic or heteroaromatic ring system via any desired position;

$R^3$ is hydrogen or an aromatic or heteroaromatic ring system having 5-60 ring atoms, which in each case may be unsubstituted or substituted and which may be linked to the aromatic or heteroaromatic ring system via any desired position; or $R^2$ and $R^3$ form together with the carbon atoms to which they are bonded, a 5- or 6-membered ring which may contain an aromatic or heteroaromatic ring system having 5-60 ring atoms, which in each case may be unsubstituted or substituted and which may be linked to the aromatic or heteroaromatic ring system via any desired position; or (ii) an electron-transporting ligand of formula (X)

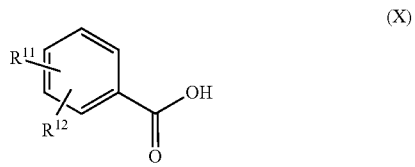

wherein:

$R^{11}$ is an aromatic or heteroaromatic ring system having 5-60 ring atoms, which in each case may be unsubstituted or substituted and which may be linked to the aromatic or heteroaromatic ring system via any desired position;

$R^{12}$ is hydrogen or an aromatic or heteroaromatic ring system having 5-60 ring atoms, which in each case may be unsubstituted or substituted and which may be linked to the aromatic or heteroaromatic ring system via any desired position; or (iii) a combination thereof.

In some embodiments, in the light emitting diode, the hole-transporting ligand of formula I, $R^1$ is hydrogen or carboxy;

$R^2$ is

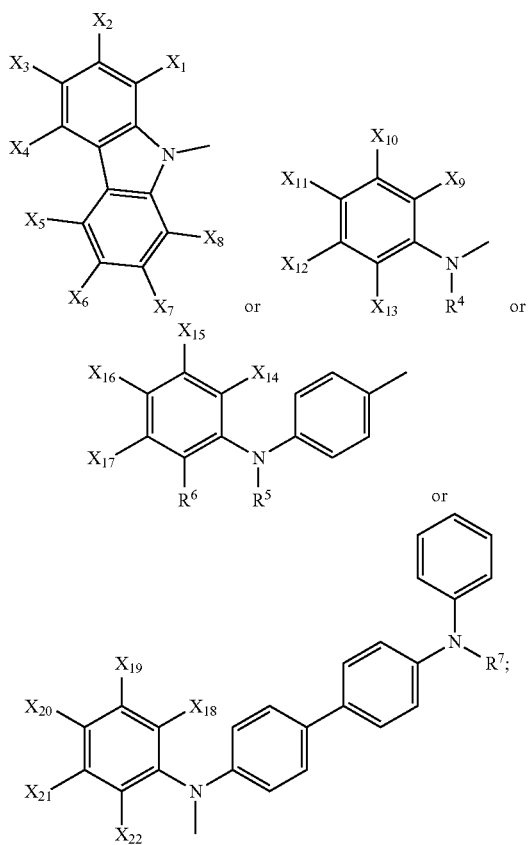

or $R^3$ is hydrogen;

$X_1$-$X_8$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$X_9$-$X_{13}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl; and $R^4$ is an unsubstituted or substituted aryl or heteroaryl group;

$X_{14}$-$X_{17}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^5$ is an unsubstituted or substituted aryl or heteroaryl group;

$R^6$ is hydrogen; or $R^5$ and $R^6$ together form:

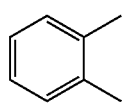

$X_{18}$-$X_{22}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^7$ is an unsubstituted or substituted aryl or heteroaryl group;

or $R^2$ and $R^3$ together form:

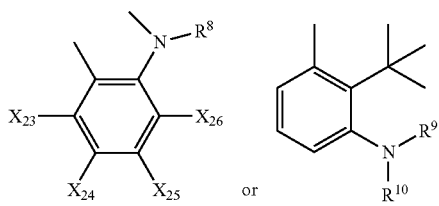

$X_{23}$-$X_{26}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^8$ is an unsubstituted or substituted aryl or heteroaryl group:

$R^9$ is an unsubstituted or substituted aryl or heteroaryl group;

$R^{10}$ is hydrogen or an unsubstituted or substituted aryl or heteroaryl group; or $R^9$ and $R^{10}$ together form:

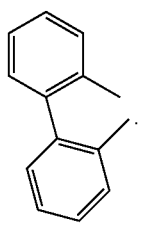

In some embodiments, in the light emitting diode, in the electron-transporting ligand of formula X:

$R^{11}$ is

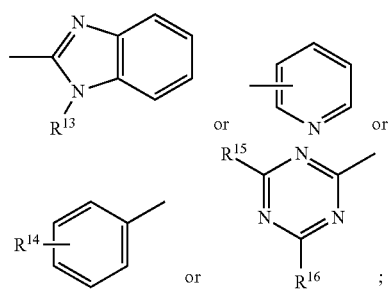

$R^{12}$ is hydrogen or is

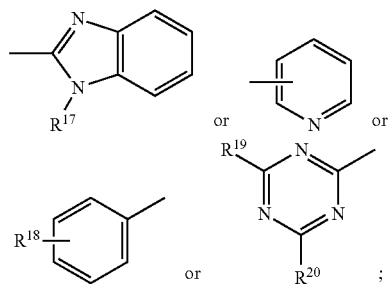

R¹³ and R¹⁷ independently are a substituted or unsubstituted aryl or heteroaryl group;

R¹⁴ and R¹⁸ independently are hydrogen, or

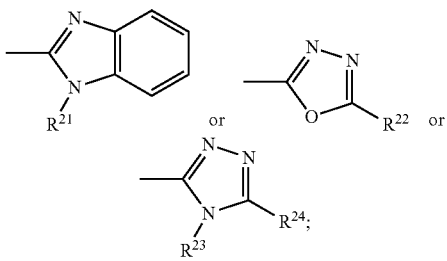

R¹⁵ and R¹⁹ independently are a substituted or unsubstituted aryl or heteroaryl group;

R¹⁶ and R²⁰ independently are a substituted or unsubstituted aryl or heteroaryl group;

R²¹ is a substituted or unsubstituted aryl or heteroaryl group;

R²² is a substituted or unsubstituted aryl or heteroaryl group;

R²³ is H or a substituted or unsubstituted aryl or heteroaryl group; and

R²⁴ is H or a substituted or unsubstituted aryl or heteroaryl group.

In some embodiments, in the light emitting diode, the first conductive layer comprises indium tin oxide, indium zinc oxide, tin dioxide, zinc oxide, magnesium, aluminum, aluminum-lithium, calcium, magnesium-indium, magnesium-silver, silver, gold, or mixtures thereof.

In some embodiments, in the light emitting diode, the first conductive layer comprises indium tin oxide.

In some embodiments, in the light emitting diode, the second conductive layer comprises indium tin oxide, indium zinc oxide, titanium dioxide, tin oxide, zinc sulfide, silver, or mixtures thereof.

In some embodiments, in the light emitting diode, the second conductive layer comprises aluminum.

In some embodiments, in the light emitting diode, the second conductive layer comprises gold.

In some embodiments, the light emitting diode further comprises a semiconductor polymer layer.

In some embodiments, in the light emitting diode, the semiconductor polymer layer comprises copper phthalocyanine, 4,4',4"-tris[(3-methylphenyl)phenylamino] triphenylamine (m-MTDATA), 4,4',4"-tris(diphenylamino) triphenylamine (TDATA), 4,4',4"-tris[2-naphthyl(phenyl)amino] triphenylamine (2T-NATA), polyaniline/dodecylbenzenesulfonic acid, poly(3,4-ethylenedioxythiophene)/polystyrene sulfonate) (PEDOT/PSS), polyaniline/camphor sulfonic acid, or polyaniline/poly(4-styrenesulfonate).

In some embodiments, in the light emitting diode, the semiconductor polymer layer comprises PEDOT/PSS.

In some embodiments, the light emitting diode further comprises a first transport layer.

In some embodiments, in the light emitting diode, the first transport layer comprises N,N'-di(naphthalen-1-yl)-N,N'-bis (4-vinylphenyl)-4,4'-diamine, poly [(9,9-dioctylfluorenyl-2,7-diyl)-co-(4,4'-(N-(4-sec-butylphenyl))diphenylamine)], or poly(9-vinylcarbazole).

In some embodiments, in the light emitting diode, the first transport layer comprises N,N'-di(naphthalen-1-yl)-N,N'-bis (4-vinylphenyl)-4,4'-diamine.

In some embodiments, the light emitting diode further comprises a second transport layer.

In some embodiments, in the light emitting diode, the second transport layer comprises 1,3-bis(3,5-dipyrid-3-ylphenyl)benzene (B3PyPB), bathocuproine, bathophenanthroline, 3-(biphenyl-4-yl)-5-(4-tert-butylphenyl)-4-phenyl-4H-1,2,4-triazole, 2-(4-biphenylyl)-5-phenyl-1,3,4-oxadiazole, 3,5-bis(4-tert-butylphenyl)-4-phenyl-4H-1,2,4-triazole, bis(8-hydroxy-2-methylquinoline)-(4-phenylphenoxy)aluminum, 2,5-bis(1-naphthyl)-1,3,4-oxadiazole, 3,5-diphenyl-4-(1-naphthyl)-1H-1,2,4-triazole, 1,3,5-tri(m-pyridin-3-ylphenyl)benzene (TmPyPB), 2,2',2"-(1,3,5-benzinetriyl)-tris(1-phenyl-1-H-benzimidazole) (TPBi), tris-(8-hydroxyquinoline)aluminum, TiO2, ZnO, SnO2, SiO2, ZrO2, or ZnMgO.

In some embodiments, in the light emitting diode, the second transport layer comprises ZnMgO.

In some embodiments, in the light emitting diode, the first conductive layer comprises indium tin oxide, the second conductive layer comprises aluminum, the semiconductor polymer layer comprises PEDOT/PSS, the first transport layer comprises N,N'-di(naphthalen-1-yl)-N,N'-bis(4-vinylphenyl)-4,4'-diamine, and the second transport layer comprises ZnMgO.

In some embodiments, in the light emitting diode, the first conductive layer comprises indium tin oxide, the second conductive layer comprises gold, the semiconductor polymer layer comprises PEDOT/PSS, and the first transport layer comprises N,N'-di(naphthalen-1-yl)-N,N'-bis(4-vinylphenyl)-4,4'-diamine.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF THE INVENTION

Figure 1:
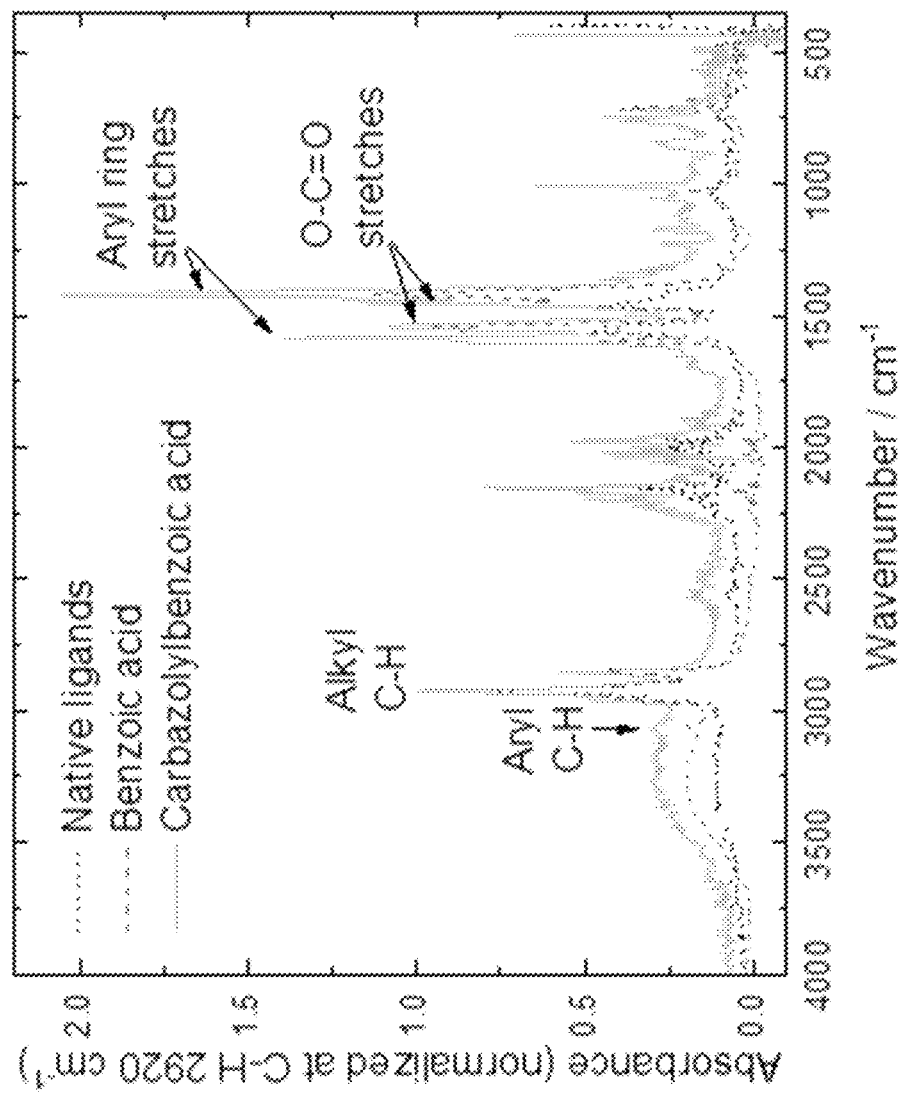
FIG. 1 is a Fourier-transform infrared (FTIR) spectra of ZnSe/ZnS quantum dots with oleate and laurate ligands (native ligands), ZnSe/ZnS quantum dots with benzoic acid ligands (benzoic acid), and ZnSe/ZnS quantum dots with 4-(carbazol-9-yl) benzoic acid ligands (carbazolylbenzoic acid ligands) for the 400-4000 cm¹ wavenumber range.
Figure 2:
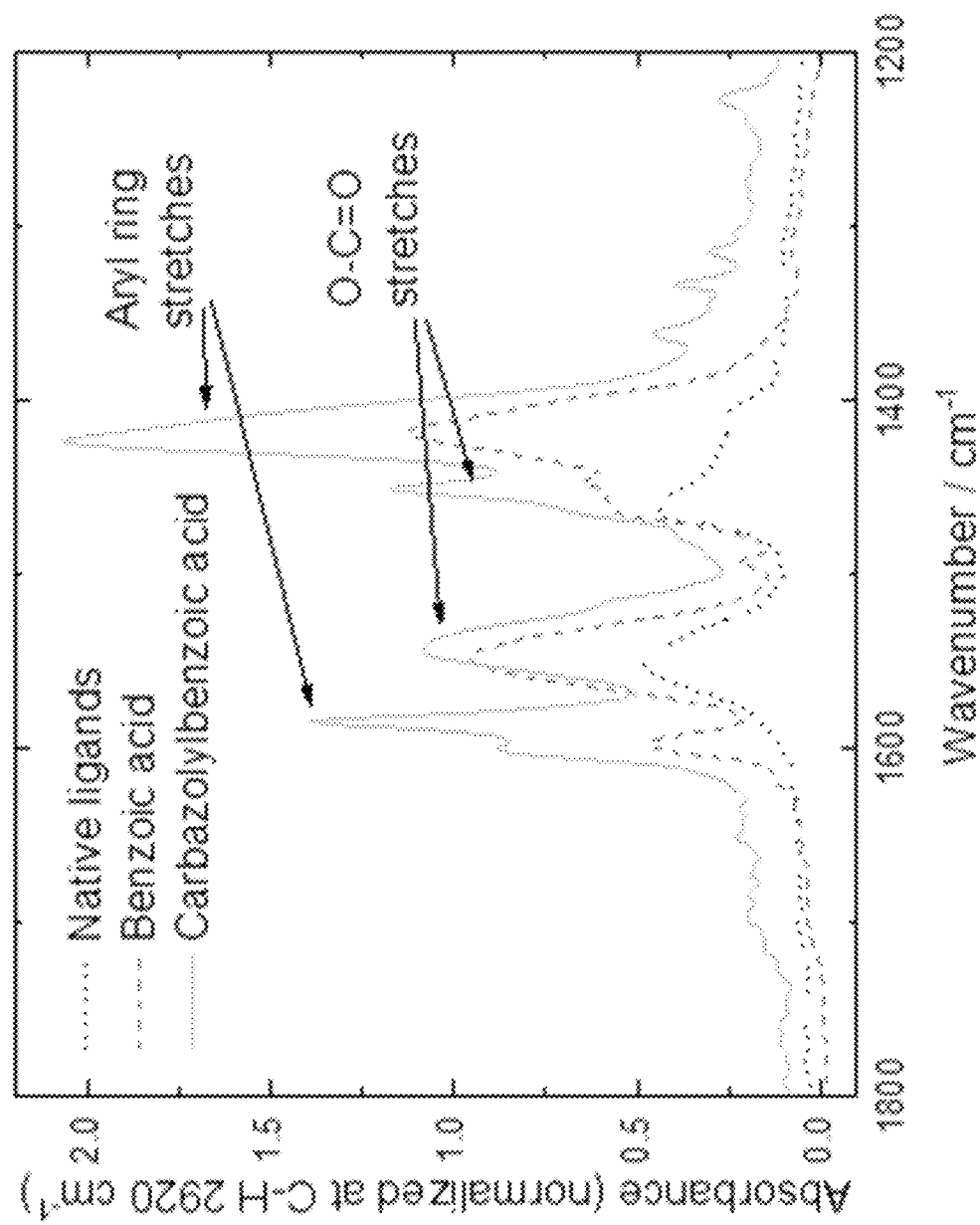
FIG. 2 is a Fourier-transform infrared (FTIR) spectra of ZnSe/ZnS quantum dots with oleate and laurate ligands (native ligands), ZnSe/ZnS quantum dots with benzoic acid ligands (benzoic acid), and ZnSe/ZnS quantum dots with 4-(carbazol-9-yl) benzoic acid ligands (carbazolylbenzoic acid ligands) expanded for the 1200-1800 cm¹ wavenumber range. The aryl ring stretches and O—C═O stretches are identified with arrows.

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in practice for testing, the preferred materials and methods are described herein. Accordingly, the terminology used herein is for the purpose of describing particular embodiments only, and is not intended to be limiting.

As used in this specification and the appended claims, the singular forms "a," "an," and "the" include plural referents unless the context clearly dictates otherwise. Thus, for example, reference to "a nanostructure" includes a plurality of such nanostructures, and the like.

The term "about" as used herein indicates the value of a given quantity varies by +10% of the value. For example, "about 100 nm" encompasses a range of sizes from 90 nm to 110 nm, inclusive.

A "nanostructure" is a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, quantum dots, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal.

When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm. In some embodiments, the nanocrystal has a dimension of less than about 200 nm, less than about 100 nm, less than about 50 nm, less than about 20 nm, or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In some embodiments, each of the three dimensions of the nanocrystal has a dimension of less than about 500 nm, less than about 200 nm, less than about 100 nm, less than about 50 nm, less than about 20 nm, or less than about 10 nm.

The term "quantum dot" (or "dot") refers to a nanocrystal that exhibits quantum confinement or exciton confinement. Quantum dots can be substantially homogenous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

A "ligand" is a molecule capable of interacting (whether weakly or strongly) with one or more facets of a nanostructure, e.g., through covalent, ionic, van der Waals, or other molecular interactions with the surface of the nanostructure.

"Photoluminescence quantum yield" is the ratio of photons emitted to photons absorbed, e.g., by a nanostructure or population of nanostructures. As known in the art, quantum yield is typically determined by a comparative method using well-characterized standard samples with known quantum yield values.

As used herein, the term "shell" refers to material deposited onto the core or onto previously deposited shells of the same or different composition and that result from a single act of deposition of the shell material. The exact shell thickness depends on the material as well as the precursor input and conversion and can be reported in nanometers or monolayers. As used herein, "target shell thickness" refers to the intended shell thickness used for calculation of the required precursor amount. As used herein, "actual shell thickness" refers to the actually deposited amount of shell material after the synthesis and can be measured by methods known in the art. By way of example, actual shell thickness can be measured by comparing particle diameters determined from transmission electron microscopy (TEM) images of nanocrystals before and after a shell synthesis.

As used herein, the term "stable" refers to a mixture or composition that resists change or decomposition due to internal reaction or due to the action of air, heat, light, electric field, electric current, pressure, or other natural conditions.

As used herein, the term "full width at half-maximum" (FWHM) is a measure of the size distribution of quantum dots. The emission spectra of quantum dots generally have the shape of a Gaussian curve. The width of the Gaussian curve is defined as the FWHM and gives an idea of the size distribution of the particles. A smaller FWHM corresponds to a narrower quantum dot nanocrystal size distribution. FWHM is also dependent upon the emission wavelength maximum.

"Alkyl" as used herein refers to a straight or branched, saturated, aliphatic radical having the number of carbon atoms indicated. In some embodiments, the alkyl is $C_{1-2}$ alkyl, $C_{1-3}$ alkyl, $C_{1-4}$ alkyl, $C_{1-5}$ alkyl, $C_{1-6}$ alkyl, $C_{1-7}$ alkyl, $C_{1-8}$ alkyl, $C_{1-9}$ alkyl, $C_{1-10}$ alkyl, $C_{1-12}$ alkyl, $C_{1-14}$ alkyl, $C_{1-16}$ alkyl, $C_{1-18}$ alkyl, $C_{1-20}$ alkyl, $C_{8-20}$ alkyl, $C_{12-20}$ alkyl, $C_{14-20}$ alkyl, $C_{16-20}$ alkyl, or $C_{18-20}$ alkyl. For example, $C_{1-6}$ alkyl includes, but is not limited to, methyl, ethyl, propyl, isopropyl, butyl, isobutyl, sec-butyl, tert-butyl, pentyl, isopentyl, and hexyl. In some embodiments, the alkyl is octyl, nonyl, decyl, undecyl, dodecyl, tridecyl, tetradecyl, pentadecyl, hexadecyl, heptadecyl, octadecyl, nonadecyl, or icosanyl.

The term "alkylene," as used herein, alone or in combination, refers to a saturated aliphatic group derived from a straight or branched chain saturated hydrocarbon attached at two or more positions, such as methylene ($-CH_2-$). Unless otherwise specified, the term "alkyl" may include "alkylene" groups.

"Alkenyl" as used herein refers to a monovalent group derived from a straight- or branched-chain hydrocarbon moiety having at least one carbon-carbon double bond by the removal of a single hydrogen atom. In some embodiments, the alkenyl group contains 2-20 carbon atoms and is a $C_{2-20}$ alkenyl. In some embodiments, the alkenyl group contains 2-15 carbon atoms and is a $C_{2-15}$ alkenyl. In some embodiments, the alkenyl group contains 2-10 carbon atoms and is a $C_{2-10}$ alkenyl. In some embodiments, the alkenyl group contains 2-8 carbon atoms and is a $C_{2-8}$ alkenyl. In some embodiments, the alkenyl group contains 2-5 carbons and is a $C_{2-5}$ alkenyl. Alkenyl groups include, for example, ethenyl, propenyl, butenyl, and 1-methyl-2-buten-1-yl.

"Alkynyl" as used herein refers to a monovalent group derived from a straight- or branched-chain hydrocarbon having at least one carbon-carbon triple bond by the removal of a single hydrogen atom. In some embodiments, the alkynyl group contains 2-20 carbon atoms and is a $C_{2-20}$ alkynyl. In some embodiments, the alkynyl group contains 2-15 carbon atoms and is a $C_{2-15}$ alkynyl. In some embodiments, the alkynyl group contains 2-10 carbon atoms and is a $C_{2-10}$ alkynyl. In some embodiments, the alkynyl group contains 2-8 carbon atoms and is a $C_{2-8}$ alkynyl. In some embodiments, the alkynyl group contains 2-5 carbons and is a $C_{2-5}$ alkynyl. Representative alkynyl groups include, but are not limited to, ethynyl, 2-propynyl (propargyl), and 1-propynyl.

"Alkylamino" as used herein, refers to a "substituted amino" of the formula ($-NR^K_2$), wherein $R^K$ is, independently, a hydrogen or an optionally substituted alkyl group, as defined herein, and the nitrogen moiety is directly attached to the parent molecule.

"Heteroalkyl" as used herein, refers to an alkyl moiety which is optionally substituted with one or more functional groups, and that contain one or more oxygen, sulfur, nitrogen, phosphorus, or silicon atoms, e.g., in place of carbon atoms.

"Cycloalkyl" as used herein, refers to a monovalent or divalent group of 3 to 8 carbon atoms, preferably 3 to 5 carbon atoms derived from a saturated cyclic hydrocarbon.

Cycloalkyl groups can be monocyclic or polycyclic. Cycloalkyl can be substituted by $C_{1-3}$ alkyl groups or halogens.

"Carboxy" as used herein, refers to a group that contains a carbon-oxygen double bond such as —COOH, —COOR$^A$, OC(O)H, —OC(O)R$^A$, wherein R$^A$ is alkyl, alkenyl, alkynyl, heteroalkyl, cycloalkyl, heterocycloalkyl, aryl, or heteroaryl, each of which can be optionally substituted. In some embodiments, the carboxy is a carboxylic acid, a dicarboxylic acid, a polycarboxylic acid, or a carboxylate.

"Haloalkyl" as used herein, refers to at least one halogen appended to the parent molecular group through an alkyl moiety. Suitable haloalkyl employed in compounds are chloromethyl, 2-fluoroethyl, trifluoromethyl, pentafluoroethyl, and 2-chloro-3-fluorophenyl.

"Amido" as used herein, refers to both "aminocarbonyl" and "carbonylamino." These terms when used alone or in connection with another group refers to an amido group such as N(R$^L$R$^M$)—C(O)— or R$^M$C(O)—N(R$^L$)— when used terminally and —C(O)—N(R$^L$)— or —N(R$^M$)—C(O)— when used internally, wherein each of R$^L$ and R$^M$ is independently hydrogen, alkyl, cycloaliphatic, (cycloaliphatic)aliphatic, aryl, araliphatic, heterocycloaliphatic, (heterocycloaliphatic)aliphatic, heteroaryl, carboxy, sulfanyl, sulfinyl, sulfonyl, (aliphatic)carbonyl, (cycloaliphatic)carbonyl, ((cycloaliphatic)aliphatic)carbonyl, arylcarbonyl, (araliphatic)carbonyl, (heterocycloaliphatic)carbonyl, ((heterocycloaliphatic)aliphatic)carbonyl, (heteroaryl)carbonyl, or (heteroaraliphatic)carbonyl, each of which being defined herein and being optionally substituted. Examples of amino groups include alkylamino, dialkylamino, or arylamino. Examples of amido groups include alkylamido (such as alkylcarbonylamino or alkylcarbonylamino), (heterocycloaliphatic)amido, (heteroaralkyl)amido, (heteroaryl)amido, (heterocycloalkyl)alkylamido, arylamido, aralkylamino, (cycloalkyl)alkylamido, or cycloalkylamino.

"Carboxyalkyl" as used herein, refers to a carboxylic acid group (—COOH) appended to a lower alkyl radical.

"Heterocycloalkyl" as used herein, refers to cycloalkyl substituents that have from 1 to 5, and more typically from 1 to 4 heteroatoms in the ring structure. Suitable heteroatoms employed in compounds are nitrogen, oxygen, and sulfur. Representative heterocycloalkyl moieties include, for example, morpholino, piperazinyl, piperidinyl, and the like.

"Aryl" or "aromatic" as used herein refers to unsubstituted monocyclic or bicyclic aromatic ring systems having from six to fourteen carbon atoms, i.e., a $C_{6-14}$ aryl. Non-limiting exemplary aryl groups include phenyl, naphthyl, phenanthryl, anthracyl, indenyl, azulenyl, biphenyl, biphenylenyl, fluorenyl groups, terphenyl, pyrenyl, 9,9-dimethyl-2-fluorenyl, anthryl, triphenylenyl, chrysenyl, fluorenylidenephenyl, and 5H-dibenzo[a,d]cycloheptenylidenephenyl. In one embodiment, the aryl group is a phenyl, naphthyl, or 9,9-dimethyl-2-fluorenyl.

"Heteroaryl" or "heteroaromatic" as used herein refers to unsubstituted monocyclic and bicyclic aromatic ring systems having 5 to 14 ring atoms, i.e., a 5- to 14-membered heteroaryl, wherein at least one carbon atom of one of the rings is replaced with a heteroatom independently selected from the group consisting of oxygen, nitrogen, and sulfur. In one embodiment, the heteroaryl contains 1, 2, 3, or 4 heteroatoms independently selected from the group consisting of oxygen, nitrogen, and sulfur. In one embodiment, the heteroaryl has three heteroatoms. In another embodiment, the heteroaryl has two heteroatoms. In another embodiment, the heteroaryl has one heteroatom. In another embodiment, the heteroaryl is a 5- to 10-membered heteroaryl. In another embodiment, the heteroaryl is a 5- or 6-membered heteroaryl. In another embodiment, the heteroaryl has 5 ring atoms, e.g., thienyl, a 5-membered heteroaryl having four carbon atoms and one sulfur atom. In another embodiment, the heteroaryl has 6 ring atoms, e.g., pyridyl, a 6-membered heteroaryl having five carbon atoms and one nitrogen atom. Non-limiting exemplary heteroaryl groups include thienyl, benzo[b]thienyl, naphtho[2,3-b]thienyl, thianthrenyl, furyl, benzofuryl, pyranyl, isobenzofuranyl, benzooxazonyl, chromenyl, xanthenyl, 2H-pyrrolyl, pyrrolyl, imidazolyl, pyrazolyl, pyridyl, pyrazinyl, pyrimidinyl, pyridazinyl, isoindolyl, 3H-indolyl, indolyl, indazolyl, purinyl, isoquinolyl, quinolyl, phthalazinyl, naphthyridinyl, cinnolinyl, quinazolinyl, pteridinyl, 4aH-carbazolyl, carbazolyl, β-carbolinyl, phenanthridinyl, acridinyl, pyrimidinyl, phenanthrolinyl, phenazinyl, thiazolyl, isothiazolyl, phenothiazolyl, isoxazolyl, furazanyl, and phenoxazinyl. In one embodiment, the heteroaryl is thienyl (e.g., thien-2-yl and thien-3-yl), furyl (e.g., 2-furyl and 3-furyl), pyrrolyl (e.g., 1H-pyrrol-2-yl and 1H-pyrrol-3-yl), imidazolyl (e.g., 2H-imidazol-2-yl and 2H-imidazol-4-yl), pyrazolyl (e.g., 1H-pyrazol-3-yl, 1H-pyrazol-4-yl, and 1H-pyrazol-5-yl), pyridyl (e.g., pyridin-2-yl, pyridin-3-yl, and pyridin-4-yl), pyrimidinyl (e.g., pyrimidin-2-yl, pyrimidin-4-yl, and pyrimidin-5-yl), thiazolyl (e.g., thiazol-2-yl, thiazol-4-yl, and thiazol-5-yl), isothiazolyl (e.g., isothiazol-3-yl, isothiazol-4-yl, and isothiazol-5-yl), oxazolyl (e.g., oxazol-2-yl, oxazol-4-yl, and oxazol-5-yl), isoxazolyl (e.g., isoxazol-3-yl, isoxazol-4-yl, and isoxazol-5-yl), or indazolyl (e.g., 1H-indazol-3-yl). The term "heteroaryl" also includes possible N-oxides. A non-limiting exemplary N-oxide is pyridyl N-oxide.

Unless clearly indicated otherwise, ranges listed herein are inclusive.

A variety of additional terms are defined or otherwise characterized herein.

Nanostructure Composition

In some embodiments, the present disclosure provides a nanostructure composition comprising:
  (a) at least one population of nanostructures; and
  (b) at least one charge-transporting ligand, wherein the charge-transporting ligand comprises at least one terminal functional group, wherein the at least one terminal functional group is bound to the surface of the nanostructures.

In some embodiments, the nanostructure is a quantum dot.

In some embodiments, the charge-transporting ligand is a hole-transporting ligand. In some embodiments, the charge-transporting ligand is an electron-transporting ligand. In some embodiments, the nanostructure composition comprises a combination of a hole-transporting ligand and an electron-transporting ligand.

In some embodiments, the present disclosure provides a nanostructure composition comprising:
  (a) at least one population of nanostructures; and
  (b) at least one charge-transporting ligand bound to the surface of the nanostructures, the charge-transporting ligand comprising:
    (i) a hole-transporting ligand of formula (I)

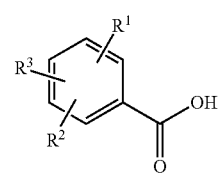

wherein:
R¹ is hydrogen or carboxy;
R² is an aromatic or heteroaromatic ring system having 5-60 ring atoms, which in each case may be unsubstituted or substituted and which may be linked to the aromatic or heteroaromatic ring system via any desired position;
R³ is hydrogen or an aromatic or heteroaromatic ring system having 5-60 ring atoms, which in each case may be unsubstituted or substituted and which may be linked to the aromatic or heteroaromatic ring system via any desired position; or
R² and R³ form together with the carbon atoms to which they are bonded, a 5- or 6-membered ring which may contain an aromatic or heteroaromatic ring system having 5-60 ring atoms, which in each case may be unsubstituted or substituted by and which may be linked to the aromatic or heteroaromatic ring system via any desired position; or
(ii) an electron-transporting ligand of formula (X)

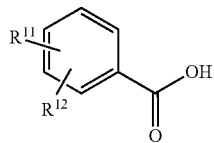

(X)

wherein:
R¹¹ is an aromatic or heteroaromatic ring system having 5-60 ring atoms, which in each case may be unsubstituted or substituted and which may be linked to the aromatic or heteroaromatic ring system via any desired position;
R¹² is hydrogen or an aromatic or heteroaromatic ring system having 5-60 ring atoms, which in each case may be unsubstituted or substituted and which may be linked to the aromatic or heteroaromatic ring system via any desired position; or
(iii) a combination thereof.

In some embodiments, the nanostructure is a quantum dot.
In some embodiments, the present disclosure provides a nanostructure composition comprising:
(a) at least one population of nanostructures, wherein the nanostructures comprise ligands bound to the nanostructures; and
(b) at least one charge-transporting ligand bound to the nanostructures.

In some embodiments, the nanostructure is a quantum dot. In some embodiments, the charge-transporting ligand is a hole-transporting ligand. In some embodiments, the charge-transporting ligand is an electron-transporting ligand. In some embodiments, the nanostructure composition comprises a combination of a hole-transporting ligand and an electron-transporting ligand.

Nanostructure Film Layer

In some embodiments, the present invention provides a nanostructure film layer comprising:
(a) at least one population of nanostructures, wherein the nanostructures comprise ligands bound to the nanostructures; and
(b) at least one charge-transporting ligand bound to the nanostructures.

In some embodiments, the nanostructure film layer further comprises an organic resin.

In some embodiments, the nanostructure is a quantum dot.

Illumination Device

In some embodiments, the present invention provides an illumination device comprising:
(a) a first conductive layer;
(b) a second conductive layer; and
(c) an emitting layer between the first conductive layer and the second conductive layer, wherein the emitting layer comprises at least one population of nanostructures comprising a charge-transporting ligand bound to the nanostructures.

In some embodiments, the light emitting diode is a quantum dot light emitting diode.

In some embodiments, the charge-transporting ligand is a hole-transporting ligand. In some embodiments, the charge-transporting ligand is an electron-transporting ligand. In some embodiments, the nanostructures comprise a combination of a hole-transporting ligand and an electron-transporting ligand.

Nanostructures

The quantum dots (or other nanostructures) for use in the present invention can be produced from any suitable material, suitably an inorganic material, and more suitably an inorganic conductive or semiconductive material. Suitable semiconductor materials include any type of semiconductor, including Group II-VI, Group III-V, Group IV-VI, and Group IV semiconductors. Suitable semiconductor materials include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, and combinations thereof.

The synthesis of Group II-VI nanostructures has been described in U.S. Pat. Nos. 6,225,198, 6,322,901, 6,207,229, 6,607,829, 6,861,155, 7,060,243, 7,125,605, 7,374,824, 7,566,476, 8,101,234, and 8,158,193 and in U.S. Patent Appl. Publication Nos. 2011/0262752 and 2011/0263062. In some embodiments, the core is a Group II-VI nanocrystal selected from the group consisting of ZnO, ZnSe, ZnS, ZnTe, CdO, CdSe, CdS, CdTe, HgO, HgSe, HgS, and HgTe. In some embodiments, the core is a nanocrystal selected from the group consisting of ZnSe, ZnS, CdSe, and CdS.

Although Group II-VI nanostructures such as CdSe and CdS quantum dots can exhibit desirable luminescence behavior, issues such as the toxicity of cadmium limit the applications for which such nanostructures can be used. Less toxic alternatives with favorable luminescence properties are thus highly desirable. Group III-V nanostructures in general and InP-based nanostructures in particular, offer the best known substitute for cadmium-based materials due to their compatible emission range.

In some embodiments, the nanostructures are free from cadmium. As used herein, the term "free of cadmium" is intended that the nanostructures contain less than 100 ppm by weight of cadmium. The Restriction of Hazardous Substances (RoHS) compliance definition requires that there must be no more than 0.01% (100 ppm) by weight of cadmium in the raw homogeneous precursor materials. The cadmium level in the Cd-free nanostructures is limited by the trace metal concentration in the precursor materials. The trace metal (including cadmium) concentration in the precursor materials for the Cd-free nanostructures, can be measured by inductively coupled plasma mass spectroscopy (ICP-MS) analysis, and are on the parts per billion (ppb) level. In some embodiments, nanostructures that are "free of cadmium" contain less than about 50 ppm, less than about 20 ppm, less than about 10 ppm, or less than about 1 ppm of cadmium.

In some embodiments, the core is a Group III-V nanostructure. In some embodiments, the core is a Group III-V nanocrystal selected from the group consisting of BN, BP, BAs, BSb, AlN, AlP, AlAs, AlSb, GaN, GaP, GaAs, GaSb, InN, InP, InAs, and InSb. In some embodiments, the core is an InP nanocrystal. In some embodiments, the core is a ZnSe nanocrystal.

The synthesis of Group III-V nanostructures has been described in U.S. Pat. Nos. 5,505,928, 6,306,736, 6,576,291, 6,788,453, 6,821,337, 7,138,098, 7,557,028, 7,645,397, 8,062,967, and 8,282,412 and in U.S. Patent Appl. Publication No. 2015/0236195. Synthesis of Group III-V nanostructures has also been described in Wells, R. L., et al., "The use of tris(trimethylsilyl)arsine to prepare gallium arsenide and indium arsenide," Chem. Mater. 1:4-6 (1989) and in Guzelian, A. A., et al., "Colloidal chemical synthesis and characterization of InAs nanocrystal quantum dots," Appl. Phys. Lett. 69: 1432-1434 (1996).

Synthesis of InP-based nanostructures has been described, e.g., in Xie, R., et al., "Colloidal InP nanocrystals as efficient emitters covering blue to near-infrared," J. Am. Chem. Soc. 129:15432-15433 (2007); Micic, O. I., et al., "Core-shell quantum dots of lattice-matched $ZnCdSe_2$ shells on InP cores: Experiment and theory," J. Phys. Chem. B 104:12149-12156 (2000); Liu, Z., et al., "Coreduction colloidal synthesis of III-V nanocrystals: The case of InP," Angew. Chem. Int. Ed. Engl. 47:3540-3542 (2008); Li, L. et al., "Economic synthesis of high quality InP nanocrystals using calcium phosphide as the phosphorus precursor," Chem. Mater. 20:2621-2623 (2008); D. Battaglia and X. Peng, "Formation of high quality InP and InAs nanocrystals in a noncoordinating solvent," Nano Letters 2:1027-1030 (2002); Kim, S., et al., "Highly luminescent InP/GaP/ZnS nanocrystals and their application to white light-emitting diodes," J. Am. Chem. Soc. 134:3804-3809 (2012); Nann, T., et al., "Water splitting by visible light: A nanophotocathode for hydrogen production," Angew. Chem. Int. Ed. 49:1574-1577 (2010); Borchert, H., et al., "Investigation of ZnS passivated InP nanocrystals by XPS," Nano Letters 2:151-154 (2002); L. Li and P. Reiss, "One-pot synthesis of highly luminescent InP/ZnS nanocrystals without precursor injection," J. Am. Chem. Soc. 130:11588-11589 (2008); Hussain, S., et al. "One-pot fabrication of high-quality InP/ZnS (core/shell) quantum dots and their application to cellular imaging," Chemphyschem. 10:1466-1470 (2009); Xu, S., et al., "Rapid synthesis of high-quality InP nanocrystals," J. Am. Chem. Soc. 128:1054-1055 (2006); Micic, O. I., et al., "Size-dependent spectroscopy of InP quantum dots," J. Phys. Chem. B 101:4904-4912 (1997); Haubold, S., et al., "Strongly luminescent InP/ZnS core-shell nanoparticles," Chemphyschem. 5:331-334 (2001); CrosGagneux, A., et al., "Surface chemistry of InP quantum dots: A comprehensive study," J. Am. Chem. Soc. 132:18147-18157 (2010); Micic, O. I., et al., "Synthesis and characterization of InP, GaP, and $GaInP_2$ quantum dots," J. Phys. Chem. 99:7754-7759 (1995); Guzelian, A. A., et al., "Synthesis of size-selected, surface-passivated InP nanocrystals," J. Phys. Chem. 100: 7212-7219 (1996); Lucey, D. W., et al., "Monodispersed InP quantum dots prepared by colloidal chemistry in a non-coordinating solvent," Chem. Mater. 17:3754-3762 (2005); Lim, J., et al., "InP@ZnSeS, core@composition gradient shell quantum dots with enhanced stability," Chem. Mater. 23:4459-4463 (2011); and Zan, F., et al., "Experimental studies on blinking behavior of single InP/ZnS quantum dots: Effects of synthetic conditions and UV irradiation," J. Phys. Chem. C 116:394-3950 (2012).

In some embodiments, the core is doped. In some embodiments, the dopant of the nanocrystal core comprises a metal, including one or more transition metals. In some embodiments, the dopant is a transition metal selected from the group consisting of Ti, Zr, Hf, V, Nb, Ta, Cr, Mo, W, Mn, Tc, Re, Fe, Ru, Os, Co, Rh, Ir, Ni, Pd, Pt, Cu, Ag, Au, and combinations thereof. In some embodiments, the dopant comprises a non-metal. In some embodiments, the dopant is ZnS, ZnSe, ZnTe, CdSe, CdS, CdTe, HgS, HgSe, HgTe, $CuInS_2$, $CuInSe_2$, AlN, AlP, AlAs, GaN, GaP, or GaAs.

Inorganic shell coatings on nanostructures are a universal approach to tailoring their electronic structure. Additionally, deposition of an inorganic shell can produce more robust particles by passivation of surface defects. Ziegler, J., et al., Adv. Mater. 20:4068-4073 (2008). For example, shells of wider band gap semiconductor materials such as ZnS can be deposited on a core with a narrower band gap—such as CdSe or InP—to afford structures in which excitons are confined within the core. This approach increases the probability of radiative recombination and makes it possible to synthesize very efficient quantum dots with quantum yields close to unity and thin shell coatings.

In some embodiments, the nanostructures comprise a core and at least one shell. In some embodiments, the nanostructures comprise a core and at least two shells. The shell can, e.g., increase the quantum yield and/or stability of the nanostructures. In some embodiments, the core and the shell comprise different materials. In some embodiments, the nanostructure comprises shells of different shell material.

Exemplary materials for preparing shells include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, GaSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2CO$, and combinations thereof.

In some embodiments, the shell is a mixture of at least two of a zinc source, a selenium source, a sulfur source, a tellurium source, and a cadmium source. In some embodiments, the shell is a mixture of two of a zinc source, a selenium source, a sulfur source, a tellurium source, and a cadmium source. In some embodiments, the shell is a mixture of three of a zinc source, a selenium source, a sulfur source, a tellurium source, and a cadmium source. In some embodiments, the shell is a mixture of: zinc and sulfur; zinc and selenium; zinc, sulfur, and selenium; zinc and tellurium; zinc, tellurium, and sulfur; zinc, tellurium, and selenium; zinc, cadmium, and sulfur; zinc, cadmium, and selenium; cadmium and sulfur; cadmium and selenium; cadmium, selenium, and sulfur; cadmium and zinc; cadmium, zinc, and sulfur; cadmium, zinc, and selenium; or cadmium, zinc, sulfur, and selenium. In some embodiments, the shell is a mixture of zinc and selenium. In some embodiments, the shell is a mixture of zinc and sulfur.

Exemplary core/shell luminescent nanostructures include, but are not limited to (represented as core/shell) CdSe/ZnS, InP/ZnS, PbSe/PbS, CdSe/CdS, CdTe/CdS, and CdTe/ZnS. The synthesis of core/shell nanostructures is disclosed in U.S. Pat. No. 9,169,435.

In some embodiments, the nanostructures comprise a core and at least one shell. In some embodiments, one shell is a mixture of zinc and selenium. In some embodiments, the nanostructures comprise a ZnS core and a ZnSe shell.

In some embodiments, the nanostructures include a core and at least two shells. In some embodiments, one shell is a mixture of zinc and selenium and one shell is a mixture of zinc and sulfur. In some embodiments, the nanostructures comprise an InP core, a ZnSe shell, and a ZnS shell.

The luminescent nanocrystals can be made from a material impervious to oxygen, thereby simplifying oxygen barrier requirements and photostabilization of the quantum dots in the quantum dot film layer. In exemplary embodiments, the luminescent nanocrystals are coated with one or more organic polymeric ligand material and dispersed in an organic polymeric matrix comprising one or more matrix materials. The luminescent nanocrystals can be further coated with one or more inorganic layers comprising one or more material such as a silicon oxide, an aluminum oxide, or a titanium oxide (e.g., $SiO_2$, $Si_2O_3$, $TiO_2$, or $Al_2O_3$), to hermetically seal the quantum dots.

First Ligands

In some embodiments, the nanostructures comprise ligands bound to their surface. In some embodiments, the nanostructures include a coating layer comprising ligands to protect the nanostructures from external moisture and oxidation, to control aggregation, and to allow for dispersion of the nanostructures in the matrix material. Suitable first ligands include those disclosed in U.S. Pat. Nos. 6,949,206; 7,267,875; 7,374,807; 7,572,393; 7,645,397; and 8,563,133 and in U.S. Patent Appl. Publication Nos. 2008/0237540; 2008/0281010; and 2010/0110728.

In some embodiments, the nanostructure comprises a multi-part ligand structure, such as the three-part ligand structure disclosed in U.S. Patent Appl. Publication No. 2008/237540, in which the head-group, tail-group, and middle/body group are independently fabricated and optimized for their particular function, and then combined into an ideally functioning complete surface ligand.

In some embodiments, the first ligands comprise one or more organic polymeric ligands. Suitable ligands provide: efficient and strong bonding quantum dot encapsulation with low oxygen permeability; precipitate or segregate into domain in the matrix material to form a discontinuous dual-phase or multi-phase matrix; disperse favorably throughout the matrix material; and are commercially available materials or can be easily formulated from commercially available materials.

In some embodiments, the first ligand comprises a carboxy, a thiol, a phosphine, or a phosphine oxide group.

In some embodiments, the first ligand comprises a carboxy group. In some embodiments, the first ligand comprises a carboxylic acid group. In some embodiments, the first ligand comprises a carboxylic acid group and the carboxylic acid is a caprylic acid, capric acid, lauric acid, myristic acid, or palmitic acid. In some embodiments, the first ligand is a carboxylate. In some embodiments, the first ligand comprises a carboxylate and the carboxylate is a carboxyalkyl.

In some embodiments, the first ligand comprises a phosphine group. In some embodiments, the first ligand comprises a phosphine group and the phosphine group is triphenylphosphine, tributylphosphine, trihexylphosphine, trioctylphosphine (TOP), or tridecylphosphine.

In some embodiments, the first ligand comprises a phosphine oxide group. In some embodiments, the first ligand comprises a phosphine oxide group and the phosphine oxide is triphenylphosphine oxide, tributylphosphine oxide, trihexylphosphine oxide, trioctylphosphine oxide (TOPO), or tridecylphosphine oxide.

Hole-Transporting Ligands

In some embodiments, the hole-transporting ligand comprises at least one functional group that can bind to a nanocrystal surface. In some embodiments, the hole-transporting ligand comprises one functional group that can bind to a nanocrystal surface.

In some embodiments, the hole-transporting ligand has at least one functional group attached to the terminal end of the hole-transporting ligand. In some embodiments, the at least one functional group is —OH, —SH, —NH$_2$, —CO$_2$H, —P(O)(OH)$_2$, —P(O)OH, or —SO$_3$H. In some embodiments, the at least one functional group is a —CO$_2$H.

In some embodiments, the hole-transporting ligand has the structure of formula I:

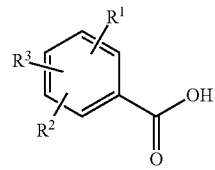

(I)

wherein:
  $R^1$ is hydrogen or carboxy;
  $R^2$ is an aromatic or heteroaromatic ring system having 5-60 ring atoms, which in each case may be unsubstituted or substituted and which may be linked to the aromatic or heteroaromatic ring system via any desired position;
  $R^3$ is hydrogen or an aromatic or heteroaromatic ring system having 5-60 ring atoms, which in each case may be unsubstituted or substituted and which may be linked to the aromatic or heteroaromatic ring system via any desired position; or
  $R^2$ and $R^3$ form together with the carbon atoms to which they are bonded, a 5- or 6-membered ring which may contain an aromatic or heteroaromatic ring system having 5-60 ring atoms, which in each case may be unsubstituted or substituted and which may be linked to the aromatic or heteroaromatic ring system via any desired position.

In some embodiments, the aromatic or heteroaromatic ring system having 5-60 ring atoms is benzene, naphthalene, anthracene, phenanthrene, pyrene, chrysene, benzanthracene, perylene, fluoranthene, napthacene, pentacene, benzopyrene, biphenyl, biphenylene, terphenyl, terphenylene, fluorene, spirobifluorene, dihydrophenanthrene, dihydropyrene, tetrahydropyrene, cis-indenofluorene, trans-indenofluorene, truxene, isotruxene, spirotruxene, spiroisotruxene, furan, benzofuran, isobenzofuran, dibenzofuran, thiophene, benzothio-phene, isobenzothiophene, dibenzothiophene, pyrrole, indole, isoindole, carbazole, cis-indenocarbazole, trans-indenocarbazole, cis-indolocarbazole, trans-indolocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimi-dazole, oxazole, benzoxazole, naphthoxazole, anthroxazole, phenanthrox-azole, isoxazole, 1,2-thiazole, 1,3-thiazole, benzothiazole, pyridazine, benzopyridazine, pyrimidine, benzopyrimidine, quinoxaline, 1,5-diaza-anthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, aza-carbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine, benzothiadiazole, or combinations thereof.

In some embodiments, $R^2$ is unsubstituted. In some embodiments, $R^2$ is substituted by at least one carboxy, $C_{1-10}$ alkyl, $C_{1-10}$ alkoxy, $C_{1-10}$ haloalkyl, halogen, $C_{1-10}$ alkylamino, or cycloalkyl.

In some embodiments, $R^3$ is unsubstituted. In some embodiments, $R^3$ is substituted by at least one carboxy, $C_{1-10}$ alkyl, $C_{1-10}$ alkoxy, $C_{1-10}$ haloalkyl, halogen, $C_{1-10}$ alkylamino, or cycloalkyl.

In some embodiments, in the hole-transporting ligand of formula I:

$R^1$ is hydrogen or carboxy;
$R^2$ is

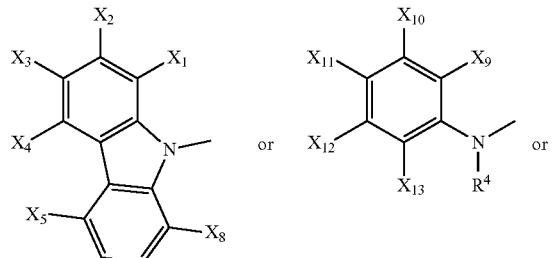

$R^3$ is hydrogen;
$X_1$-$X_8$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
$X_9$-$X_{13}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl; and
$R^4$ is an unsubstituted or substituted aryl or heteroaryl group;
$X_{14}$-$X_{17}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
$R^5$ is an unsubstituted or substituted aryl or heteroaryl group;
$R^6$ is hydrogen; or
$R^5$ and $R^6$ together form:

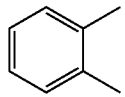

$X_{18}$-$X_{22}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
$R^7$ is an unsubstituted or substituted aryl or heteroaryl group;
or
$R^2$ and $R^3$ together form:

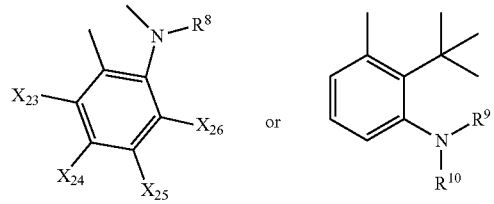

$X_{23}$-$X_{26}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
$R^8$ is an unsubstituted or substituted aryl or heteroaryl group:
$R^9$ is an unsubstituted or substituted aryl or heteroaryl group;
$R^{10}$ is hydrogen or an unsubstituted or substituted aryl or heteroaryl group; or
$R^9$ and $R^{10}$ together form:

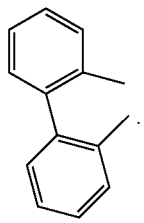

In some embodiments, $R^4$ is an unsubstituted aryl or heteroaryl group. In some embodiments, $R^4$ is a substituted aryl of heteroaryl group. In some embodiments, $R^4$ is substituted with carboxy, $C_{1-10}$ alkyl, $C_{1-10}$ alkoxy, $C_{1-10}$ haloalkyl, halogen, $C_{1-10}$ alkylamino, or cycloalkyl.

In some embodiments, $R^5$ is an unsubstituted aryl or heteroaryl group. In some embodiments, $R^5$ is a substituted aryl of heteroaryl group. In some embodiments, $R^5$ is substituted with carboxy, $C_{1-10}$ alkyl, $C_{1-10}$ alkoxy, $C_{1-10}$ haloalkyl, halogen, $C_{1-10}$ alkylamino, or cycloalkyl.

In some embodiments, $R^7$ is an unsubstituted aryl or heteroaryl group. In some embodiments, $R^7$ is a substituted aryl of heteroaryl group. In some embodiments, $R^7$ is substituted with carboxy, $C_{1-10}$ alkyl, $C_{1-10}$ alkoxy, $C_{1-10}$ haloalkyl, halogen, $C_{1-10}$ alkylamino, or cycloalkyl.

In some embodiments, $R^8$ is an unsubstituted aryl or heteroaryl group. In some embodiments, $R^8$ is a substituted aryl of heteroaryl group. In some embodiments, $R^8$ is substituted with carboxy, $C_{1-10}$ alkyl, $C_{1-10}$ alkoxy, $C_{1-10}$ haloalkyl, halogen, $C_{1-10}$ alkylamino, or cycloalkyl.

In some embodiments, $R^9$ is an unsubstituted aryl or heteroaryl group. In some embodiments, $R^9$ is a substituted aryl of heteroaryl group. In some embodiments, $R^9$ is substituted with carboxy, $C_{1-10}$ alkyl, $C_{1-10}$ alkoxy, $C_{1-10}$ haloalkyl, halogen, $C_{1-10}$ alkylamino, or cycloalkyl.

In some embodiments, $R^{10}$ is an unsubstituted aryl or heteroaryl group. In some embodiments, $R^{10}$ is a substituted aryl of heteroaryl group. In some embodiments, $R^{10}$ is substituted with carboxy, $C_{1-10}$ alkyl, $C_{1-10}$ alkoxy, $C_{1-10}$ haloalkyl, halogen, $C_{1-10}$ alkylamino, or cycloalkyl.

In some embodiments, where $R^3$ is hydrogen in the structure of formula I, the hole-transporting ligand has the structure of formula II:

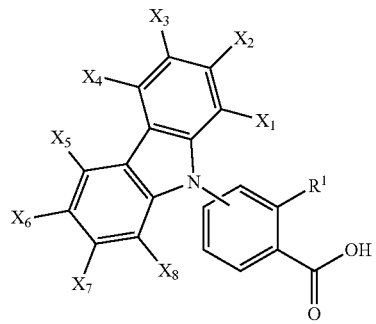

(II)

wherein:
$X_1$-$X_8$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl; and
$R^1$ is hydrogen or carboxy.

In some embodiments, in the structure of formula II, $X_1$-$X_8$ are hydrogen.

In some embodiments, $R^1$ is hydrogen. In some embodiments, $R^1$ is carboxy.

In some embodiments, in the structure of formula II, $X_1$, $X_2$, $X_3$, $X_4$, $X_5$, $X_6$, $X_7$, and $X_8$ are hydrogen and $R^1$ is hydrogen.

In some embodiments, in the structure of formula II, $X_1$, $X_2$, $X_4$, $X_5$, $X_7$, and $X_8$ are hydrogen and $X_3$ and $X_6$ are $C_{1-10}$ alkyl. In some embodiments, $X_3$ and $X_6$ are $C_{1-4}$ alkyl. In some embodiments, $X_3$ and $X_6$ are methyl. In some embodiments, $X_3$ and $X_6$ are $C_3$ alkyl. In some embodiments, $X_3$ and $X_6$ are isopropyl. In some embodiments, $X_3$ and $X_6$ are $C_4$ alkyl. In some embodiments, $X_3$ and $X_6$ are isobutyl. In some embodiments, $X_3$ and $X_6$ are tert-butyl. In some embodiments, in the structure of formula II, $X_1$, $X_2$, $X_4$, $X_5$, $X_7$, and $X_8$ are hydrogen, $X_3$ and $X_6$ are methyl, and $R^1$ is hydrogen. In some embodiments, in the structure of formula II, $X_1$, $X_2$, $X_4$, $X_5$, $X_7$, and $X_8$ are hydrogen, $X_3$ and $X_6$ are tert-butyl, and $R^1$ is hydrogen.

In some embodiments, in the structure of formula II, $X_1$, $X_2$, $X_4$, $X_5$, $X_7$, and $X_8$ are hydrogen and $X_3$ and $X_6$ are $C_{1-10}$ alkoxy. In some embodiments, $X_3$ and $X_6$ are $C_{1-4}$ alkoxy. In some embodiments, $X_3$ and $X_6$ are methoxy, ethoxy, propoxy, or butoxy. In some embodiments, $X_3$ and $X_6$ are methoxy. In some embodiments, in the structure of formula II, $X_1$, $X_2$, $X_4$, $X_5$, $X_7$, and $X_8$ are hydrogen, $X_3$ and $X_6$ are methoxy, and $R^1$ is hydrogen.

In some embodiments, in the structure of formula II, $X_1$, $X_2$, $X_4$, $X_5$, $X_7$, and $X_8$ are hydrogen and $X_3$ and $X_6$ are $C_{1-10}$ alkylamino. In some embodiments, $X_3$ and $X_6$ are $C_{1-4}$ alkylamino. In some embodiments, $X_3$ and $X_6$ are dimethylamino. In some embodiments, in the structure of formula II, $X_1$, $X_2$, $X_4$, $X_5$, $X_7$, and $X_8$ are hydrogen, $X_3$ and $X_6$ are dimethylamino, and $R^1$ is hydrogen.

In some embodiments, in the structure of formula II, $X_1$, $X_2$, $X_4$, $X_5$, $X_7$, and $X_8$ are hydrogen and $X_3$ and $X_6$ are $C_{1-10}$ haloalkyl. In some embodiments, $X_3$ and $X_6$ are $C_{1-4}$ haloalkyl. In some embodiments, $X_3$ and $X_6$ are trifluoromethyl. In some embodiments, in the structure of formula II, $X_1$, $X_2$, $X_4$, $X_5$, $X_7$, and $X_8$ are hydrogen, $X_3$ and $X_6$ are trifluoromethyl, and $R^1$ is hydrogen.

In some embodiments, where $R^3$ is hydrogen in the structure of formula I, the hole-transporting ligand has the structure of formula III:

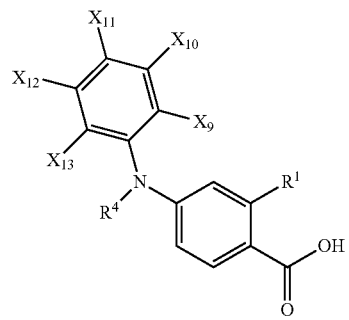

(III)

wherein:
$X_9$-$X_{13}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
$R^1$ is hydrogen or carboxy; and
$R^4$ is an unsubstituted or substituted aryl or heteroaryl group.

In some embodiments, in the structure of formula III, $X_9$, $X_{10}$, $X_{11}$, $X_{12}$, and $X_{13}$ are hydrogen and $R^1$ is hydrogen. In some embodiments, in the structure of formula III, $X_9$, $X_{10}$, $X_{11}$, $X_{12}$, and $X_{13}$ are hydrogen and $R^1$ is carboxy.

In some embodiments, in the structure of formula III, $X_9$, $X_{10}$, $X_{11}$, $X_{12}$, and $X_{13}$ are hydrogen, $R^1$ is hydrogen, and $R^4$ is an unsubstituted phenyl. In some embodiments, in the structure of formula III, $X_9$, $X_{10}$, $X_{11}$, $X_{12}$, and $X_{13}$ are hydrogen, $R^1$ is hydrogen, and $R^4$ is an unsubstituted naphthyl. In some embodiments, in the structure of formula III, $X_9$, $X_{10}$, $X_{11}$, $X_{12}$, and $X_{13}$ are hydrogen, $R^1$ is hydrogen, and $R^4$ is an unsubstituted biphenyl. In some embodiments, in the structure of formula III, $X_9$, $X_{10}$, $X_{11}$, $X_{12}$, and $X_{13}$ are hydrogen, $R^1$ is hydrogen, and $R^4$ is an unsubstituted 9,9-dimethyl-2-fluorenyl.

In some embodiments, where $R^3$ is hydrogen, the hole-transporting ligand has the structure of formula IV:

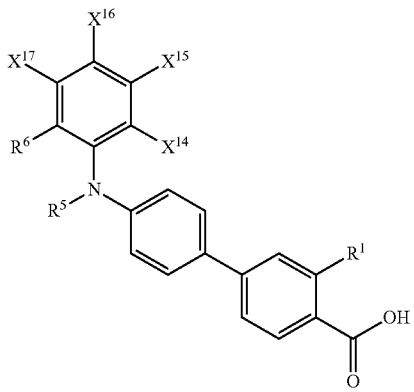

(IV)

wherein:
- $X_{14}$-$X_{17}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
- $R^1$ is hydrogen or carboxy;
- $R^5$ is an unsubstituted or substituted aryl or heteroaryl group; and
- $R^6$ is hydrogen.

In some embodiments, in the structure of formula IV, $X_{14}$, $X_{15}$, $X_{16}$, and $X_{17}$ are hydrogen and $R^1$ is hydrogen. In some embodiments, in the structure of formula IV, $X_{14}$, $X_{15}$, $X_{16}$, and $X_{17}$ are hydrogen and $R^1$ is carboxy.

In some embodiments, in the structure of formula IV, $X_{14}$, $X_{15}$, $X_{16}$, and $X_{17}$ are hydrogen, $R^1$ is hydrogen, $R^6$ is hydrogen, and $R^5$ is an unsubstituted phenyl. In some embodiments, in the structure of formula IV, $X_{14}$, $X_{15}$, $X_{16}$, and $X_{17}$ are hydrogen, $R^1$ is hydrogen, $R^6$ is hydrogen, and $R^5$ is an unsubstituted naphthyl.

In some embodiments, where $R^3$ is hydrogen, the hole-transporting ligand has the structure of formula V:

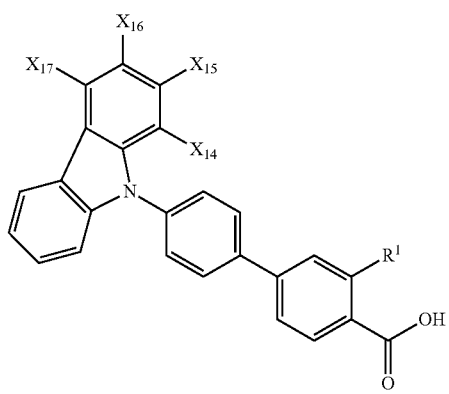

(V)

wherein:
- $X_{14}$-$X_{17}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl; and
- $R^1$ is hydrogen or carboxy.

In some embodiments, in the structure of formula V, $X_{14}$, $X_{15}$, $X_{16}$, and $X_{17}$ are hydrogen and $R^1$ is hydrogen. In some embodiments, in the structure of formula V, $X_{14}$, $X_{15}$, $X_{16}$, and $X_{17}$ are hydrogen and $R^1$ is carboxy.

In some embodiments, where $R^3$ is hydrogen, the hole-transporting ligand has the structure of formula VI:

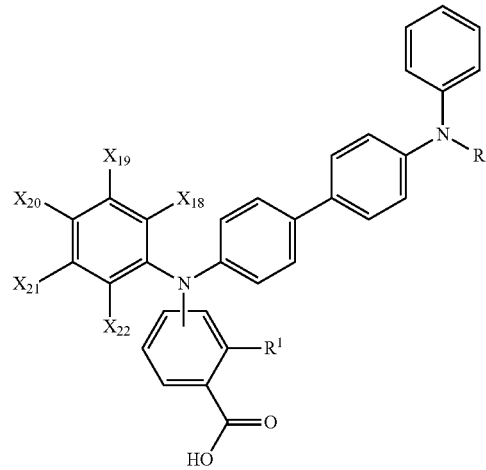

(VI)

wherein:
- $X_{18}$-$X_{22}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
- $R^1$ is hydrogen or carboxy; and
- $R^7$ is an unsubstituted or substituted aryl or heteroaryl group.

In some embodiments, in the structure of formula VI, $X_{18}$, $X_{19}$, $X_{20}$, $X_{21}$, and $X_{22}$ are hydrogen and $R^1$ is hydrogen. In some embodiments, in the structure of formula VI, $X_{18}$, $X_{19}$, $X_{20}$, $X_{21}$, and $X_{22}$ are hydrogen and $R^1$ is carboxy.

In some embodiments, in the structure of formula VI, $X_{18}$, $X_{19}$, $X_{20}$, $X_{21}$, and $X_{22}$ are hydrogen, $R^1$ is hydrogen, and $R^7$ is an unsubstituted phenyl. In some embodiments, in the structure of formula VI, $X_{18}$, $X_{19}$, $X_{20}$, $X_{21}$, and $X_{22}$ are hydrogen, $R^1$ is hydrogen, and $R^7$ is an unsubstituted naphthyl. In some embodiments, in the structure of formula VI, $X_{18}$, $X_{20}$, $X_{21}$, and $X_{22}$ are hydrogen, $X_{19}$ is carboxy, $R^1$ is hydrogen, and $R^7$ is an unsubstituted phenyl.

In some embodiments, the hole-transporting ligand has the structure of formula VII:

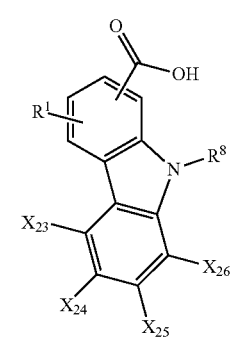

(VII)

wherein:
- $X_{23}$-$X_{26}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
- $R^1$ is hydrogen or carboxy; and
- $R^8$ is an unsubstituted or substituted aryl or heteroaryl group.

In some embodiments, in the structure of formula VII, $X_{23}$, $X_{24}$, $X_{25}$, and $X_{26}$ are hydrogen and $R^1$ is hydrogen. In some embodiments, in the structure of formula VII, $X_{23}$, $X_{24}$, $X_{25}$, and $X_{26}$ are hydrogen and $R^1$ is carboxy.

In some embodiments, in the structure of formula VII, $X_{23}$, $X_{24}$, $X_{25}$, and $X_{26}$ are hydrogen, $R^1$ is hydrogen, and $R^8$ is an unsubstituted phenyl.

In some embodiments, the hole-transporting ligand has the structure of formula VIII:

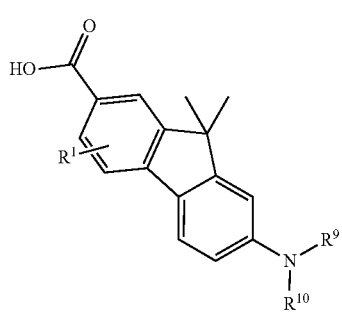

(VIII)

wherein:
  $R^1$ is hydrogen or carboxy; and
  $R^9$ is an unsubstituted or substituted aryl or heteroaryl group; and
  $R^{10}$ is an unsubstituted or substituted aryl or heteroaryl group.

In some embodiments, in the structure of formula VIII, $R^1$ is hydrogen. In some embodiments, in the structure of formula VIII, $R^1$ is carboxy.

In some embodiments, in the structure of formula VIII, $R^1$ is hydrogen, $R^9$ is phenyl, and $R^{10}$ is an unsubstituted phenyl. In some embodiments, in the structure of formula VIII, $R^1$ is hydrogen, $R^9$ is phenyl, and $R^{10}$ is an unsubstituted naphthyl.

In some embodiments, the hole-transporting ligand has the structure of formula IX:

(IX)

wherein:
  $R^1$ is hydrogen or carboxy.

In some embodiments, in the structure of formula IX, $R^1$ is hydrogen. In some embodiments, in the structure of formula IX, $R^1$ is carboxy.

In some embodiments, the hole-transporting ligand is a compound of TABLE 1.

TABLE 1

| Compound | Structure |
|---|---|
| 1 | |
| 2 | |

TABLE 1-continued
| Compound | Structure |
|---|---|
| 3 | 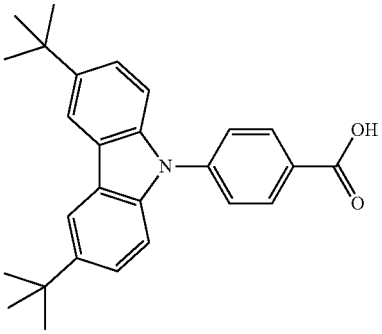 [SMILES: CC(C)(C)c1ccc2c(c1)c1cc(C(C)(C)C)ccc1n2-c1ccc(C(=O)O)cc1] |
| 4 | 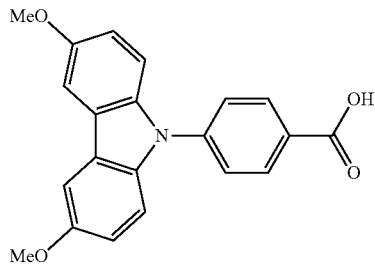 [SMILES: COc1ccc2c(c1)c1cc(OC)ccc1n2-c1ccc(C(=O)O)cc1] |
| 5 | 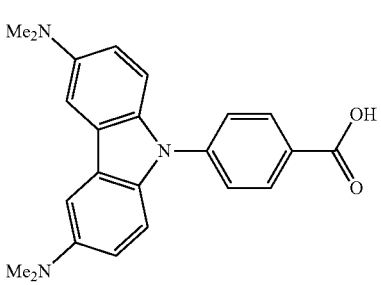 [SMILES: CN(C)c1ccc2c(c1)c1cc(N(C)C)ccc1n2-c1ccc(C(=O)O)cc1] |
| 6 | 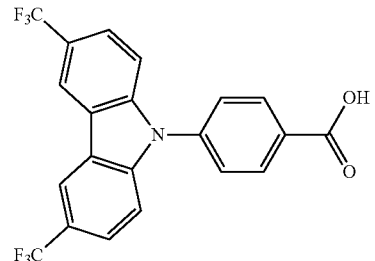 |
| 7 | 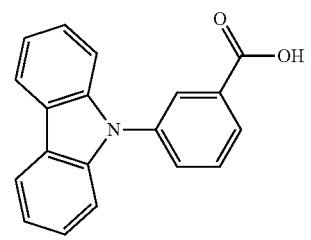 [SMILES: O=C(O)c1cccc(-n2c3ccccc3c3ccccc32)c1] |

TABLE 1-continued

| Compound | Structure |
|---|---|
| 8 | 3-carboxy-9-phenylcarbazole |
| 9 | 2-carboxy-9-phenylcarbazole |
| 10 | 4-(9H-carbazol-9-yl)phthalic acid |
| 11 | 4-(diphenylamino)benzoic acid |
| 12 | 4-(naphthalen-2-yl(phenyl)amino)benzoic acid |
| 13 | 4-(naphthalen-1-yl(phenyl)amino)benzoic acid |

TABLE 1-continued
| Compound | Structure |
|---|---|
| 14 | 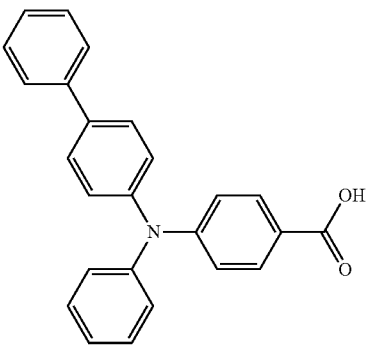 [SMILES: O=C(O)c1ccc(N(c2ccccc2)c2ccc(-c3ccccc3)cc2)cc1] |
| 15 | 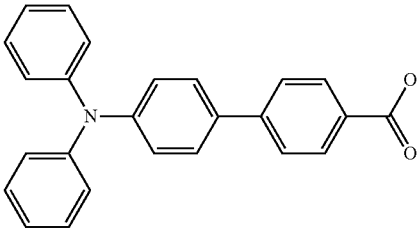 |
| 16 | 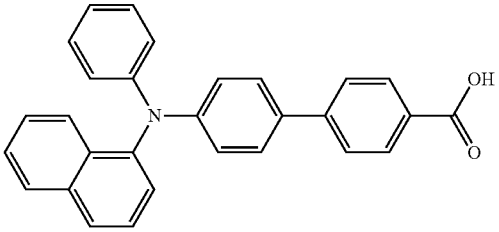 [SMILES: O=C(O)c1ccc(-c2ccc(N(c3ccccc3)c3cccc4ccccc34)cc2)cc1] |
| 17 | 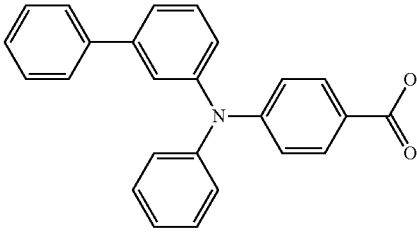 |
| 18 | 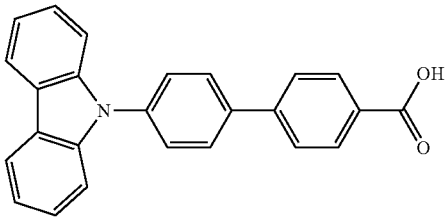 [SMILES: O=C(O)c1ccc(-c2ccc(-n3c4ccccc4c4ccccc43)cc2)cc1] |
| 19 | 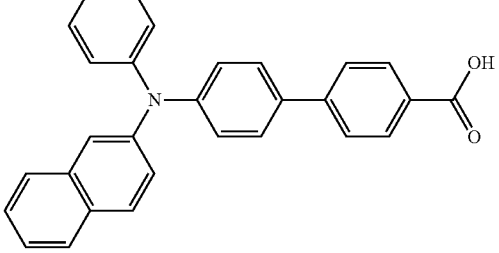 |

TABLE 1-continued

| Compound | Structure |
|---|---|
| 20 | |
| 21 | |
| 22 | |
| 23 | |
| 24 | |

TABLE 1-continued

| Compound | Structure |
|---|---|
| 25 | |
| 26 | |
| 27 | |
| 28 | |
| 29 | |
| 30 | |

TABLE 1-continued

| Compound | Structure |
|---|---|
| 31 | (structure) |
| 32 | (structure) |
| 33 | (structure) |
| 34 | (structure) |
| 35 | (structure) |

In some embodiments, the hole-transporting ligand is commercially available. In some embodiments, the hole-transporting ligand is prepared using methods known to one of ordinary skill in the art. See Juan, P., et al., *J. Alloy Compds* 426(1-2):363-367 (2006) and Kato, Y., et al., *J. Am. Chem. Soc.* 116(8):3279-3284 (1994).

Electron-Transporting Ligands

In some embodiments, electron-transporting ligands are exchanged onto a nanostructure to facilitate electron transport. Nanostructures with such n-type ligands can be used in heterojunction architectures with distinct films of p-type and n-type ligand coated nanostructures, or in a single film with intimately mixed p-type and n-type ligand coated nanostructures, or p-type and n-type ligands can be mixed on the surface of a nanostructure in varying ratios. Nanostructures with n-type ligands can also be used on their own, for example in devices that are intrinsically more hole-conductive than electron-conductive. This is useful for fine-tuning charge balance within nanostructure devices, and allows control over the location of the recombination zone.

In some embodiments, the electron-transporting ligand comprises at least one functional group that can bind to a nanocrystal surface. In some embodiments, the electron-transporting ligand comprises one functional group that can bind to a nanocrystal surface.

In some embodiments, the electron-transporting ligand has at least one functional group attached to the terminal end of the electron-transporting ligand. In some embodiments, the at least one functional group is —OH, —SH, —NH$_2$, —CO$_2$H, —P(O)(OH)$_2$, —P(O)OH, or —SO$_3$H. In some embodiments, the at least one functional group is a —CO$_2$H.

In some embodiments, the electron-transporting ligand has the structure of formula X:

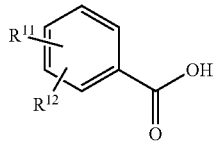

(X)

wherein:
$R^{11}$ is an aromatic or heteroaromatic ring system having 5-60 ring atoms, which in each case may be unsubstituted or substituted and which may be linked to the aromatic or heteroaromatic ring system via any desired position;
$R^{12}$ is hydrogen or an aromatic or heteroaromatic ring system having 5-60 ring atoms, which in each case may be unsubstituted or substituted and which may be linked to the aromatic or heteroaromatic ring system via any desired position.

In some embodiments, the aromatic or heteroaromatic ring system having 5-60 ring atoms is benzene, naphthalene, anthracene, phenanthrene, pyrene, chrysene, benzanthracene, perylene, fluoranthene, napthacene, pentacene, benzopyrene, biphenyl, biphenylene, terphenyl, terphenylene, fluorene, spirobifluorene, dihydrophenanthrene, dihydropyrene, tetrahydropyrene, cis-indenofluorene, trans-indenofluorene, truxene, isotruxene, spirotruxene, spiroisotruxene, furan, benzofuran, isobenzofuran, dibenzofuran, thiophene, benzothio-phene, isobenzothiophene, dibenzothiophene, pyrrole, indole, isoindole, carbazole, cis-indenocarbazole, trans-indenocarbazole, cis-indolocarbazole, trans-indolocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimi-dazole, oxazole, benzoxazole, naphthoxazole, anthroxazole, phenanthrox-azole, isoxazole, 1,2-thiazole, 1,3-thiazole, benzothiazole, pyridazine, benzopyridazine, pyrimidine, benzopyrimidine, quinoxaline, 1,5-diaza-anthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, aza-carbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazole, 1,2,4-triazine, 1,2,3-triazine, tetrazole, 1,2,4,5-tetrazine, 1,2,3,4-tetrazine, 1,2,3,5-tetrazine, purine, pteridine, indolizine, benzothiadiazole, or combinations thereof.

In some embodiments, $R^{11}$ is unsubstituted. In some embodiments, $R^{11}$ is substituted by at least one carboxy, $C_{1-10}$ alkyl, $C_{1-10}$ alkoxy, $C_{1-10}$ haloalkyl, halogen, $C_{1-10}$ alkylamino, or cycloalkyl.

In some embodiments, $R^{12}$ is unsubstituted. In some embodiments, $R^{12}$ is substituted by at least one carboxy, $C_{1-10}$ alkyl, $C_{1-10}$ alkoxy, $C_{1-10}$ haloalkyl, halogen, $C_{1-10}$ alkylamino, or cycloalkyl.

In some embodiments, in the electron-transporting ligand of formula X:
$R^{11}$ is

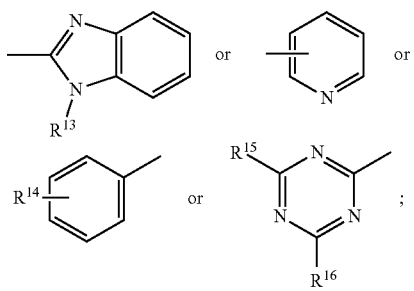

$R^{12}$ is hydrogen or is

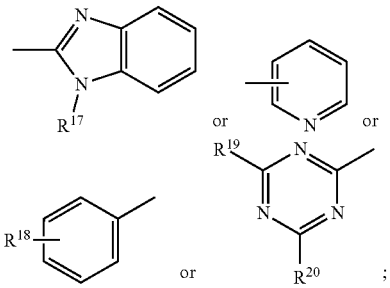

$R^{13}$ and $R^{17}$ independently are a substituted or unsubstituted aryl or heteroaryl group;
$R^{14}$ and $R^{18}$ independently are hydrogen, or

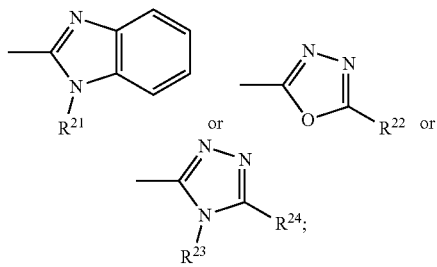

$R^{15}$ and $R^{19}$ independently are a substituted or unsubstituted aryl or heteroaryl group;
$R^{16}$ and $R^{20}$ independently are a substituted or unsubstituted aryl or heteroaryl group;
$R^{21}$ is a substituted or unsubstituted aryl or heteroaryl group;
$R^{22}$ is a substituted or unsubstituted aryl or heteroaryl group;
$R^{23}$ is H or a substituted or unsubstituted aryl or heteroaryl group; and R$^{24}$ is H or a substituted or unsubstituted aryl or heteroaryl group.

In some embodiments, where R$^{12}$ is hydrogen in the structure of formula X, the electron-transporting ligand has the structure of formula XI:

(XI)

wherein:
R$^{13}$ is a substituted or unsubstituted aryl or heteroaryl group.

In some embodiments, in the structure of formula XI, R$^{13}$ is an unsubstituted aryl group. In some embodiments, in the structure of formula XI, R$^{13}$ is an unsubstituted phenyl.

In some embodiments, in the structure of formula XI, R$^{13}$ is a substituted aryl group. In some embodiments, R$^{13}$ is substituted with carboxy, C$_{1-10}$ alkyl, C$_{1-10}$ alkoxy, C$_{1-10}$ haloalkyl, halogen, C$_{1-10}$ alkylamino, or cycloalkyl.

In some embodiments, where R$^{12}$ is hydrogen in the structure of formula X, the electron-transporting ligand has the structure of formula XII:

(XII)

In some embodiments, where R$^{12}$ is hydrogen in the structure of formula X, the electron-transporting ligand has the structure of formula XIII:

(XIII)

wherein:
R$^{14}$ is a substituted or unsubstituted aryl or heteroaryl group.

In some embodiments, in the structure of formula XIII, R$^{14}$ is an unsubstituted heteroaryl group. In some embodiments, in the structure of formula XIII, R$^{14}$ is a substituted heteroaryl group. In some embodiments, R$^{14}$ is substituted with carboxy, C$_{1-10}$ alkyl, C$_{1-10}$ alkoxy, C$_{1-10}$ haloalkyl, halogen, C$_{1-10}$ alkylamino, or cycloalkyl.

In some embodiments, where R$^{12}$ is hydrogen in the structure of formula X, the electron-transporting ligand has the structure of formula XIV:

(XIV)

wherein:
R$^{17}$ is a substituted or unsubstituted aryl or heteroaryl group.

In some embodiments, in the structure of formula XIV, R$^{17}$ is an unsubstituted phenyl group. In some embodiments, in the structure of formula XIV, R$^{17}$ is a substituted phenyl group. In some embodiments, R$^{17}$ is substituted with carboxy, C$_{1-10}$ alkyl, C$_{1-10}$ alkoxy, C$_{1-10}$ haloalkyl, halogen, C$_{1-10}$ alkylamino, or cycloalkyl.

In some embodiments, where R$^{12}$ is hydrogen in the structure of formula X, the electron-transporting ligand has the structure of formula XV:

(XV)

wherein:
R$^{18}$ is a substituted or unsubstituted aryl or heteroaryl group.

In some embodiments, in the structure of formula XV, R$^{18}$ is an unsubstituted phenyl group. In some embodiments, in the structure of formula XV, R$^{18}$ is a substituted phenyl group. In some embodiments, R$^{18}$ is substituted with carboxy, C$_{1-10}$ alkyl, C$_{1-10}$ alkoxy, C$_{1-10}$ haloalkyl, halogen, C$_{1-10}$ alkylamino, or cycloalkyl. In some embodiments, R$^{18}$ is substituted with C$_{1-10}$ alkyl.

In some embodiments, where R$^{12}$ is hydrogen in the structure of formula X, the electron-transporting ligand has the structure of formula XVI:

(XVI)

wherein:
R$^{19}$ is a substituted or unsubstituted aryl or heteroaryl group; and
R$^{20}$ is a substituted or unsubstituted aryl or heteroaryl group.

In some embodiments, $R^{19}$ is substituted with carboxy, $C_{1-10}$ alkyl, $C_{1-10}$ alkoxy, $C_{1-10}$ haloalkyl, halogen, $C_{1-10}$ alkylamino, or cycloalkyl. In some embodiments, $R^{19}$ is substituted with $C_{1-10}$ alkyl.

In some embodiments, $R^{20}$ is substituted with carboxy, $C_{1-10}$ alkyl, $C_{1-10}$ alkoxy, $C_{1-10}$ haloalkyl, halogen, $C_{1-10}$ alkylamino, or cycloalkyl. In some embodiments, $R^{20}$ is substituted with $C_{1-10}$ alkyl.

In some embodiments, in the structure of formula XVI, $R^{19}$ and $R^{20}$ are phenyl groups. In some embodiments, in the structure of formula XVI, $R^{19}$ is an unsubstituted phenyl group and $R^{20}$ is a substituted phenyl group, wherein $R^{20}$ is substituted with $C_{1-10}$ alkyl.

In some embodiments, in the structure of formula XVI, $R^{19}$ is a phenyl group and $R^{20}$ is a naphthyl group. In some embodiments, in the structure of formula XVI, $R^{19}$ is a substituted phenyl group and $R^{20}$ is an unsubstituted naphthyl group.

In some embodiments, in the structure of formula XVI, $R^{19}$ is an substituted phenyl group, wherein $R^{19}$ is substituted with $C_{1-10}$ alkyl and $R^{20}$ is an unsubstituted napthyl group.

In some embodiments, where $R^{12}$ is hydrogen in the structure of formula X, the electron-transporting ligand has the structure of formula XVII:

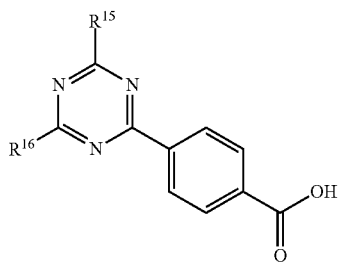

(XVII)

wherein:
  $R^{15}$ is a substituted or unsubstituted aryl or heteroaryl group; and
  $R^{16}$ is a substituted or unsubstituted aryl or heteroaryl group.

In some embodiments, $R^{15}$ is substituted with carboxy, $C_{1-10}$ alkyl, $C_{1-10}$ alkoxy, $C_{1-10}$ haloalkyl, halogen, $C_{1-10}$ alkylamino, or cycloalkyl. In some embodiments, $R^{15}$ is substituted with $C_{1-10}$ alkyl.

In some embodiments, $R^{16}$ is substituted with carboxy, $C_{1-10}$ alkyl, $C_{1-10}$ alkoxy, $C_{1-10}$ haloalkyl, halogen, $C_{1-10}$ alkylamino, or cycloalkyl. In some embodiments, $R^{16}$ is substituted with $C_{1-10}$ alkyl.

In some embodiments, in the structure of formula XVII, $R^{15}$ and $R^{16}$ are phenyl groups. In some embodiments, in the structure of formula XVII, $R^{15}$ and $R^{16}$ are unsubstituted phenyl groups.

In some embodiments, in the structure of formula X, the electron-transporting ligand has the structure of formula XVIII:

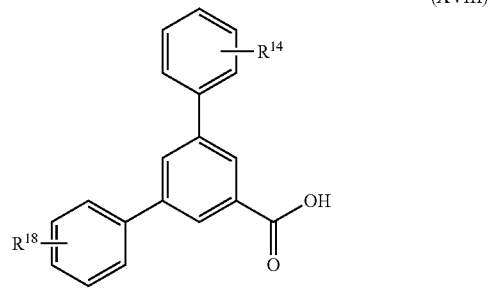

(XVIII)

wherein:
  $R^{14}$ is a substituted or unsubstituted aryl or heteroaryl group; and
  $R^{18}$ is a substituted or unsubstituted aryl or heteroaryl group.

In some embodiments, $R^{14}$ is substituted with carboxy, $C_{1-10}$ alkyl, $C_{1-10}$ alkoxy, $C_{1-10}$ haloalkyl, halogen, $C_{1-10}$ alkylamino, or cycloalkyl. In some embodiments, $R^{14}$ is substituted with $C_{1-10}$ alkyl.

In some embodiments, $R^{18}$ is substituted with carboxy, $C_{1-10}$ alkyl, $C_{1-10}$ alkoxy, $C_{1-10}$ haloalkyl, halogen, $C_{1-10}$ alkylamino, or cycloalkyl. In some embodiments, $R^{18}$ is substituted with $C_{1-10}$ alkyl.

In some embodiments, in the structure of formula XVIII, $R^{14}$ and $R^{18}$ are 1-phenyl-benzimidazole groups. In some embodiments, in the structure of formula XVIII, $R^{14}$ and $R^{18}$ are unsubstituted 1-phenyl-benzimidazole groups.

In some embodiments, the electron-transporting ligand is a compound of TABLE 2.

TABLE 2

| Compound | Structure |
|---|---|
| 36 | ![structure of compound 36: 2-(4-carboxyphenyl)-1-phenyl-benzimidazole] |

TABLE 2-continued

| Compound | Structure |
| --- | --- |
| 37 | 3-(1-phenyl-1H-benzimidazol-2-yl)benzoic acid |
| 38 | 4'-(1-phenyl-1H-benzimidazol-2-yl)-[1,1'-biphenyl]-4-carboxylic acid |
| 39 | 3,5-bis(4-(1-phenyl-1H-benzimidazol-2-yl)phenyl)benzoic acid |
| 40 | 3-(pyridin-3-yl)benzoic acid |
| 41 | 3-(pyridin-4-yl)benzoic acid |
| 42 | 3-(pyridin-2-yl)benzoic acid |

TABLE 2-continued

| Compound | Structure |
|---|---|
| 43 | (2,4-diphenyl-1,3,5-triazin-6-yl)benzoic acid |
| 44 | 4-(pyridin-4-yl)benzoic acid |
| 45 | 4-(pyridin-3-yl)benzoic acid |
| 46 | 4-(pyridin-2-yl)benzoic acid |
| 47 | 4'-(5-(4-(tert-butyl)phenyl)-1,3,4-oxadiazol-2-yl)-[1,1'-biphenyl]-4-carboxylic acid |
| 48 | 4'-(5-(4-(tert-butyl)phenyl)-4-phenyl-4H-1,2,4-triazol-3-yl)-[1,1'-biphenyl]-4-carboxylic acid |
| 49 | 4'-(5-(4-(tert-butyl)phenyl)-4-(naphthalen-2-yl)-4H-1,2,4-triazol-3-yl)-[1,1'-biphenyl]-4-carboxylic acid |

TABLE 2-continued

| Compound | Structure |
|---|---|
| 50 | 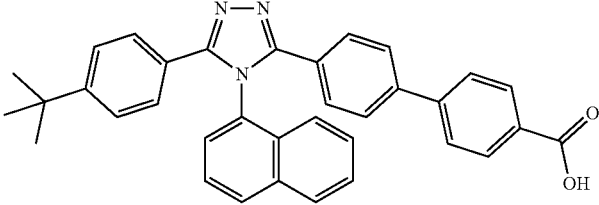 [SMILES: CC(C)(C)c1ccc(-c2nnc(-c3ccc(-c4ccc(C(=O)O)cc4)cc3)n2-c2cccc3ccccc23)cc1] |

In some embodiments, the electron-transporting ligand is commercially available. In some embodiments, the electron-transporting ligand is prepared using methods known to one of ordinary skill in the art. See Debeaux, M., et al., *Adv. Funct. Mater.* 20:399-408 (2010).

Ligand Exchange

In some embodiments, the present invention is directed to a method for exchanging ligands on nanostructures. In some embodiments, a first ligand on a nanostructure dot is exchanged with at least one charge-transporting ligand. At least one functional group of the charge-transporting ligand displaces the native hydrophobic ligands of the nanostructure and affords a stable anchoring of the ligand onto the nanocrystal surface. In some embodiments, the nanostructure is a quantum dot. In some embodiments, the at least one charge-transporting ligand is a hole-transporting ligand. In some embodiments, the at least one charge-transporting ligand is an electron-transporting ligand. In some embodiments, the at least one charge-transporting ligand is a mixture of a hole-transporting ligand and an electron-transporting ligand.

In some embodiments, the present disclosure is directed to a method of replacing a first ligand on a nanostructure with a second ligand. In some embodiments, the second ligand is a charge-transporting ligand. In some embodiments, the nanostructure is a quantum dot.

In some embodiments, the present disclosure is directed to a method of replacing a first ligand on a nanostructure with a second ligand comprising:
    admixing a reaction mixture comprising a population of nanostructures having the first ligand bound to the nanostructure and at least one charge-transporting ligand which is the second ligand, such that the second ligand displaces the first ligand and becomes bound to the nanostructure.

In some embodiments, the admixed reaction mixture is substantially free of solvent. In some embodiments, the admixed reaction mixture is free of a solvent. As used herein, the term "substantially free of solvent" is intended that the admixed reaction mixture contains less than 2% by weight of solvent. In some embodiments, the admixed reaction mixture contains by weight less than 1%, less than 0.5%, or less than 0.1% of a solvent. Solvent ligand replacement may be carried out when the second ligand is a charge-transporting ligand and wherein the charge-transporting ligand has a $T_g$ of less than 100° C. and a viscosity of less than about 1000 cSt (see U.S. Pat. No. 9,005,480, which is incorporated herein by reference in its entirety).

In some embodiments, the nanostructure is a quantum dot.

In some embodiments, the first ligand is bound covalently to the nanostructure. In some embodiments, the first ligand is bound non-covalently to the nanostructure.

In some embodiments, the second ligand becomes covalently bound to the nanostructure. In some embodiments, the second ligand becomes non-covalently bound to the nanostructure.

In some embodiments, the admixing is performed at a temperature between about 0° C. and about 200° C., about 0° C. and about 150° C., about 0° C. and about 100° C., about 0° C. and about 80° C., about 20° C. and about 200° C., about 20° C. and about 150° C., about 20° C. and about 100° C., about 20° C. and about 80° C., about 50° C. and about 200° C., about 50° C. and about 150° C., about 50° C. and about 100° C., about 50° C. and about 80° C., about 80° C. and about 200° C., about 80° C. and about 150° C., about 80° C. and about 100° C., about 100° C. and about 200° C., about 100° C. and about 150° C., or about 150° C. and about 200° C. in some embodiments, the admixing is performed at a temperature between about 50° C. and about 100° C. In some embodiments, the admixing is performed at a temperature of about 80° C.

In some embodiments, the admixing is performed over a period of about 1 minute and about 6 hours, about 1 minute and about 2 hours, about 1 minute and about 1 hour, about 1 minute and about 40 minutes, about 1 minute and about 30 minutes, about 1 minute and about 20 minutes, about 1 minute and about 10 minutes, about 10 minutes and about 6 hours, about 10 minutes and about 2 hours, about 10 minutes and about 1 hour, about 10 minutes and about 40 minutes, about 10 minutes and about 30 minutes, about 10 minutes and about 20 minutes, about 20 minutes and about 6 hours, about 20 minutes and about 2 hours, about 20 minutes and about 1 hour, about 20 minutes and about 40 minutes, about 20 minutes and about 30 minutes, about 30 minutes and about 6 hours, about 30 minutes and about 2 hours, about 30 minutes and about 1 hour, about 30 minutes and about 40 minutes, about 40 minutes and about 6 hours, about 40 minutes and about 2 hours, about 40 minutes and about 1 hour, about 1 hour and about 6 hours, about 1 hour and about 2 hours, or about 2 hours and about 6 hours. In some embodiments, the admixing is performed over a period of about 40 minutes and about 2 hours. In some embodiments, the admixing is performed over a period of about 1 hour.

In some embodiments, the reaction mixture further comprises a solvent. In some embodiments, the solvent is selected from the group consisting of chloroform, acetone, butanone, tetrahydrofuran, 2-methyltetrahydrofuran, ethylene glycol monoethyl ether, ethylene glycol monopropyl ether, ethylene glycol monobutyl ether, diethylene glycol diethyl ether, methyl isobutyl ketone, monomethyl ether glycol ester, gamma-butyrolactone, methylacetic-3-ethyl ether, butyl carbitol, butyl carbitol acetate, propanediol monomethyl ether, propanediol monomethyl ether acetate, cyclohexane, toluene, xylene, isopropyl alcohol, and combinations thereof. In some embodiments, the solvent is toluene.

The percentage of first ligands displaced by charge-transporting ligand can be measured by $^1$H NMR or Fourier-transform infrared spectroscopy (FTIR). In some embodiments, the mole percentage of first ligands displaced by the charge-transporting ligand is between about 20% and about 100%, about 20% and about 80%, about 20% and about 60%, about 20% and about 40%, about 25% and about 100%, about 25% and about 80%, about 25% and about 60%, about 25% and about 40%, about 30% and about 100%, about 30% and about 80%, about 30% and about 60%, about 30% and about 40%, about 40% and about 100%, about 40% and about 80%, about 40% and about 60%, about 60% and about 100%, about 60% and about 80%, or about 80% and about 100%.

The percentage of charge-transporting ligands that are bound to a nanostructure in a population of nanostructures can be measured by $^1$H NMR, wherein the bound ligands are calculated using: (bound charge-transporting ligands)/(bound+free charge-transporting ligands).

In some embodiments, the mole percentage of charge-transporting ligands bound to a nanostructures is between about 20% and about 100% is between about 20% and about 100%, about 20% and about 80%, about 20% and about 60%, about 20% and about 40%, about 25% and about 100%, about 25% and about 80%, about 25% and about 60%, about 25% and about 40%, about 30% and about 100%, about 30% and about 80%, about 30% and about 60%, about 30% and about 40%, about 40% and about 100%, about 40% and about 80%, about 40% and about 60%, about 60% and about 100%, about 60% and about 80%, or about 80% and about 100%.

Illumination Devices

In some embodiments, the nanostructure composition is used to form the emitting layer of an illumination device. The illumination device may be used in a wide variety of applications, such as flexible electronics, touchscreens, monitors, televisions, cellphones, and any other high definition displays. In some embodiments, the illumination device is a light emitting diode. In some embodiments, the illumination device is a quantum dot light emitting diode (QLED). An example of a QLED is disclosed in U.S. patent application Ser. No. 15/824,701, which is incorporated herein by reference in its entirety.

In some embodiments, the present disclosure provides a light emitting diode comprising:
 (a) a first conductive layer;
 (b) a second conductive layer; and
 (c) an emitting layer between the first conductive layer and the second conductive layer, wherein the emitting layer comprises at least one population of nanostructures comprising a charge-transporting ligand bound to the nanostructures.

In some embodiments, the charge-transporting ligand is a hole-transporting ligand. In some embodiments, the charge-transporting ligand is an electron-transporting ligand. In some embodiments, the nanostructures comprise a combination of a hole-transporting ligand and an electron-transporting ligand.

In some embodiments, the light emitting diode comprises a first conductive layer, a second conductive layer, and an emitting layer, wherein the emitting layer is arranged between the first conductive layer and the second conductive layer. In some embodiments, the emitting layer is a thin film.

In some embodiments, the light emitting diode comprises additional layers between the first conductive layer and the second conductive layer such as a hole injection layer, a hole transport layer, and an electron transport layer. In some embodiments, the hole injection layer, the hole transport layer, and the electron transport layer are thin films. In some embodiments, the layers are stacked on a substrate.

When voltage is applied to the first conductive layer and the second conductive layer, holes injected at the first conductive layer move to the emitting layer via the hole injection layer and/or the hole transport layer, and electrons injected from the second conductive layer move to the emitting layer via the electron transport layer. The holes and electrons recombine in the emitting layer to generate excitons.

Substrate

The substrate may be any substrate that is commonly used in the manufacture of light emitting diodes. In some embodiments, the substrate is a transparent substrate, such as glass. In some embodiments, the substrate is a flexible material such as polyimide, or a flexible and transparent material such as polyethylene terephthalate. In some embodiments, the substrate has a thickness of about 0.1 mm to 2 mm. In some embodiments, the substrate is a glass substrate, a plastic substrate, a metal substrate, or a silicon substrate.

First Conductive Layer

In some embodiments, a first conductive layer is disposed on the substrate. In some embodiments, the first conductive layer is a stack of conductive layers. In some embodiments, the first conductive layer has a thickness between about 50 nm and about 250 nm. In some embodiments, the first conductive layer is deposited as a thin film using any known deposition technique, such as, for example, sputtering or electron-beam evaporation. In some embodiments, the first conductive layer comprises indium tin oxide (ITO), indium zinc oxide (IZO), tin dioxide ($SnO_2$), zinc oxide (ZnO), magnesium (Mg), aluminum (Al), aluminum-lithium (Al—Li), calcium (Ca), magnesium-indium (Mg—In), magnesium-silver (Mg—Ag), silver (Ag), gold (Au), or mixtures thereof. In some embodiments, the first conductive layer is an anode.

Second Conductive Layer

In some embodiments, the total layer structure may be sandwiched between a first conductive layer and a second conductive layer. In some embodiments, the first conductive layer acts as the anode of the device while second conductive layer acts as the cathode of the device. In some embodiments, the second conductive layer is a metal, such as aluminum. In some embodiments, the second conductive layer has a thickness between about 100 nm and about 150 nm. In some embodiments, the second conductive layer represents a stack of conductive layers. For example, a second conductive layer may include a layer of silver sandwiched between two layers of ITO (ITO/Ag/ITO).

In some embodiments, the second conductive layer comprises indium tin oxide (ITO), an alloy of indium oxide and zinc (IZO), titanium dioxide, tin oxide, zinc sulfide, silver (Ag), or mixtures thereof.

Semiconductor Polymer Layer

In some embodiments, the light emitting diode further comprises a semiconductor polymer layer. In some embodiments, the semiconductor polymer layer acts as a hole injection layer. In some embodiments, the semiconductor polymer layer is deposited on the first conductive layer. In some embodiments, the semiconductor polymer layer is deposited by vacuum deposition, spin-coating, printing, casting, slot-die coating, or Langmuir-Blodgett (LB) deposition. In some embodiments, the semiconductor polymer layer has a thickness between about 20 nm and about 60 nm.

In some embodiments, the semiconductor polymer layer comprises copper phthalocyanine, 4,4',4"-tris[(3-methylphenyl)phenylamino] triphenylamine (m-MTDATA), 4,4',4"-tris(diphenylamino) triphenylamine (TDATA), 4,4',4"-tris[2-naphthyl(phenyl)amino]triphenylamine (2T-NATA), polyaniline/dodecylbenzenesulfonic acid, poly(3,4-ethylenedioxythiophene)/polystyrene sulfonate) (PEDOT/PSS), polyaniline/camphor sulfonic acid, or polyaniline/poly(4-styrenesulfonate).

First Transport Layer

In some embodiments, the light emitting diode further comprises transport layers to facilitate the transport of electrons and holes affected by the generated electric field between the first conductive layer and the second conductive layer. In some embodiments, the light emitting diode further comprises a first transport layer associated with the first conductive layer. In some embodiments, the first transport layer acts as a hole transport layer (and an electron and/or exciton blocking layer). In some embodiments, the first transport layer is deposited on the first conductive layer. In some embodiments, the first transport layer is deposited on the semiconductor polymer layer. In some embodiments, the first transport layer has a thickness between about 20 nm and about 50 nm. In some embodiments, the first transport layer is substantially transparent to visible light.

In some embodiments, the first transport layer comprises a material selected from the group consisting of an amine, a triarylamine, a thiophene, a carbazole, a phthalocyanine, a porphyrin, or a mixture thereof. In some embodiments, the first transport layer comprises N,N'-di(naphthalen-1-yl)-N,N'-bis(4-vinylphenyl)-4,4'-diamine, poly [(9,9-dioctylfluorenyl-2,7-diyl)-co-(4,4'-(N-(4-sec-butylphenyl))diphenylamine)], or poly(9-vinylcarbazole).

Second Transport Layer

In some embodiments, the light emitting diode further comprises a second transport layer. In some embodiments, the second transport layer acts as an electron transport layer (and a hole and/or exciton blocking layer). In some embodiments, the second transport layer contacts the emitting layer. In some embodiments, the second transport layer is arranged between the emitting layer and the second conductive layer. In some embodiments, the second transport layer has a thickness between about 20 nm and about 50 nm. In some embodiments, the second transport layer is substantially transparent to visible light.

In some embodiments, the second transport layer comprises a material selected from the group consisting of an imidazole, a pyridine, a pyrimidine, a pyridazine, a pyraxine, an oxadiazole, a chinoline, a chinoxaline, an anthracene, a benzanthracene, a pyrene, a perylene, a benzimidazole, a triazine, a ketone, a phosphinoxide, a phenazine, a phenanthroline, a triarylborane, a metal oxide, and combinations thereof. In some embodiments, the second transport layer comprises 1,3-bis(3,5-dipyrid-3-ylphenyl)benzene (B3PyPB), bathocuproine, bathophenanthroline, 3-(biphenyl-4-yl)-5-(4-tert-butylphenyl)-4-phenyl-4H-1,2,4-triazole, 2-(4-biphenylyl)-5-phenyl-1,3,4-oxadiazole, 3,5-bis(4-tert-butylphenyl)-4-phenyl-4H-1,2,4-triazole, bis(8-hydroxy-2-methylquinoline)-(4-phenylphenoxy)aluminum, 2,5-bis(1-naphthyl)-1,3,4-oxadiazole, 3,5-diphenyl-4-(1-naphthyl)-1H-1,2,4-triazole, 1,3,5-tri(m-pyridin-3-ylphenyl)benzene (TmPyPB), 2,2',2"-(1,3,5-benzinetriyl)-tris(1-phenyl-1-H-benzimidazole) (TPBi), tris-(8-hydroxyquinoline)aluminum, TiO$_2$, ZnO, SnO$_2$, SiO$_2$, ZrO$_2$, or ZnMgO. In some embodiments, the second transport layer comprises ZnMgO.

The roles of the first transport layer and the second transport layer are reversed when the polarity of the first conductive layer and the second conductive layer are reversed.

Emitting Layer

Sandwiched between the first transport layer and the second transport layer is an emitting layer that comprises at least one population of nanostructures comprising a charge-transporting ligand bound to the nanostructures. The emitting layer may be formed by depositing an admixture of at least one population of nanostructures comprising a charge-transporting ligand bound to the nanostructures and a solvent and allowing the solvent to evaporate. In some embodiments, the solvent evaporates at room temperature. In some embodiments, heat is applied to the deposited film to hasten the evaporation of the solvent. In some embodiments, the admixture of nanostructures and solvent is deposited using a spin-coating technique. In some embodiments, the thickness of the emitting layer is between about 10 nm and about 50 nm.

EXAMPLES

The following examples are illustrative and non-limiting, of the products and methods described herein. Suitable modifications and adaptations of the variety of conditions, formulations, and other parameters normally encountered in the field and which are obvious to those skilled in the art in view of this disclosure are within the spirit and scope of the invention.

Example 1

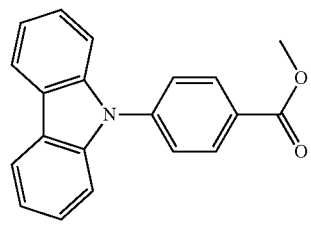 [SMILES: COC(=O)c1ccc(-n2c3ccccc3c3ccccc32)cc1]

Synthesis of 4-(carbazol-9-yl)benzoic acid methyl ester

Carbazole (3.68 g, 22 mmol), 4-iodobenzoic acid methyl ester (5.24 g, 20 mmol), potassium carbonate (3.04 g, 22 mmol), and copper powder (100 mg) were weighed into a flask and suspended in xylenes (8 mL). This mixture was refluxed at 170° C. for 2 hours under vigorous stirring. After addition of toluene (50 mL) the reaction mixture was refluxed at 110° C. for 1 hour and then allowed to cool to room temperature. The solids were removed by filtration. The solvents were removed from the filtrate under vacuum, and the brown residue was recrystallized from methanol yielding white needle-shaped crystals (2.26 g, 37.5% yield).

Example 2

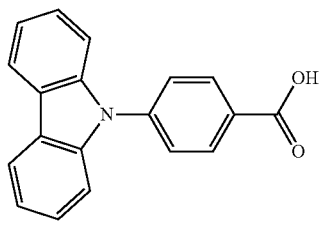 [SMILES: O=C(O)c1ccc(-n2c3ccccc3c3ccccc32)cc1]

Synthesis of 4-(carbazol-9-yl)benzoic acid
(Compound 1)

4-(Carbazol-9-yl)benzoic acid methyl ester (2 g, 6.6 mmol) was dissolved in 50 mL of a THF/ethanol mixture (1:1 by volume). To this a solution of sodium hydroxide in deionized water (40 mL, 1 M) was added. The combined solution was stirred for 20 hours at room temperature. The reaction mixture was acidified with 1 M HCl to pH=2 and the volatile solvents were removed under vacuum. The residue was taken up in dichloromethane, this mixture was washed with saturated aqueous NaCl, dried over $MgSO_4$, filtered, and evaporated to dryness under vacuum. The slightly yellow residue was recrystallized from toluene resulting in white solids (1.33 g, 69% yield).

Example 3

Ligand Exchange Procedure for Hole-Transporting Ligands

The synthesis of quantum dots has been described in U.S. Patent Application Publication Nos. 2017/0066965 and 2017/0306227. The quantum dots were purified twice by precipitation with ethanol and redispersed in tetrahydrofuran at a concentration of 18 mg/mL. The hole transporting ligand, such as 4-(carbazol-9-yl)benzoic acid, was added to the solution as a solid in an amount that corresponds to five equivalents of the number of quantum dot surface zinc atoms. For example, 55 mg of 4-(carbazol-9-yl)benzoic acid was added to 18 mg of green-emitting InP/ZnSe/ZnS quantum dots with 5.5 nm particle diameter, or 69 mg of this ligand were added to 36 mg of blue-emitting ZnSe/ZnS quantum dots with 10 nm particle diameter. The solution was stirred at 70° C. for 30 minutes. The quantum dots were precipitated with hexane, then redispersed in THF, precipitated with hexane again, and finally redispersed in toluene, filtered, and adjusted to the desired concentration for device fabrication. The FTIR spectra indicate a degree of exchange of about 50 mol % based on the decrease in alkyl to carbonyl ratio compared to unexchanged quantum dots with native fatty acid ligands.

Example 4

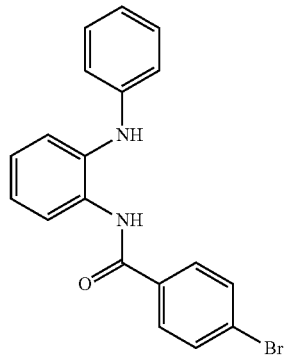 [SMILES: O=C(Nc1ccccc1Nc1ccccc1)c1ccc(Br)cc1]

Synthesis of 4-bromo-N-[2-(phenylamino)phenyl] benzamide

4-Bromobenzoyl chloride (25 g, 114 mmol) was dissolved in N,N-dimethylacetamide (150 mL). N-phenyl-1,2-phenylenediamine (21 g, 114 mmol) was added and the resulting mixture was stirred for 1.5 h at room temperature and then poured on water. The precipitate was filtered off and recrystallized from DMF/water.

Example 5

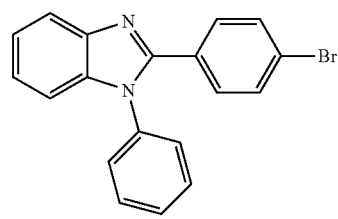 [SMILES: Brc1ccc(-c2nc3ccccc3n2-c2ccccc2)cc1]

Synthesis of 2-(4-bromophenyl)-1-phenyl-1H-benzo[d]imidazole

4-Bromo-N-[2-(phenylamino)phenyl]benzamide (35 g, 95 mmol) was refluxed in acetic acid (100 mL) for 16 h. After cooling to room temperature the reaction mixture was poured on water. The solids were filtered off and recrystallized from ethanol.

Example 6

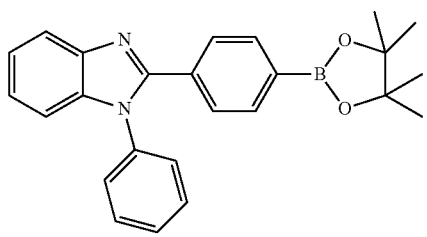 [SMILES: CC1(C)OB(c2ccc(-c3nc4ccccc4n3-c3ccccc3)cc2)OC1(C)C]

Synthesis of 1-phenyl-2-[4-(4,4,5,5-tetramethyl-[1,3,2]dioxaborolan-2-yl)phenyl]-1H-benzo[d]imidazole 2-(4-Bromophenyl)-1-phenyl-1H-benzo[d]imidazole (10 g, 28.7 mmol) was dissolved in THF and cooled to −78° C. At this temperature n-butyllithium (15.0 mL, 37.5 mmol, 2.5 M in hexane) was added dropwise over 1 h and the mixture was stirred for another 2 h at −78° C. 2-Isopropoxy-4,4,5,5-tetramethyl-1,3,2-dioxaborolane (17.6 mL, 86.1 mmol) was then added dropwise over 2 h. The reaction mixture was allowed to warm up to room temperature and stirred overnight. The reaction mixture was acidified with HCl (2 M, 120 mL) and stirred for 5 h, before being neutralized with sodium carbonate. The product was extracted with diethyl ether, washed with water, dried over $Na_2SO_4$, evaporated to dryness, and recrystallized from ethanol.

Example 7

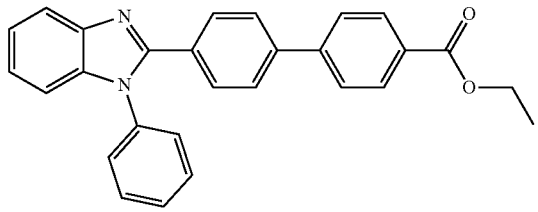 [SMILES: CCOC(=O)c1ccc(-c2ccc(-c3nc4ccccc4n3-c3ccccc3)cc2)cc1]

Synthesis of 4-[4-phenyl(1-phenylbenzimidazol-2-yl)]benzoic acid ethyl ester

Ethyl 4-bromobenzoate (3.57 g, 15.6 mmol), 1-phenyl-2-[4-(4,4,5,5-tetramethyl-[1,3,2]dioxaborolan-2-yl)phenyl]-1H-benzo[d]imidazole (5.63 g, 14.2 mmol), tetrakis(triphenylphosphine)palladium(0) (373 mg, 0.323 mmol) and sodium carbonate (32 mL, 2 M in water, degassed by bubbling with nitrogen) were dissolved in THF (80 mL). This solution was stirred at reflux temperature overnight. Saturated aqueous $NH_4Cl$ (200 mL) was added and the product was extracted with chloroform, dried over $MgSO_4$, and the solvents were removed under vacuum. The residue was purified by column chromatography (dichloromethane/ethyl acetate).

Example 8

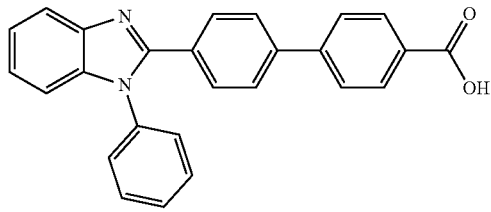 [SMILES: O=C(O)c1ccc(-c2ccc(-c3nc4ccccc4n3-c3ccccc3)cc2)cc1]

Synthesis of 4-[4-phenyl(1-phenylbenzimidazol-2-yl)]benzoic acid (Compound 38)

4-[4-Phenyl(1-phenylbenzimidazol-2-yl)]benzoic acid ethyl ester (4.18 g, 10 mmol) was dissolved in 100 mL of a THF/ethanol mixture (1:1 by volume). To this a solution of sodium hydroxide in deionized water (80 mL, 1 M) was added. The combined solution was stirred for 20 h at room temperature. The reaction mixture was acidified with 1 M HCl to pH=2 and the volatile solvents were removed under vacuum. The residue was taken up in dichloromethane, this mixture was washed with saturated aqueous NaCl, dried over $MgSO_4$, filtered, and evaporated to dryness under vacuum. The slightly yellow residue was recrystallized from toluene resulting in white solids.

Example 9

Ligand Exchange Procedure for Electron-Transporting Ligands

Quantum dots synthesized according to published procedures (e.g. US Patent Applications 20170066965 and 20170306227) were purified twice by precipitation with ethanol and redispersed in tetrahydrofuran at a concentration of 18 mg/mL. Electron-transporting ligand was added to that solution as a solid in an amount that corresponds to five equivalents of the number of quantum dot surface zinc atoms. For example, 75 mg of 4-[4-phenyl(1-phenylbenzimidazol-2-yl)]benzoic acid were added to 18 mg of green-emitting InP/ZnSe/ZnS quantum dots with 5.5 nm particle diameter, and 94 mg of this ligand were added to 36 mg of blue-emitting ZnSe/ZnS quantum dots with 10 nm particle diameter. The solution was stirred at 70° C. for 30 min. The quantum dots were precipitated with hexane, then redispersed in THF, precipitated with hexane again, and finally redispersed in toluene, filtered and adjusted to the desired concentration for device fabrication.

Example 10

Figure 3:
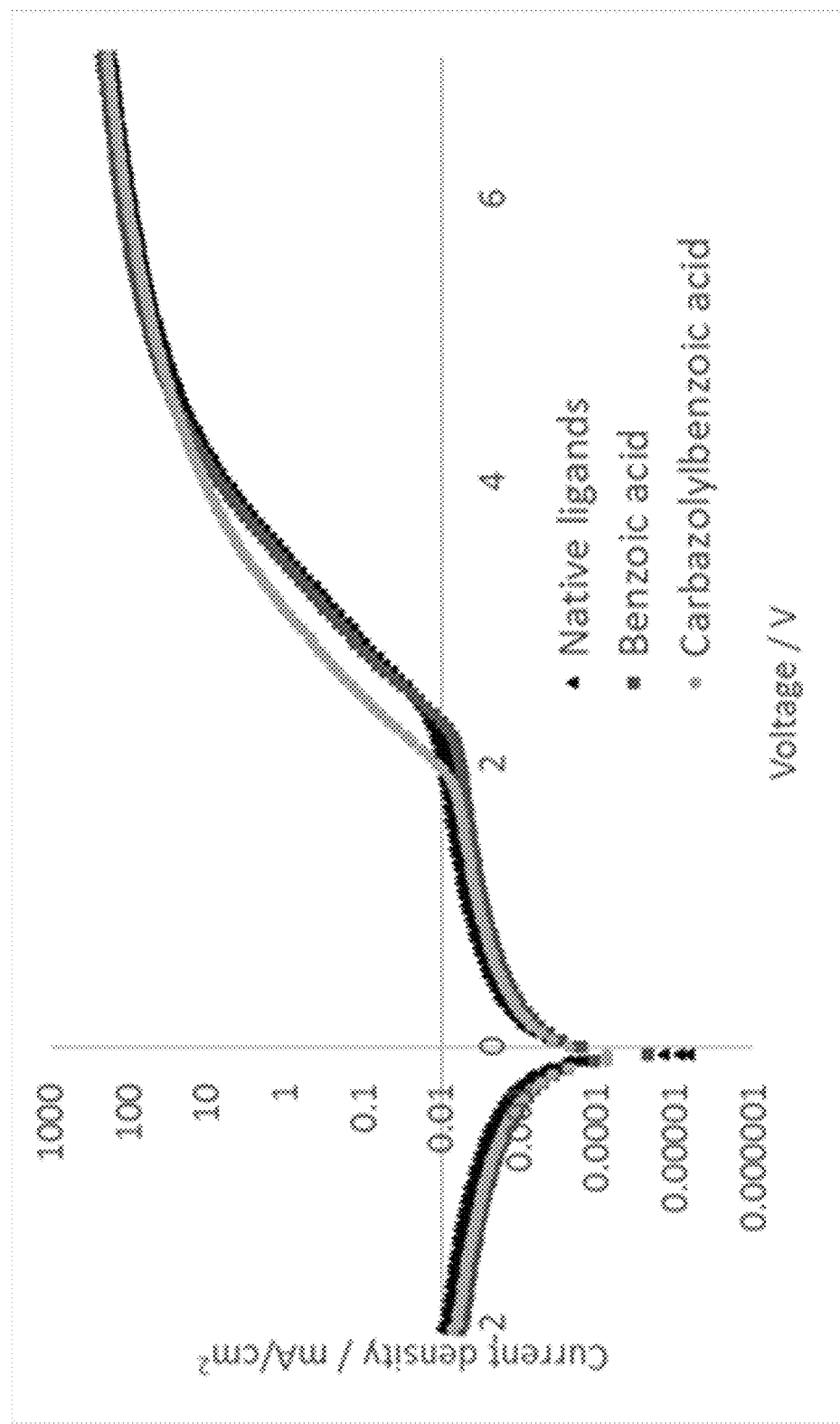
FIG. 3 is a line graph showing current density characteristics of light-emitting devices (ITO/PEDOT:PSS/VNPB/QD/ZnMgO/Al) prepared using ZnSe/ZnS quantum dots with oleate and laurate ligands (native ligands), ZnSe/ZnS quantum dots with benzoic acid ligands (benzoic acid), and ZnSe/ZnS quantum dots with 4-(carbazol-9-yl) benzoic acid ligands (carbazolylbenzoic acid ligands). The quantum dots with 4-(carbazol-9-yl) benzoic acid ligands show a turn-on voltage 0.5 V lower than devices prepared with quantum dots with oleate and laurate ligands or quantum dots with benzoic acid ligands.

The charge transport properties of quantum dots prepared by the method of Example 3 comprising hole-transporting ligands were tested in a light-emitting device comprising: an indium tin oxide (ITO) anode, a poly(3,4-ethylenedioxythiophene):poly(styrene) (PEDOT:PSS) hole injection layer, a N4,N4'-di(naphthalen-1-yl)-N4,N4'-bis(4-vinylphenyl)biphenyl-4,4'-diamine (VNPB) hole transport layer, a quantum dot emissive layer, a ZnMgO electron transport layer, and an Al cathode. Quantum dots comprising hole-transport ligands were also tested in a hole-only device comprising: an indium tin oxide (ITO) anode, a poly(3,4-ethylenedioxythiophene):poly(styrene) (PEDOT:PSS) hole injection layer, a N4,N4'-di(naphthalen-1-yl)-N4,N4'-bis(4-vinylphenyl)biphenyl-4,4'-diamine (VNPB) hole transport layer, a quantum dot emissive layer, a N,N'-bis(naphthalen-1-yl)-N,N'-bis(phenyl)benzidine (NPB) hole transport layer, and an Ag cathode. The current density—voltage characteristics of the full devices (FIG. 3) with complexes of quantum dots with hole-transporting ligands show a turn-on voltage 0.5 V lower than the devices with quantum dots with benzoic acid ligands and with native ligands. This is a clear indication of improved charge transport across the quantum dot film when hole-transporting molecules are bound to the quantum dots.

Figure 4:
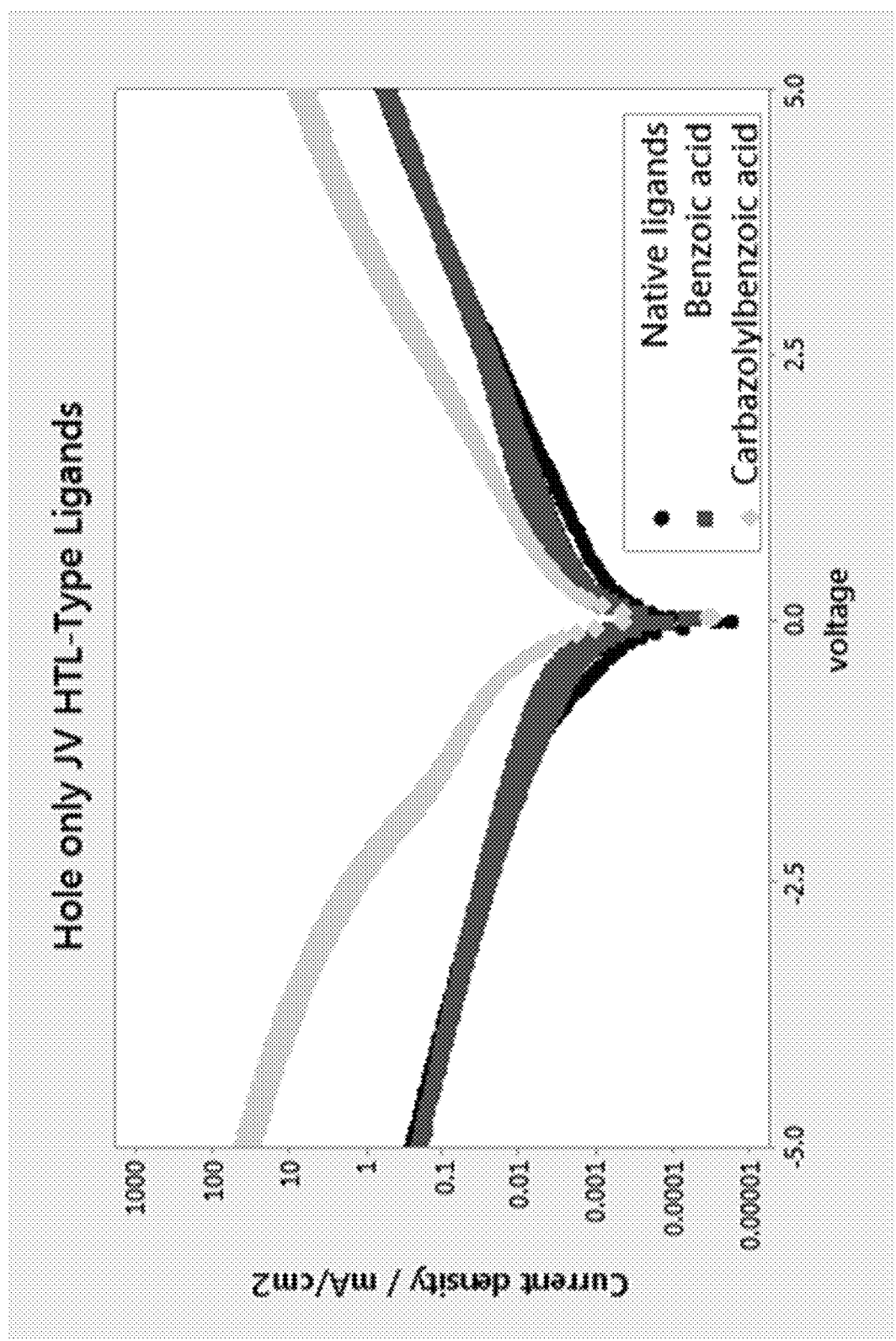
FIG. 4 is a line graph showing current density characteristics of hole-only devices (ITO/PEDOT:PSS/VNPB/QD/NPB/Ag) prepared using ZnSe/ZnS quantum dots with oleate and laurate ligands (native ligands), ZnSe/ZnS quantum dots with benzoic acid ligands (benzoic acid), and ZnSe/ZnS quantum dots with 4-(carbazol-9-yl) benzoic acid ligands (carbazolylbenzoic acid ligands). The current density characteristics were significantly higher for the hole-only devices prepared with the quantum dots having 4-(carbazol-9-yl) benzoic acid ligands.
Figure 5:
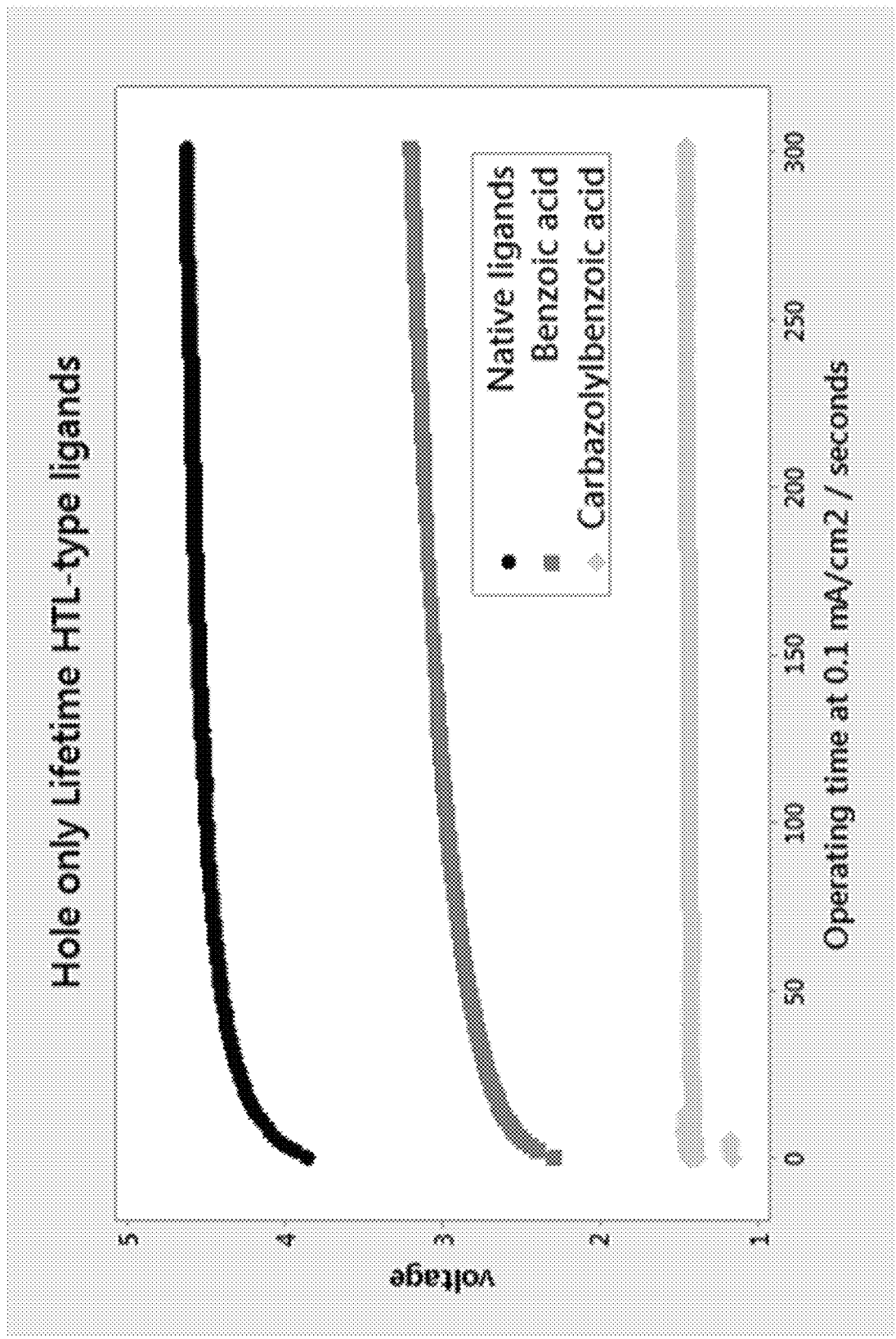
FIG. 5 is a line graph showing voltage stability measurements at constant current for hole-only devices (ITO/PEDOT:PSS/VNPB/QD/NPB/Ag) prepared using ZnSe/ZnS quantum dots with oleate and laurate ligands (native ligands), ZnSe/ZnS quantum dots with benzoic acid ligands (benzoic acid), and ZnSe/ZnS quantum dots with 4-(carbazol-9-yl) benzoic acid ligands (carbazolylbenzoic acid ligands). Hole-only devices prepared with the quantum dots with 4-(carbazol-9-yl) benzoic acid ligands showed more stable voltage over time.

The current density—voltage characteristics of the hole-only devices (FIG. 4) show significantly higher hole current for the complexes of quantum dots with hole-transporting ligands than for quantum dots with benzoic acid and with native ligands. Under continuous operation at constant current hole-only devices (FIG. 5) with quantum dots with hole-transporting ligands show more stable voltage than quantum dots with benzoic acid or with native ligands, for which the voltage rises significantly during this lifetime test. Improved hole transport across the quantum dot layer avoids charge carrier accumulation at the quantum dot-hole transport interface, which is considered to be a main pathway of QLED degradation.

While various embodiments have been described above, it should be understood that they have been presented by way of example only, and not limitation. It will be apparent to persons skilled in the relevant art that various changes in form and detail can be made therein without departing from the spirit and scope of the invention. Thus, the breadth and scope should not be limited by any of the above-described exemplary embodiments, but should be defined only in accordance with the following claims and their equivalents.

All publications, patents and patent applications mentioned in this specification are indicative of the level of skill of those skilled in the art to which this invention pertains, and are herein incorporated by reference to the same extent as if each individual publication, patent or patent application was specifically and individually indicated to be incorporated by reference.

What is claimed is:

1. A nanostructure composition comprising:
(a) at least one population of nanostructures; and
(b) at least one charge-transporting ligand bound to the surface of the nanostructures, the charge-transporting ligand comprising:
(i) a hole-transporting ligand of formula (I)

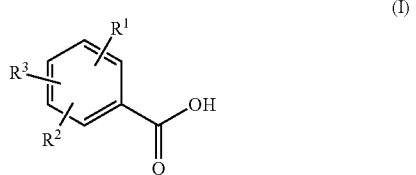
(I)

wherein:
$R^1$ is hydrogen or carboxy;
$R^2$ is

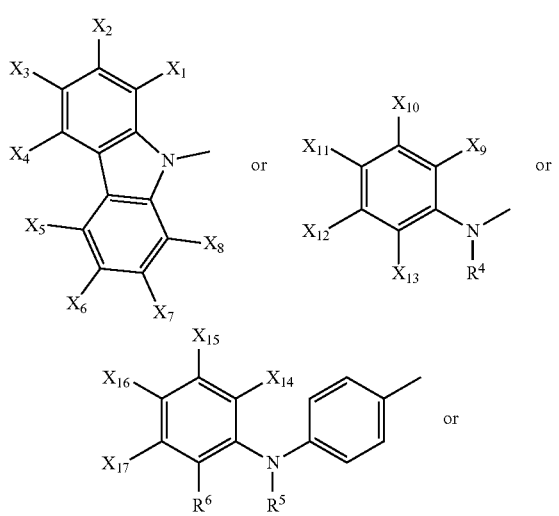

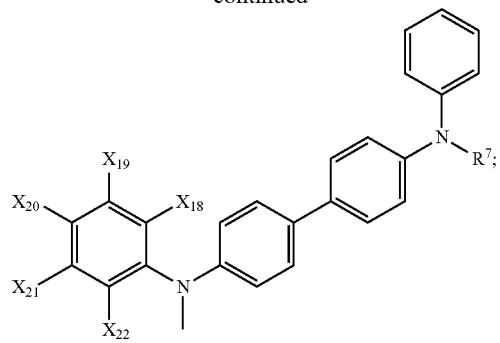

$R^3$ is hydrogen;
$X_1$-$X_8$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
$X_9$-$X_{13}$ independently are hydrogen, carboxy, $C_{1-10}$ alkyl, $C_{1-10}$ alkoxy, haloalkyl, halogen, $C_{1-10}$ alkylamino, or cycloalkyl;
$R^4$ is an unsubstituted or substituted aryl or heteroaryl group;
$X_{14}$-$X_{17}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
$R^5$ is an unsubstituted or substituted aryl or heteroaryl group;
$R^6$ is hydrogen; or
$R^5$ and $R^6$ together form:

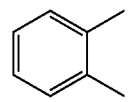

$X_{18}$-$X_{22}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
$R^7$ is an unsubstituted or substituted aryl or heteroaryl group; or
$R^2$ and $R^3$ together form:

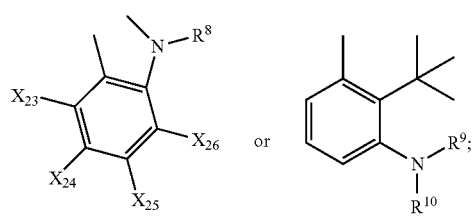

$X_{23}$-$X_{26}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
$R^8$ is an unsubstituted or substituted aryl or heteroaryl group;
$R^9$ is an unsubstituted or substituted aryl or heteroaryl group;
$R^{10}$ is hydrogen or an unsubstituted or substituted aryl or heteroaryl group; or $R^9$ and $R^{10}$ together form:

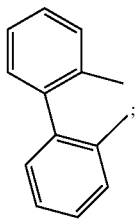

or (ii) an electron-transporting ligand of formula (X)

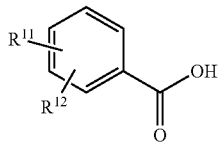
(X)

wherein:
$R^{11}$ is

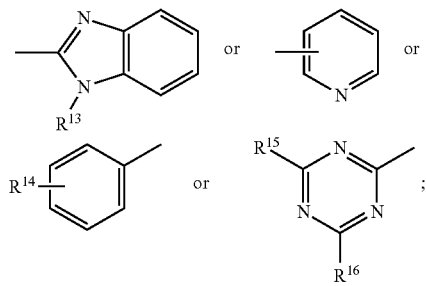

$R^{12}$ is hydrogen or is

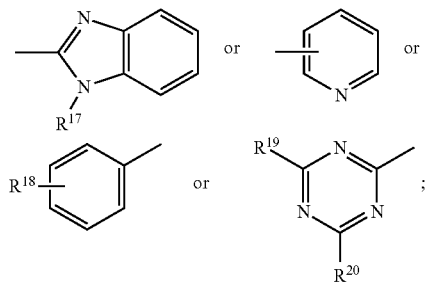

$R^{13}$ and $R^{17}$ independently are a substituted or unsubstituted aryl or heteroaryl group;

$R^{14}$ and $R^{18}$ independently are hydrogen, or

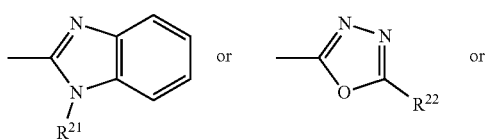

-continued

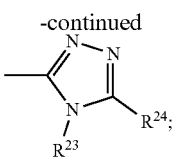

$R^{15}$ and $R^{19}$ independently are a substituted or unsubstituted aryl or heteroaryl group;

$R^{16}$ and $R^{20}$ independently are a substituted or unsubstituted aryl or heteroaryl group;

$R^{21}$ is a substituted or unsubstituted aryl or heteroaryl group;

$R^{22}$ is a substituted or unsubstituted aryl or heteroaryl group;

$R^{23}$ is H or a substituted or unsubstituted aryl or heteroaryl group; and $R^{24}$ is H or a substituted or unsubstituted aryl or heteroaryl group;

or (iii) a combination thereof.

2. The nanostructure composition of claim 1, wherein the nanostructures comprise a core selected from the group consisting of InP, InZnP, InGaP, CdSe, CdS, CdSSe, CdZnSe, CdZnS, ZnSe, ZnTe, ZnSeTe, ZnS, ZnSSe, InAs, InGaAs, and InAsP.

3. The nanostructure composition of claim 1, wherein the nanostructures comprises an InP core, a ZnSe shell, and a ZnS shell.

4. The nanostructure composition of claim 1, wherein the hole-transporting ligand has formula II:

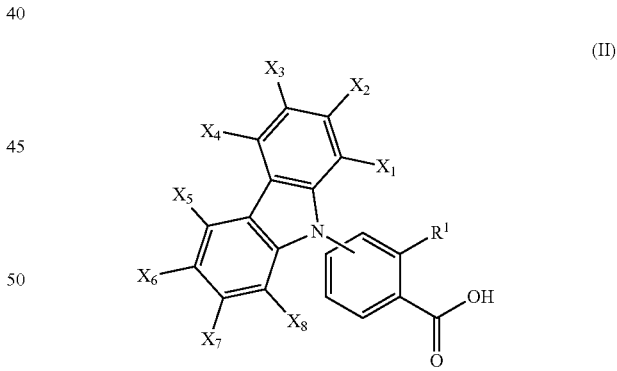
(II)

wherein:
$X_1$-$X_8$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl; and $R^1$ is hydrogen or carboxy.

5. The nanostructure composition of claim 4, wherein $X_1$, $X_2$, $X_4$, $X_5$, $X_7$, and $X_8$ are hydrogen, $X_3$ and $X_6$ independently are hydrogen, methyl, tert-butyl, methoxy, dimethylamino, or trifluoromethyl, and $R^1$ is hydrogen.

6. The nanostructure composition of claim 1, wherein the hole-transporting ligand has the structure of formula III:

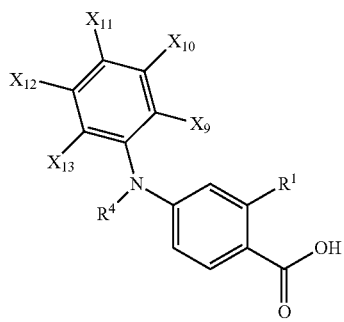

(III)

wherein:

$X_9$-$X_{13}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^1$ is hydrogen or carboxy; and $R^4$ is an unsubstituted or substituted aryl or heteroaryl group.

7. The nanostructure composition of claim 1, wherein the hole-transporting ligand has the structure of formula IV:

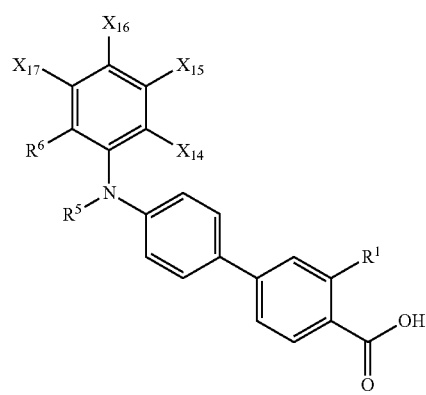

(IV)

wherein:

$X_{14}$-$X_{17}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^1$ is hydrogen or carboxy;

$R^5$ is an unsubstituted or substituted aryl or heteroaryl group; and $R^6$ is hydrogen.

8. The nanostructure composition of claim 1, wherein the hole-transporting ligand has the structure of formula V:

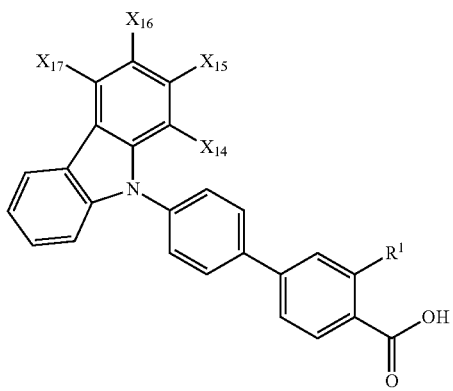

(V)

wherein:

$X_{14}$-$X_{17}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl; and $R^1$ is hydrogen or carboxy.

9. The nanostructure composition of claim 1, wherein the hole-transporting ligand has the structure of formula VI:

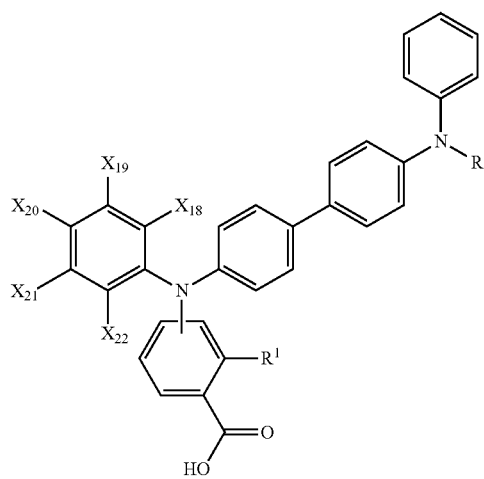

(VI)

wherein:

$X_{18}$-$X_{22}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^1$ is hydrogen or carboxy; and $R^7$ is an unsubstituted or substituted aryl or heteroaryl group.

10. The nanostructure composition of claim 1, wherein the hole-transporting ligand has the structure of formula VII:

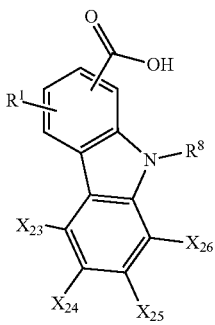

(VII)

wherein:

X$_{23}$-X$_{26}$ independently are hydrogen, carboxy, C$_{1-10}$ alkyl, C$_{1-10}$ alkoxy, C$_{1-10}$ haloalkyl, halogen, C$_{1-10}$ alkylamino, or cycloalkyl;

R$^1$ is hydrogen or carboxy; and

R$^8$ is an unsubstituted or substituted aryl or heteroaryl group.

11. The nanostructure composition of claim 1, wherein the hole-transporting ligand has the structure of formula VIII:

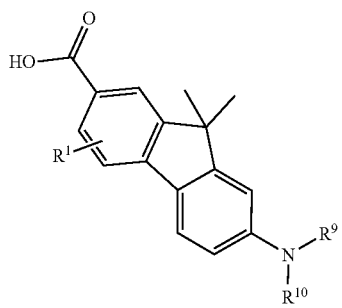

(VIII)

wherein:

R$^1$ is hydrogen or carboxy; and

R$^9$ is an unsubstituted or substituted aryl or heteroaryl group; and

R$^{10}$ is an unsubstituted or substituted aryl or heteroaryl group.

12. The nanostructure composition of claim 1, wherein the hole-transporting ligand has the structure of formula IX:

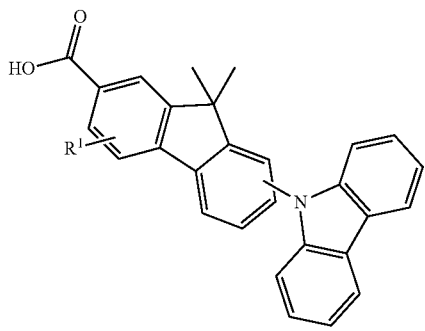

(IX)

wherein:

R$^1$ is hydrogen or carboxy.

13. The nanostructure composition of claim 1, wherein the electron-transporting ligand has the structure of formula XII:

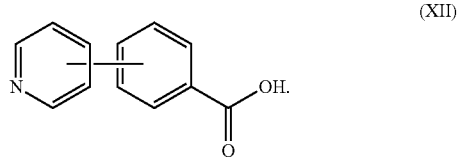

(XII)

14. The nanostructure composition of claim 1, wherein the electron-transporting ligand has the structure of formula XIII:

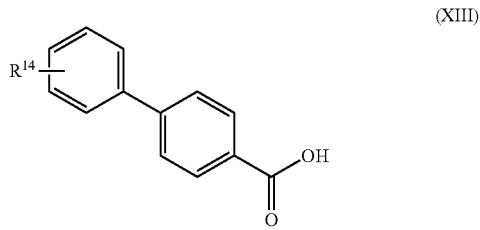

(XIII)

wherein:

R$^{14}$ is a substituted or unsubstituted aryl or heteroaryl group.

15. The nanostructure composition of claim 1, wherein the electron-transporting ligand has the structure of formula XIV:

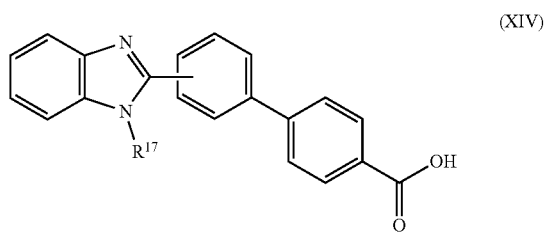

(XIV)

wherein:

R$^{17}$ is a substituted or unsubstituted aryl or heteroaryl group.

16. The nanostructure composition of claim 15, wherein R$^{17}$ is an unsubstituted phenyl group.

17. The nanostructure composition of claim 1, wherein the electron-transporting ligand has the structure of formula XV:

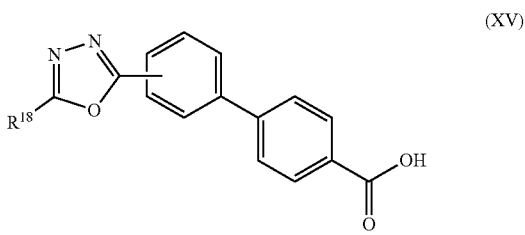

(XV)

wherein:

R[18] is a substituted or unsubstituted aryl or heteroaryl group.

18. The nanostructure composition of claim 1, wherein the electron-transporting ligand has the structure of formula XVI:

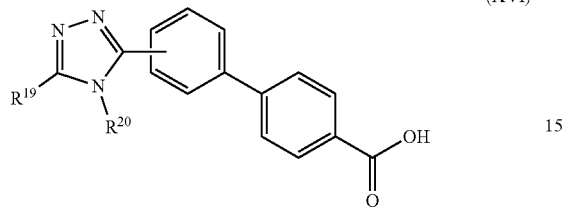

(XVI)

wherein:

R[19] is a substituted or unsubstituted aryl or heteroaryl group; and

R[20] is a substituted or unsubstituted aryl or heteroaryl group.

19. The nanostructure composition of claim 1, wherein the electron-transporting ligand has the structure of formula XVIII:

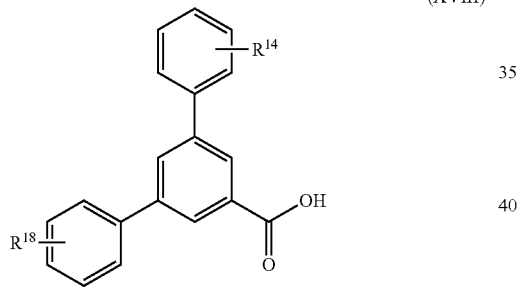

(XVIII)

wherein:

R[14] is a substituted or unsubstituted aryl or heteroaryl group; and

R[15] is a substituted or unsubstituted aryl or heteroaryl group.

20. A nanostructure film layer comprising the nanostructure composition of claim 1.

21. The nanostructure film layer of claim 20, wherein the at least one population of nanostructures comprises a core selected from the group consisting of InP, InZnP, InGaP, CdSe, CdS, CdSSe, CdZnSe, CdZnS, ZnSe, ZnTe, ZnSeTe, ZnS, ZnSSe, InAs, InGaAs, and InAsP.

22. A method of replacing a first ligand on a nanostructure with a second ligand, the method comprising admixing a reaction mixture comprising a population of nanostructures having the first ligand bound to the nanostructure and a charge-transporting ligand which is the second ligand, such that the second ligand displaces the first ligand and becomes bound to the nanostructure, wherein the charge-transporting ligand comprises:

(i) a hole-transporting ligand of formula (I)

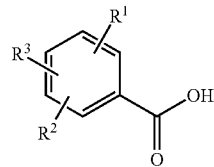

(I)

wherein:

R[1] is hydrogen or carboxy;

R[2] is

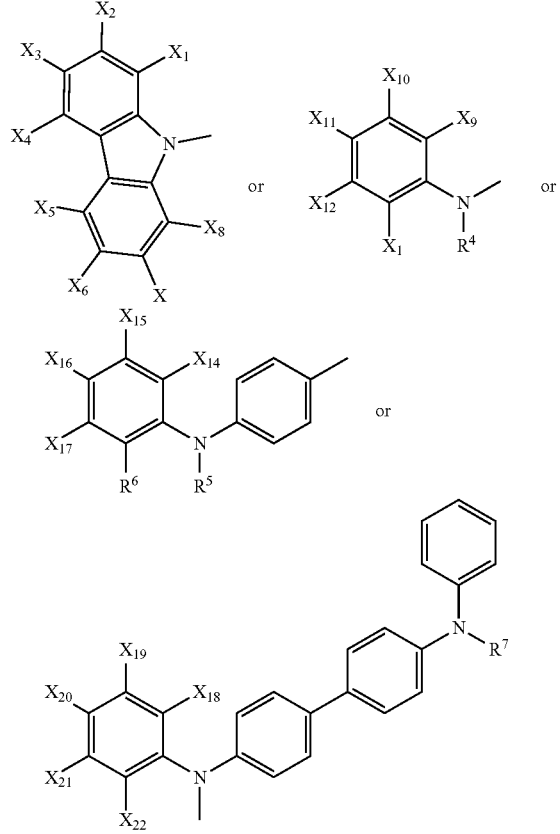

R[3] is hydrogen;

$X_1$-$X_8$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$X_9$-$X_{13}$ independently are hydrogen, carboxy, $C_{1-10}$ alkyl, $C_{1-10}$ alkoxy, haloalkyl, halogen, $C_{1-10}$ alkylamino, or cycloalkyl;

R[4] is an unsubstituted or substituted aryl or heteroaryl group;

$X_{14}$-$X_{17}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

R[5] is an unsubstituted or substituted aryl or heteroaryl group;

R[6] is hydrogen; or $R^5$ and $R^6$ together form:

[structure: ortho-disubstituted benzene]

$X_{18}$-$X_{22}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^7$ is an unsubstituted or substituted aryl or heteroaryl group;

or $R^2$ and $R^3$ together form:

[structures with $X_{23}$-$X_{26}$, $R^8$, $R^9$, $R^{10}$]

$X_{23}$-$X_{26}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;

$R^8$ is an unsubstituted or substituted aryl or heteroaryl group;

$R^9$ is an unsubstituted or substituted aryl or heteroaryl group;

$R^{10}$ is hydrogen or an unsubstituted or substituted aryl or heteroaryl group; or $R^9$ and $R^{10}$ together form:

[biphenyl structure]

or (ii) an electron-transporting ligand of formula (X)

[structure of benzoic acid with $R^{11}$, $R^{12}$ substituents] (X)

wherein:

$R^{11}$ is

[benzimidazole with $R^{13}$] or [pyridine] or

[phenyl with $R^{14}$] or [triazine with $R^{15}$, $R^{16}$];

$R^{12}$ is hydrogen or is

[benzimidazole with $R^{17}$] or [pyridine] or

[phenyl with $R^{18}$] or [triazine with $R^{19}$, $R^{20}$];

$R^{13}$ and $R^{17}$ independently are a substituted or unsubstituted aryl or heteroaryl group;

$R^{14}$ and $R^{18}$ independently are hydrogen, or

[benzimidazole with $R^{21}$] or [oxadiazole with $R^{22}$] or

[triazole with $R^{23}$, $R^{24}$];

$R^{15}$ and $R^{19}$ independently are a substituted or unsubstituted aryl or heteroaryl group;

$R^{16}$ and $R^{20}$ independently are a substituted or unsubstituted aryl or heteroaryl group;

$R^{21}$ is a substituted or unsubstituted aryl or heteroaryl group;

$R^{22}$ is a substituted or unsubstituted aryl or heteroaryl group;

$R^{23}$ is H or a substituted or unsubstituted aryl or heteroaryl group; and $R^{24}$ is H or a substituted or unsubstituted aryl or heteroaryl group;

or (iii) a combination thereof.

23. A light emitting diode comprising:
(a) a first conductive layer;
(b) a second conductive layer; and
(c) an emitting layer between the first conductive layer and the second conductive layer, wherein the emitting layer comprises at least one population of nanostruc tures comprising a charge-transporting ligand bound to the nanostructures, wherein the charge-transporting ligand comprises:

(i) a hole-transporting ligand of formula (I)

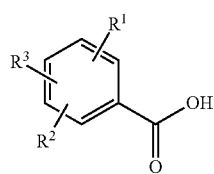

(I)

wherein:
$R^1$ is hydrogen or carboxy;
$R^2$ is

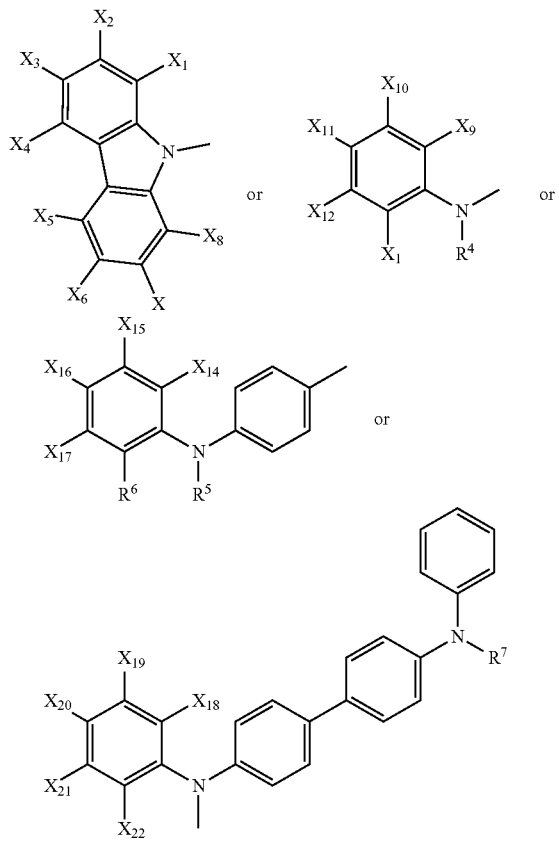

$X_1$-$X_8$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
$X_9$-$X_{13}$ independently are hydrogen, carboxy, $C_{1-10}$ alkyl, $C_{1-10}$ alkoxy, haloalkyl, halogen, $C_{1-10}$ alkylamino, or cycloalkyl;
$R^4$ is an unsubstituted or substituted aryl or heteroaryl group;
$X_{14}$-$X_{17}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
$R^5$ is an unsubstituted or substituted aryl or heteroaryl group;
$R^6$ is hydrogen; or
$R^5$ and $R^6$ together form:

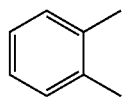

$X_{18}$-$X_{22}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
$R^7$ is an unsubstituted or substituted aryl or heteroaryl group;
or
$R^2$ and $R^3$ together form:

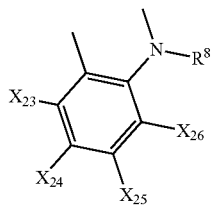 or 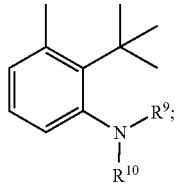

$X_{23}$-$X_{26}$ independently are hydrogen, carboxy, $C_{1-10}$ alkyl, $C_{1-10}$ alkoxy, $C_{1-10}$ haloalkyl, halogen, $C_{1-10}$ alkylamino, or cycloalkyl;
$R^8$ is an unsubstituted or substituted aryl or heteroaryl group;
$R^9$ is an unsubstituted or substituted aryl or heteroaryl group;
$R^{10}$ is hydrogen or an unsubstituted or substituted aryl or heteroaryl group; or
$R^9$ and $R^{10}$ together form:

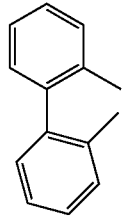

or
(ii) an electron-transporting ligand of formula (X)

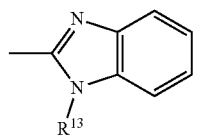

(X)

wherein:

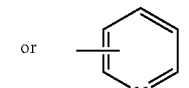 or 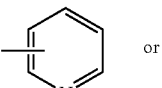 or

-continued

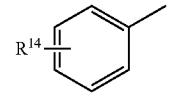 or 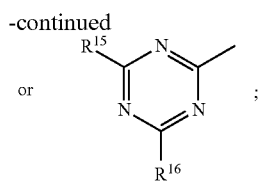 ;

$R^{11}$ is
is hydrogen or is

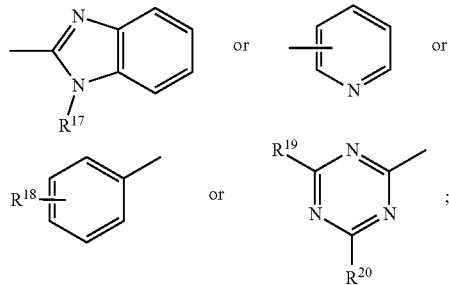

$R^{13}$ and $R^{17}$ independently are a substituted or unsubstituted aryl or heteroaryl group;

$R^{14}$ and $R^{18}$ independently are hydrogen, or

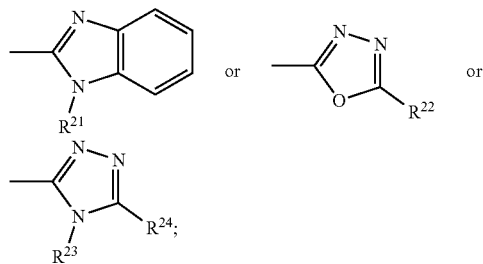

$R^{15}$ and $R^{19}$ independently are a substituted or unsubstituted aryl or heteroaryl group;

$R^{16}$ and $R^{20}$ independently are a substituted or unsubstituted aryl or heteroaryl group;

$R^{21}$ is a substituted or unsubstituted aryl or heteroaryl group;

$R^{22}$ is a substituted or unsubstituted aryl or heteroaryl group;

$R^{23}$ is H or a substituted or unsubstituted aryl or heteroaryl group; and $R^{24}$ is H or a substituted or unsubstituted aryl or heteroaryl group;

or (iii) a combination thereof.

24. The light emitting diode of claim 23, wherein the at least one population of nanostructures comprises a core selected from the group consisting of InP, InZnP, InGaP, CdSe, CdS, CdSSe, CdZnSe, CdZnS, ZnSe, ZnTe, ZnSeTe, ZnS, ZnSSe, InAs, InGaAs, and InAsP.

25. The light emitting diode of claim 23, wherein the first conductive layer comprises indium tin oxide, indium zinc oxide, tin dioxide, zinc oxide, magnesium, aluminum, aluminum-lithium, calcium, magnesium-indium, magnesium-silver, silver, gold, or mixtures thereof.

26. The light emitting diode of claim 23, wherein the second conductive layer comprises indium tin oxide, indium zinc oxide, titanium dioxide, tin oxide, zinc sulfide, silver, or mixtures thereof.

27. The light emitting diode of claim 23, wherein the first conductive layer comprises indium tin oxide, the second conductive layer comprises aluminum, further comprising a semiconductor polymer layer, wherein the semiconductor polymer layer comprises PEDOT/PSS, further comprising a first transport layer, wherein the first transport layer comprises N,N'-di(naphthalen-1-yl)-N,N'-bis(4-vinylphenyl)-4,4'-diamine, and further comprising a second transport layer, wherein the second transport layer comprises ZnMgO.

28. The light emitting diode of claim 23, wherein the first conductive layer comprises indium tin oxide, the second conductive layer comprises gold, further comprising a semiconductor polymer layer, wherein the semiconductor polymer layer comprises PEDOT/PSS, and further comprising a first transport layer, wherein the first transport layer comprises N,N'-di(naphthalen-1-yl)-N,N'-bis(4-vinylphenyl)-4,4'-diamine.

* * * * *